United States Patent
Williams

(10) Patent No.: US 8,749,222 B2
(45) Date of Patent: Jun. 10, 2014

(54) METHOD OF SENSING MAGNITUDE OF CURRENT THROUGH SEMICONDUCTOR POWER DEVICE

(75) Inventor: Richard K. Williams, Cupertino, CA (US)

(73) Assignee: Advanced Analogic Technologies, Inc., Santa Clara, CA (US)

( * ) Notice: Subject to any disclaimer, the term of this patent is extended or adjusted under 35 U.S.C. 154(b) by 13 days.

(21) Appl. No.: 13/113,791

(22) Filed: May 23, 2011

(65) Prior Publication Data

US 2011/0221421 A1    Sep. 15, 2011

Related U.S. Application Data

(62) Division of application No. 11/890,948, filed on Aug. 8, 2007, now Pat. No. 7,960,997.

(51) Int. Cl.
| | | |
|---|---|---|
| *G01R 19/00* | (2006.01) | |
| *G01R 31/02* | (2006.01) | |
| *G01R 31/26* | (2006.01) | |
| *G01R 1/20* | (2006.01) | |
| *H01L 23/495* | (2006.01) | |
| *H01L 23/00* | (2006.01) | |
| *H01L 29/10* | (2006.01) | |

(52) U.S. Cl.
CPC ............ *G01R 19/0092* (2013.01); *G01R 1/203* (2013.01); *H01L 23/49575* (2013.01); *H01L 24/03* (2013.01); *H01L 24/16* (2013.01); *H01L 24/25* (2013.01); *H01L 29/1087* (2013.01)
USPC .................................. 324/76.11; 324/762.09

(58) Field of Classification Search
None
See application file for complete search history.

(56) References Cited

U.S. PATENT DOCUMENTS

| | | | |
|---|---|---|---|
| 5,159,516 A | 10/1992 | Fujihira | 361/18 |
| 5,841,649 A | 11/1998 | Willett et al. | 363/98 |
| 5,999,041 A | 12/1999 | Nagata et al. | |
| 6,191,978 B1 | 2/2001 | Watanabe et al. | 365/185.21 |

(Continued)

FOREIGN PATENT DOCUMENTS

| | | |
|---|---|---|
| JP | 736211 | 7/1995 |
| JP | 7182074 | 7/1995 |

(Continued)

OTHER PUBLICATIONS

Extended European Search Report from corresponding European Application No. 08794842.8 dated Jan. 31, 2012.
International Search Report from corresponding PCT/US2008/009152 mailed Jan. 21, 2009.

* cited by examiner

*Primary Examiner* — Jermele M Hollington
(74) *Attorney, Agent, or Firm* — Lando & Anastasi, LLP

(57) ABSTRACT

A cascode current sensor includes a main MOSFET and a sense MOSFET. The drain terminal of the main MOSFET is connected to a power device whose current is to be monitored, and the source and gate terminals of the main MOSFET are connected to the source and gate terminals, respectively, of the sense MOSFET. The drain voltages of the main and sense MOSFETs are equalized, in one embodiment by using a variable current source and negative feedback. The gate width of the main MOSFET is typically larger than the gate width of the sense MOSFET. Using the size ratio of the gate widths, the current in the main MOSFET is measured by sensing the magnitude of the current in the sense MOSFET. Inserting the relatively large MOSFET in the power circuit minimizes power loss.

17 Claims, 56 Drawing Sheets

(56) References Cited

U.S. PATENT DOCUMENTS

| | | | |
|---|---|---|---|
| 6,275,399 B1 | 8/2001 | Miyazaki et al. | 363/98 |
| 6,559,684 B2 | 5/2003 | Goodfellow et al. | 327/53 |
| 7,183,555 B2 | 2/2007 | Jarron | 250/370.01 |
| 7,403,365 B2* | 7/2008 | Sase et al. | 361/93.1 |
| 7,612,418 B2* | 11/2009 | Shen et al. | 257/401 |
| 7,960,997 B2* | 6/2011 | Williams | 324/762.09 |
| 2007/0103005 A1* | 5/2007 | Nagasawa et al. | 307/125 |
| 2007/0278597 A1* | 12/2007 | Shen et al. | 257/392 |
| 2008/0068086 A1 | 3/2008 | Tsurumaki et al. | 330/277 |
| 2008/0231246 A1 | 9/2008 | Sugie et al. | |
| 2008/0290911 A1 | 11/2008 | Williams | 377/109 |
| 2009/0039869 A1* | 2/2009 | Williams | 324/123 R |
| 2009/0128106 A1 | 5/2009 | Takahashi et al. | 323/277 |

FOREIGN PATENT DOCUMENTS

| | | |
|---|---|---|
| JP | 2002-191171 | 7/2002 |
| JP | 2004-140423 A | 5/2004 |
| JP | 2004-268766 A | 9/2004 |
| JP | 36-44156 B2 | 4/2005 |
| JP | 2005249519 A | 9/2005 |
| JP | 37-07355 B2 | 10/2005 |
| JP | 2006-246675 | 9/2006 |
| JP | 40-34279 B2 | 1/2008 |
| JP | 40-43597 B2 | 2/2008 |
| JP | 42-86763 B2 | 7/2009 |
| JP | 45-42972 B2 | 9/2010 |

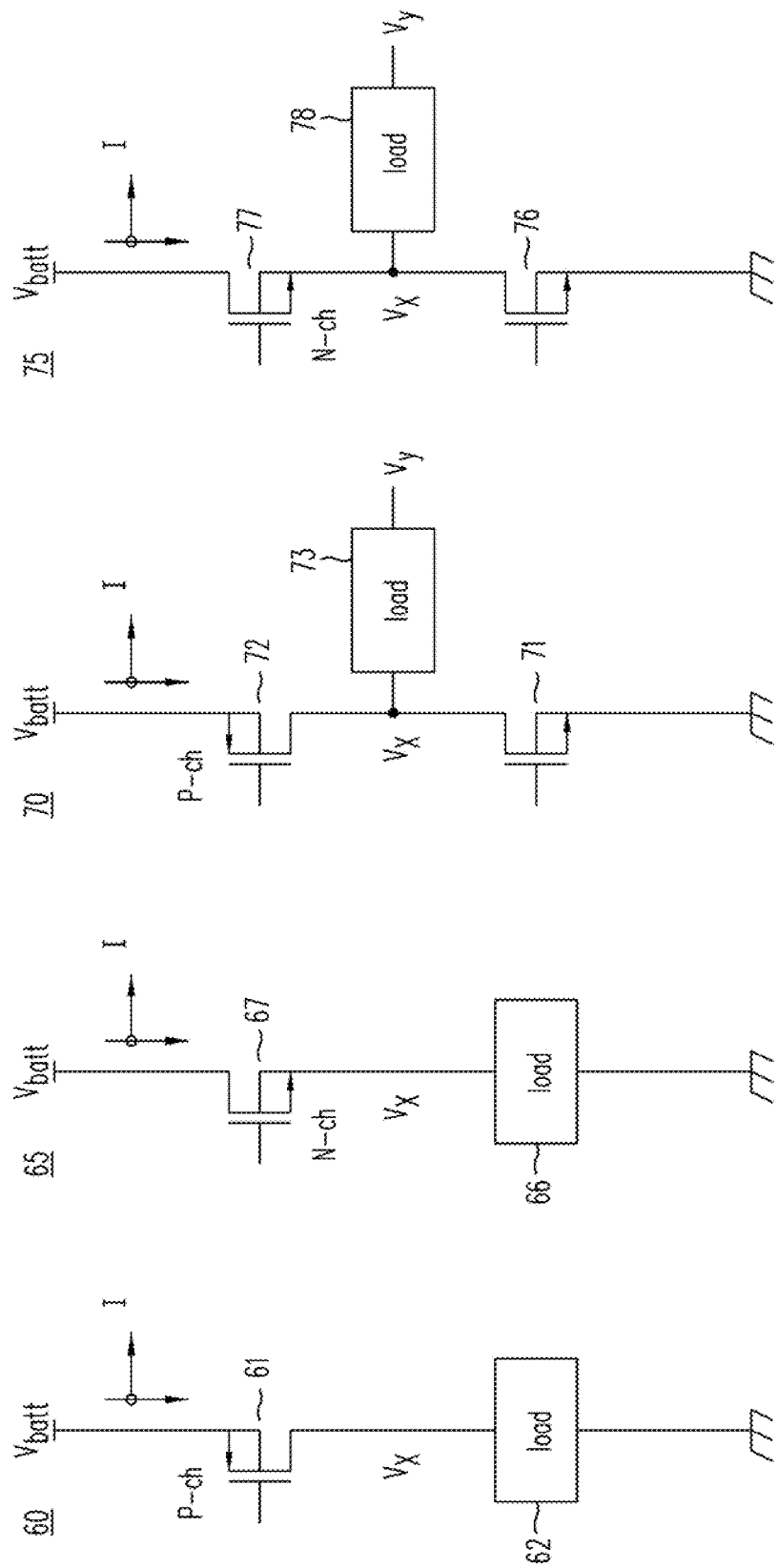

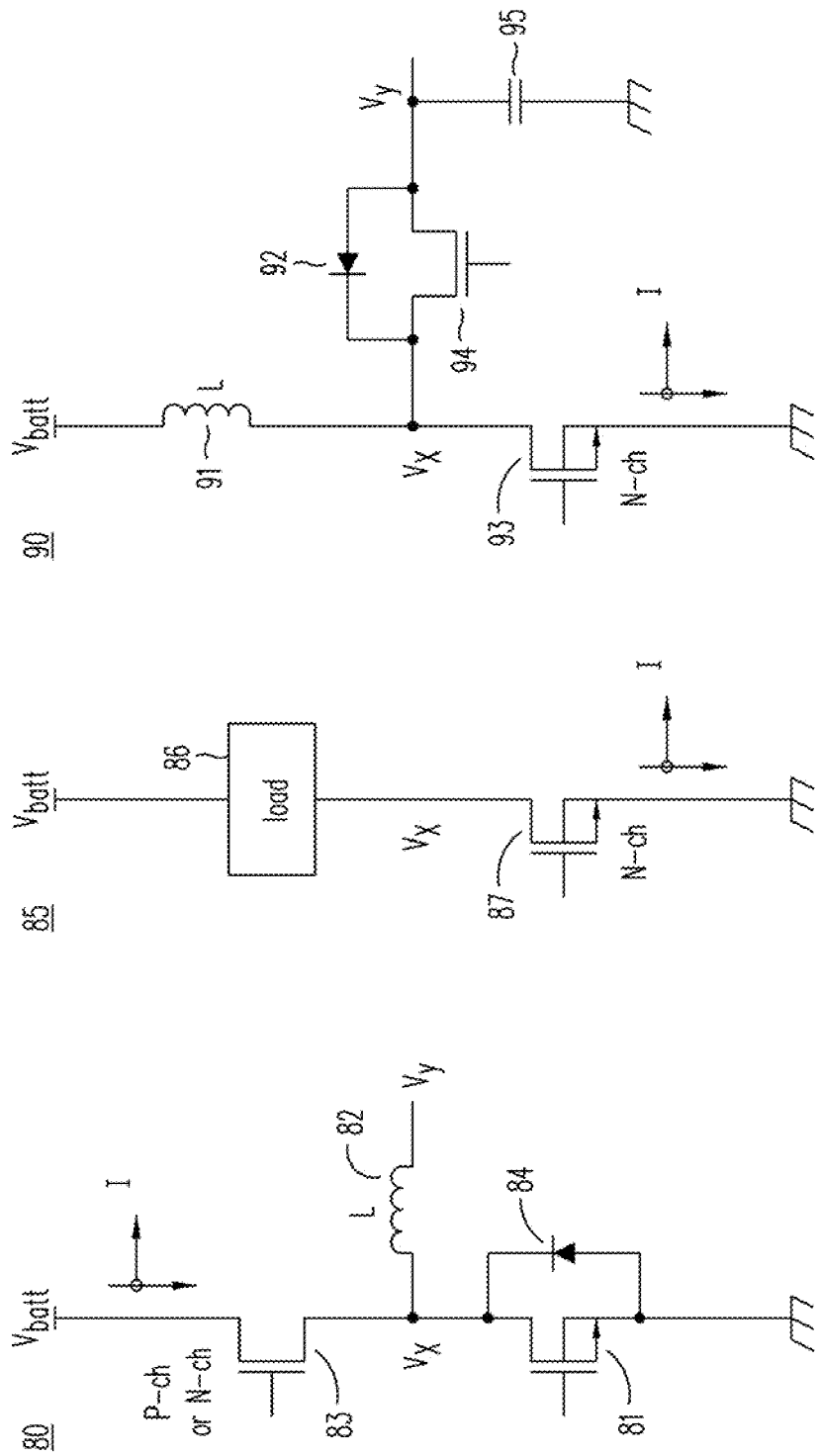

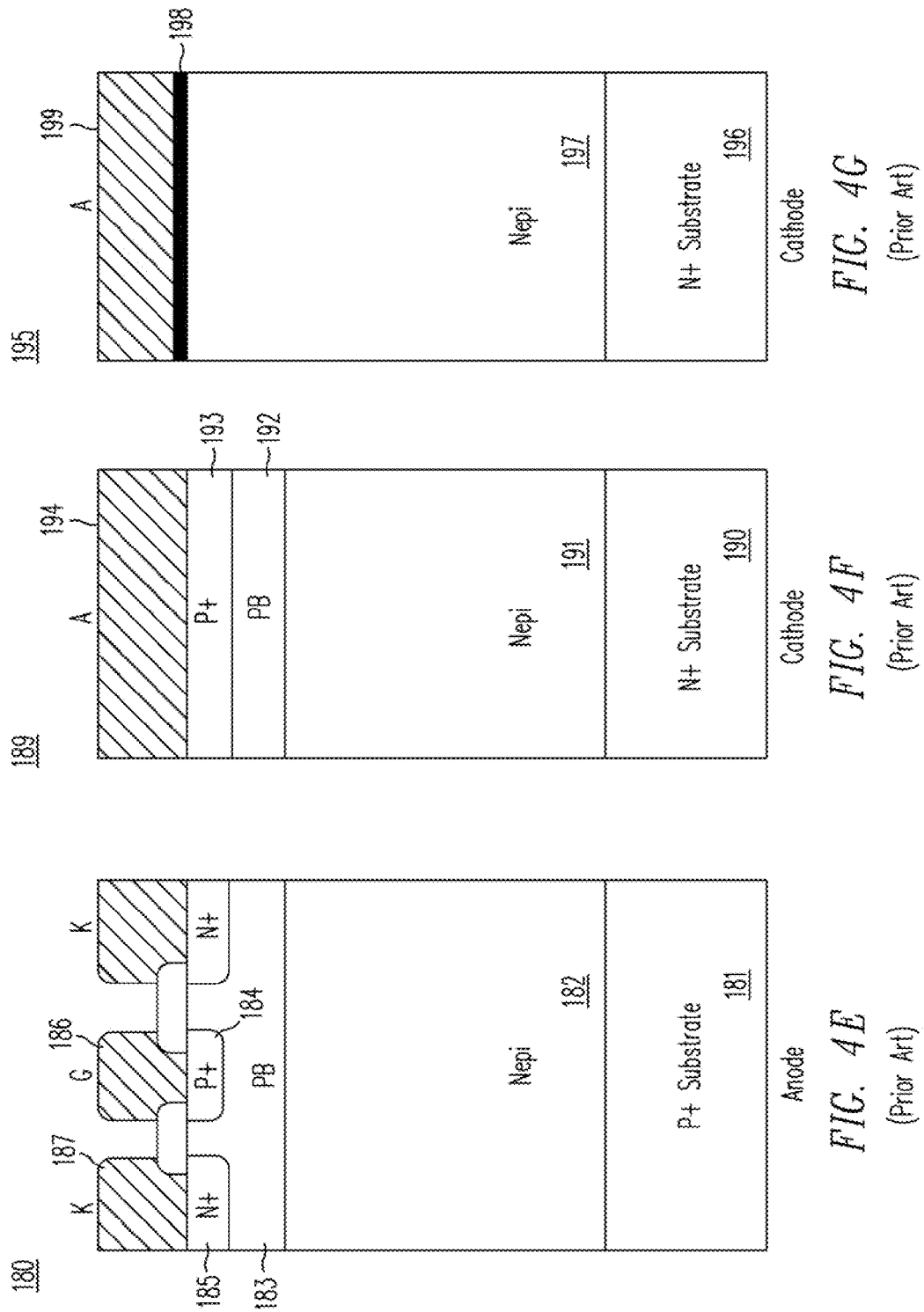

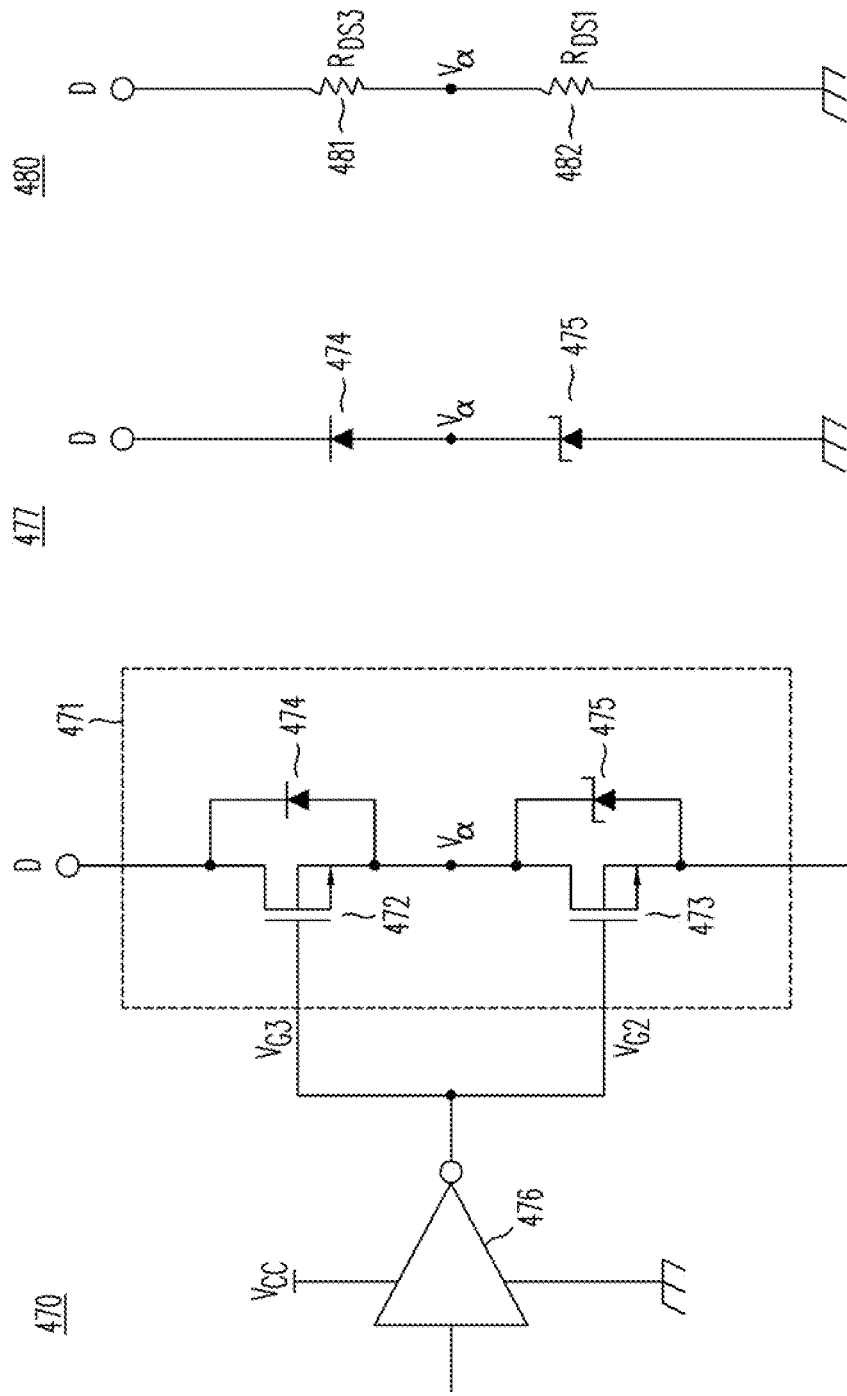

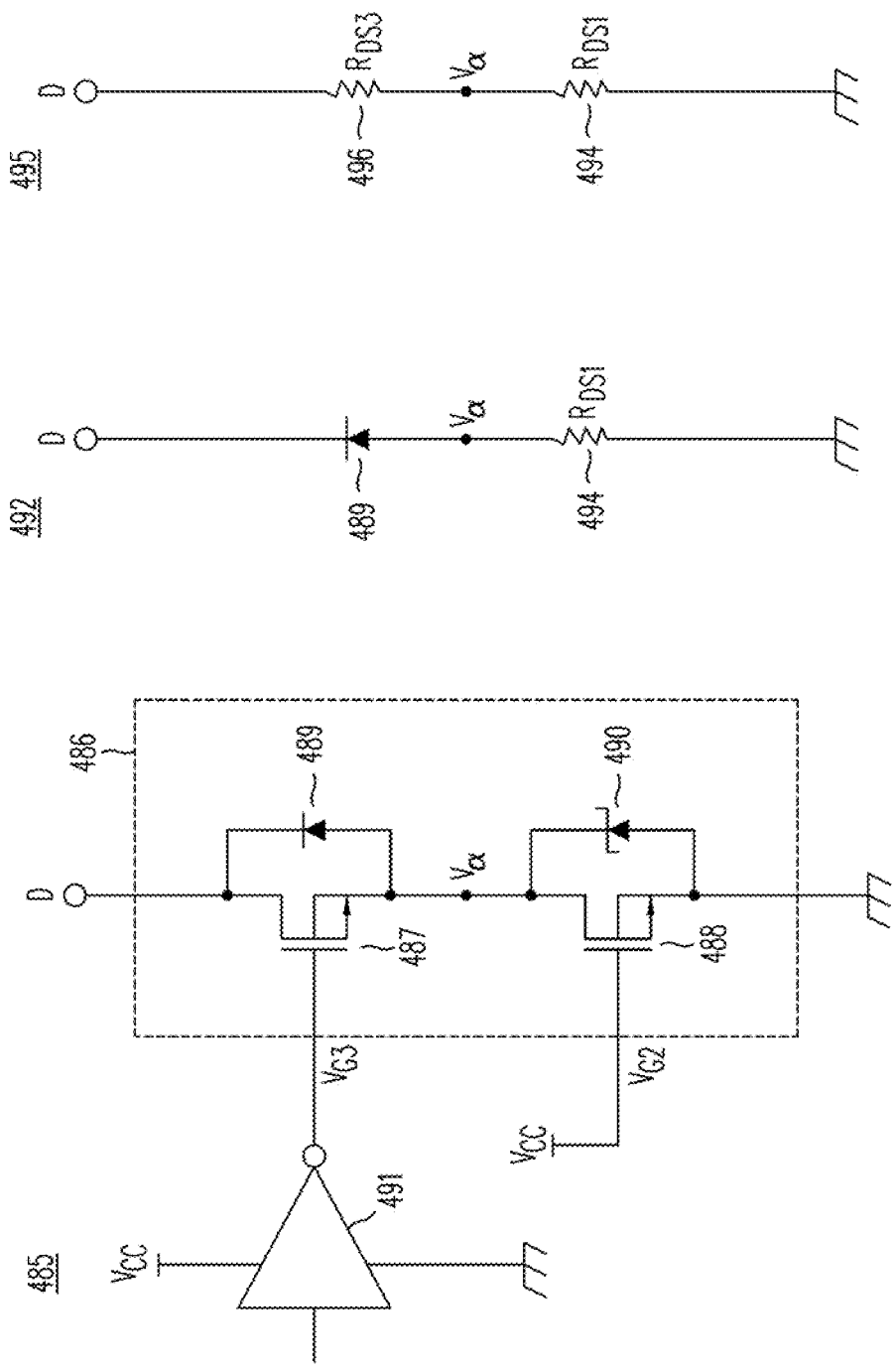

METHOD OF SENSING MAGNITUDE OF CURRENT THROUGH SEMICONDUCTOR POWER DEVICE

CROSS-REFERENCE TO RELATED APPLICATION

This application is a divisional of application Ser. No. 11/890,948, now U.S. Pat. No. 7,960,997, which is incorporated herein by reference in its entirety.

FIELD OF THE INVENTION

This patent relates to discrete power semiconductor devices and more specifically to methods to accurately sense the current in discrete semiconductor devices.

BACKGROUND OF THE INVENTION

Power semiconductor devices are used today in a wide range of electronic systems including power supplies, voltage regulators, DC/DC converters, motor drives, safety switches, battery disconnect switches, power-saving load switches, current limiters, port protection devices, audio amplifiers and more.

In many, if not most, power electronic applications, current sensing is important both for circuit operation and for safety and protection features. While the requirement for current sensing varies, for applications drawing more than 300 mA, the need for current sensing is common. The most common use for monitoring current is in an over-current shutdown or OCSD function. The purpose of OCSD is to shut off the circuit if large and potentially dangerous currents begin to flow.

A common condition leading to an over-current condition occurs when a load is shorted. For this reason, OCSD is often referred to as "short circuit" or "crowbar" protection. Various approaches exist for the location where the current is monitored, i.e. in the load, or in the transistors controlling the load. Oftentimes access to a location directly in the path of the load is not practical so that current monitoring is instead performed in an active device, transistor, or semiconductor component, and preferably in a device controlling the current flow into the circuit from its power input or source, e.g. a generator, battery, or regulated power supply.

Another approach to monitoring current is to facilitate current-limiting. In power devices such as power MOSFETs or IGBTs, where the drain current saturates, using feedback the device can be operated such that its drain current remains relatively constant regardless of its drain-to-source voltage. Since voltage is sustained while current is conducted, the current-limiter uses power according to the equation $P_{loss}=V_{DS} \cdot I_D$. In the event the product of $I_D$ and $V_{DS}$ becomes too large for a sustained time interval, the device will overheat and may be damaged. Current-limiting therefore is often coupled with over-temperature protection circuitry that shuts an overheating device off before irreparable damage occurs to the device or the system. Nonetheless, accurate current limiting demands accurate measurement of a device's current.

In other applications, current information is used in system control. For example, in current-mode switching power supplies, load current information is used to control the slope of a voltage ramp fed into the error amplifier, thereby affecting regulation quality, transient response time, and circuit stability. In slew-rate controlled load switches the current is ramped under closed-loop control to minimize noise and transient current spikes. Using current feedback, often in conjunction with voltage feedback, closed-loop control improves both system controllability and stability.

Conventional Current Sensing Techniques: Four techniques are commonly employed for current sensing. These prior art methods comprise Current sense resistors
$V_{DS}$ sensing
Magnetic current sensing
Integrated current mirrors These sensing techniques, their principles of operation, circuit implementation, and electrical characteristics are described herein.

The most general purpose current sensing technique employs a current sensing resistor. Shown in FIG. 1A, current sense circuit 1 includes a push-pull power output stage comprising a P-channel MOSFET 4 and an N-channel MOSFET 3 driving a load or inductor 9. A current sense resistor 2 of resistance $R_{sense}$ is inserted between the $V_{cc}$ power input and the source of P-channel MOSFET 4 to sense the current flowing into the circuit. An operational amplifier 5 boosts the signal, i.e. the voltage, measured across sense resistor 2. The voltage $V_o$ on the output of amplifier 5 is proportional to the current I in sense resistor 2, as given by the relation $$V_o = A_v(I \cdot R_{sense} + V_{offset}) \propto I$$

where $A_v$ is the closed loop voltage gain of amplifier 5 and $V_{offset}$ is any voltage offset present in the amplifier, either positive or negative in polarity. The resistive current sense circuit delivers the signal $V_o$ to control circuitry which may include analog circuitry such as PWM control, slew rate control, current limiting, etc.

The voltage $V_o$ may also be used to make no/no-go decisions like over current shutdown using a comparator 6 and a voltage reference 7. Whenever the current in MOSFET 4 exceeds some pre-specified value, the output of comparator 6 reacts and flips its state, signaling that an over-current condition has occurred. Comparator 6 often includes hysteresis to avoid chattering, i.e. unwanted oscillation, around the comparator's trip point.

Benefits of the sense resistor approach include its ability to measure both the current in a MOSFET and its parasitic source-to-drain diode, whenever it conducts. If a zero temperature coefficient resistor is used, the current measurement can be made accurately over a wide range of temperatures. It may be used in conjunction with any device either integrated or discrete with the caveat that parasitic inductance between the resistor and the semiconductor must be kept small by careful layout of the printed circuit board.

Unlike other current sensing techniques, the sense resistor method can measure current in any of the operating regions of a device, whether it is acting as a switch or as a current source. For example, a sense resistor can measure current in a MOSFET operating in its linear region, i.e. acting as a variable resistor. It can also measure current in a MOSFET operating in its saturated region of operation, i.e. acting as constant current source or current limiter. The method can even measure MOSFET current in the edge-of-saturation transition or so-called "knee" region between the linear and saturation regions. It can also measure current when the device is in avalanche breakdown.

Moreover, independent of the value of $V_{cc}$, no high voltage ever appears across sense resistor 2, so the input to amplifier 5 need not survive high voltages or use high voltage devices. Connected to the source of MOSFET 4, the maximum voltage possible across resistor 2 is limited in magnitude to an amount equal to $|V_{GS}-V_t|$, where as shown $V_{GS}$ is the gate voltage on P-channel MOSFET 4 with respect to its source and $V_t$ is threshold voltage of P-channel MOSFET 4. So, for example, if $V_{GS}=-5V$, then for a $-1V$ threshold voltage the maximum voltage across resistor 2 and on the input of amplifier 5 is limited to 4V even if $V_{cc}=24V$.

Another benefit of using a sense resistor is that if a discrete sense resistor is employed, the accuracy of the resistor can be specified to a tolerance of ±1% or ±0.5% as needed. The accuracy of the sense circuit is then limited by the offset voltage of amplifier 5, provided that the measured signal is large compared to the amplifier's input offset voltage. It is not always reasonable to assume that assumption is valid.

The problem with the sense resistor current sensing method is an intrinsic and unavoidable compromise between noise, i.e. signal-to-noise, and unwanted power loss. If the resistance $R_{sense}$ of sense resistor 2 is too small, the voltage measured across it will be extremely sensitive to noise and difficult to measure. Since the voltage is being measured in the device's main current path, transients, current spikes, and capacitive displacement currents appear instantly as a signal on the input of amplifier 5, causing a noisy and jittery output.

Conversely, if the value $R_{sense}$ is too large, excessive $I^2 \cdot R_{sense}$ power dissipation will occur in resistor 2, degrading efficiency and leading to unwanted die heating. For example, if the resistance of the sense resistor 2 is chosen to be 10% that of series connected MOSFET 4, then for a MOSFET with an on-resistance of 150 mΩ, the value of $R_{sense}$ must be 15 mΩ. At a 2A load current in steady state, MOSFET 4 will dissipate 0.6 W, and sense resistor 2 will dissipate 10% of that amount or another 60 mW. Ignoring any switching losses, together the resistor and MOSFET will dissipate 660 mW. The voltage $V_{sense}$ across resistor 2 is then given by $V_{sense}=I \cdot R_{sense}$ or 300 mV, a value easy to integrate, measure and use in active control circuitry.

If on the other hand power MOSFET 4 has a resistance of 20 mΩ to improve efficiency by reducing conduction losses, then a 10% current sense resistor has a value of only 2 mΩ and at 2 A exhibits only 4 mV drop, smaller than the offset voltage of smaller amplifiers. The accuracy of such a circuit will be very poor, since variations in the offset voltage of amplifier 5 can vary by several milli-volts from one wafer lot to another.

To minimize this sensitivity, a 5 mΩ resistor exhibits a more measurable 10 mV drop across resistor 2, but unfortunately represents a 50% increase in power dissipation beyond the MOSFET's losses, meaning the total loss increases from 80 mW without the sense resistor to 100 mW, an overall increase of 25%. Also, as the magnitude of the offset and the measured value approach one another, i.e. as $V_{sense} \rightarrow V_{offset}$, the current sense accuracy becomes very poor and can vary by 30% or more, even if a more expensive precision current sense resistor is used.

Another possible compromise is to increase the size of MOSFET 4 to lower its resistance to compensate for the extra resistance contributed by series sense resistor 2. This approach can help to some degree, but it is limited in switching circuits because any increase in the size of MOSFET 4 increases its capacitance and this causes a corresponding increase in switching losses. Such a tradeoff reduces conduction losses at the expense of increasing switching losses, particularly at higher switching frequencies.

An alternative to the current sensing resistor technique is $V_{DS}$ sensing. In $V_{DS}$ sensing, the voltage drop across the power MOSFET is used to calculate the current in the device. This measurement method is only valid when the MOSFET is operating in its linear region, i.e. behaving as an on-state switch with a semi-constant resistance. As shown in circuit 10 in FIG. 1B, the technique involves monitoring the voltage across a power MOSFET 12 with an operational amplifier 14 connected directly across the drain and source terminals of MOSFET 12. If MOSFET 12 is biased in its on state to be fully-enhanced, e.g. with $V_{GS}=-10V$, then with an on-resistance $R_{DS(on)}$ the voltage output $V_o$ of current sensing amplifier 14 is given by $$V_o=A_v(I \cdot R_{DS(on)}+V_{offset}) \propto I$$

where $A_v$ is the closed-loop voltage gain of amplifier 14 and $V_{offset}$ is any voltage offset present in the amplifier, either positive or negative in polarity. The resistive current sense circuit delivers the signal $V_o$ to control circuitry which may include analog circuitry such as PWM control, slew rate control, current limiting etc.

The voltage $V_o$ may also be used to make no/no-go decisions such as over-current shutdown using a comparator 16 and a voltage reference 15. As designed, whenever the current in MOSFET 12 exceeds some pre-specified value, the output of comparator 16 reacts and flips its state, signaling that an over-current condition has occurred. Comparator 16 often includes hysteresis to avoid chattering, i.e. unwanted oscillation, around the comparator's trip point.

The advantage of $V_{DS}$ sensing is the function is virtually free, since it relies on measuring the voltage across power MOSFET 12, which may be an integrated or discrete MOSFET.

As long as the device being monitored for current is a MOSFET, the $V_{DS}$ sensing technique is applicable. Aside from the amplifier required to measure the value of $V_{DS}$, there is no need for special bias circuitry or floating power supplies.

Unlike the current sensing resistor technique, since no additional devices are introduced in series with the high current path, $V_{DS}$ sensing can be considered a parallel monitoring technique. With no added series elements, there is no degradation in the power MOSFETs performance, and no increase in conduction losses or switching losses. The performance of the circuit is therefore identical to the performance of the device alone. Efficiency scales with voltage the same as in the device without current sensing.

One major problem with $V_{DS}$ sensing is it relies on the resistance of the power MOSFET to determine the current. Unfortunately, the resistance of a power MOSFET is sensitive to a myriad of electrical and process related parameters. In operation, dynamic and constant variations in $V_{GS}$, $V_{DS}$ and temperature conditions all affect a MOSFET's resistance and disturb the circuit's ability to accurately detect current. These environmental influences cannot be simply cancelled using predictive or algorithmic approaches since process parameters such as threshold voltage $V_t$, epitaxial thickness and doping, junction depths and concentrations, and even metal thickness and bond wire placement affect the linear region $I_D$-$V_{DS}$ characteristics of a power MOSFET.

For a specific device for example, electrical bias and thermal ambient conditions can easily result in a ±25% variation in current, especially if a high value of $V_{DS}$ pushes the device into quasi-saturation, i.e. in the knee region between the linear and saturated operating regions. Including batch-to-batch process variations, current sensing tolerance could be as bad as ±50%. A change in packaging, vendor, wafer fab, or heat sinking could cause the $V_{DS}$ sensing and over-current protection circuitry to fail altogether. In some instances, system designers have been known to intentionally change the size and on-resistance of a power MOSFET in an application not realizing they inadvertently disabled operation of the over-current protection.

Since $V_{DS}$ sensing relies on a device behaving as a semi-constant resistance, it cannot be used to detect current in IGBT's, thyristors, diodes or any device that includes minority carrier transport or conductivity modulation, since such devices do not manifest a linear voltage-current relationship. $V_{DS}$ sensing also cannot monitor diode current in a power MOSFET and does not detect avalanche current.

Another complication of using $V_{DS}$ sensing is that operational amplifier 14 is subjected to the same voltages, voltage transients and spikes as power MOSFET 12 and must be able to survive these voltages without damage. Even more complex, the operation of the $V_{DS}$ over-current detection circuitry must be disabled whenever MOSFET 12 is turned off or undergoing a switching transient, e.g. when the device is conducting current while $V_{DS}$ is momentarily large.

Since the output of over-current comparator 16 is valid only when MOSFET 12 is fully on and its resistive state, any controller using $V_{DS}$ sensing must "blank", i.e. ignore, the over-current detect flag during all other times. If a short circuit occurs while the $V_{DS}$ detect circuit is disabled, the circuit is unprotected from damaging and potentially dangerous over-current conditions. In order not to rely solely on $V_{DS}$ sensing, additional circuitry must be included to check for these various fault scenarios.

Magnetic current sensing, another current sensing technique, relies on time varying electric currents to induce a magnetic field and measures the magnetic field strength to calculate the current in accordance with Maxwell's equations. To accurately measure the field, the magnetic sensor must fully surround the conductor. Device dimensions in integrated circuits and most components are too small to generate substantial magnetic fields.

Detection sensitivity is equally problematic, since other causes may disturb the magnetic sensor and give false readings. Finally, most magnetic detection systems have a fairly low bandwidth and are incapable or reacting to the microsecond changes common in electrical systems and voltage regulators. Magnetic sensing is therefore not a viable option for current sensing in the majority of power electronic systems.

Split-Drain MOSFET with Integrated Current Sensing: The most common current-sensing technique in power integrated circuits is the split-drain current mirror 20, illustrated in FIG. 2A. A high-side current mirror 22 comprises two planar MOSFETs 23A and 23B, one large, one small, having common source and gate terminals. The smaller MOSFET 23B, with a gate width W, carries a current $I_2$ set by a dependent current source 24. The current $I_2$ is generally adjusted in response to feedback signal 27 regarding the voltage $V_{D1}$ on the drain of the main power MOSFET. The larger main power MOSFET 23A, with a gate width "n" times W, is connected to a load 21 and to a low-side MOSFET 25. MOSFETs 23A and 25 together form a complementary MOSFET push-pull output driving load 21, and as such have comparable current ratings, e.g. where current $I_1$ is two amperes or more.

The sense MOSFET 23B is ideally made as small as possible without sacrificing current sensing accuracy. The size ratio "n" commonly ranges over several orders-of-magnitude, from 10 to as high as a $10^6$ or more, depending on various design considerations. For power electronic applications, the current sensor MOSFET 23B is generally at least three to four orders of magnitude smaller than the main power MOSFET 23A. Accordingly, under comparable bias conditions, the respective currents in the two MOSFETs of mirror 22 will be in a ratio proportional to the scale factor "n", or $$I_2 = \frac{I_1}{n}$$

For example if n=5000, then ideally the size of the current $I_2$ flowing in MOSFET 23B should be 0.05% of the size of the current flowing in the main power MOSFET 23A. At this ratio, a one ampere load current will result in a 500 µA sense current $I_2$. If n=10,000, sense current $I_2$ is reduced to 10 µA. Currents below one microampere are more noise sensitive and ill advised.

The key aspect in implementing current mirror 22 is to design the sense MOSFET 23B in an identical construction to the main power MOSFET 23A and to co-fabricate the two devices in a common silicon dice. Monolithic co-fabrication minimizes the risk of batch-to-batch variations affecting matching, while mask design and device layout eliminate geometric related mismatch.

For example, FIG. 2B illustrates a current mirror pair of MOSFETs 30 comprising an active area 31 of width W containing a P+ source 34B and a P+ drain 35B, and further comprising an active area 32 of width n·W containing a P+ source 34A and a P+ drain 35A, where the source and drain implants are self aligned to a polysilicon gate 33 transecting active areas 31 and 32. The directional orientation of gate 33 is identical for both devices to improve matching and reduce any directional effects resulting from the fabrication process.

Source regions 34A and 34B are contacted with contacts 37A and 37B and share a common source metal interconnect 40B, which is connected to $V_{cc}$. P+ drain 35A is contacted with a contact 38A to a metal interconnect 40D, while P+ drain 35B is contacted with a contact 35B to a metal interconnect 40C. Gate 33 is connected through contact 39 and a metal interconnect 40A. While each of the devices is shown as a single stripe, the large device actually may comprise a number of parallel stripes of similar orientation to the smaller device.

In another example of a split-drain current mirror, a boost converter 41 in FIG. 2C includes an inductor 45, a rectifier 46, a capacitor 47 and an N-channel current mirror MOSFET pair 42 comprising a large MOSFET 43A with a load current $I_1$ and a smaller sense MOSFET 43B carrying a sense current $I_2$. Whenever $V_{G1}$ is set to turn on the current mirror MOSFETs 43A and 43B, a dependent current source 44 adjusts the sense current $I_2$ until the respective drain voltages of MOSFETs 43A and 43B are similar, i.e. $V_{DS2} \approx V_{DS1}$.

One common way to force the two drain voltages to the same value is to employ an operational amplifier 48 to control the level of current $I_2$ from current source 44. With one input tied to the drain voltage $V_{D1}$ of power MOSFET 43A, and the other input tied to the drain voltage $V_{D2}$ of current sensing MOSFET 43B, operational amplifier 48 will attempt to adjust the sense current $I_2$ dynamically to drive the two voltages to the same value. The importance of dependent current source 44 to achieve accurate current sensing by normalizing the drain voltages $V_{D2}$ and $V_{D1}$ of sense MOSFET 43B and main MOSFET 43A depends heavily on the transistors' regions of operation.

As shown in FIG. 2D, graph 50 illustrates the $I_D$-$V_{DS}$ current characteristics for the mirror MOSFETs 43A and 43B, with both MOSFETs biased at a fixed gate voltage $V_{GS1}$. The curve representing the higher current $I_1$ comprising regions 51A and 52A, represents the larger device, MOSFET 43A, having a gate width n·W. The curve representing the lower current $I_2$ comprising lines 51B and 52B illustrates the smaller device, MOSFET 43B, having a gate width W. At any given value of $V_{DS}$, the ratio of the currents $I_2/I_1$ is equal to n.

For example, in the saturated region of operation above $V_{DS3}$, the condition of saturation $V_{DS} > (V_{GS1} - V_t)$ is met by both curves 51A and 51B and drain current $I_D$ does not vary significantly with drain voltage. Specifically, at a drain voltage $V_{DS4}$, the currents $I_1(sat)$ and $I_2(sat)$ at points 54A and 54B maintain a ratio of "n", so that $I_2(sat)=n \cdot I_1(sat)$ If the drain voltage on MOSFET 43B (point 54B) were shifted to $V_{DS3}$, the current does not change substantially and the ratio "n" is still maintained despite a drain voltage mismatch. In other words, the importance of maintaining exactly the same drain voltage for current sensing in saturation is minimal. The role of dependent current source 44 is less important for drain voltages above $V_{DS3}$. As shown in FIG. 2E, current sensing in saturation exhibits inaccuracies of ±15% as shown by curve 58 in graph 55, with the mismatch mostly due to device-related phenomena such as short channel effects.

Behavior of the current mirror when MOSFETs 43A and 43B are in their linear regions of operation is considerably different. Below a voltage $V_{DS2}$, $(V_{GS1}-V_t) > V_{DS}$ and the devices are both in their linear regions with currents 52A and 52B. Specifically, the currents 53A and 53B at a voltage $V_{DS1}$ also exhibit a ratio of "n", so that $I_2(lin)=n \cdot I_1(lin)$. Any slight deviation in $V_{DS}$ on the current sense device, i.e. where $V_{D2} \neq V_{D1}$, results in a dramatic change in the current ratio and a significant error in measuring the current.

It follows that in the linear region accurate current measurement relies on dependent current source 44 maintaining the same drain voltage on both main MOSFET 43A and sense MOSFET 43B. Also shown by curve 56 in graph 55, in the linear region an accuracy of ±10% or better can be achieved, provided $V_{DS}$ is held constant for both devices. The slight improvement is because less process variables impact linear operation, and in particular linear region operation exhibits a lower sensitivity to threshold mismatch than operation in the saturation region.

In quasi-saturation, the region between the linear region and the saturation region, where $V_{DS}$ is between voltages $V_{DS2}$ and $V_{DS3}$, current mismatch is extremely sensitive to slight variations across a die in threshold, drain and source resistance, channel length modulation and stress induced piezoelectric effects. In quasi-saturation, the mismatch error (curve 57) increases, and can even be double the mismatch error observed in the linear region.

In conclusion, the split-drain MOSFET current mirror, comprising two conventional lateral MOSFETs of differing gate widths sharing a common gate and source connection can be used effectively as a current sensor in a low-voltage power device, either alone as a discrete current-sensing power MOSFET, or integrated into a power IC, e.g. into a low-voltage current limiter, battery charger, or PWM switching regulator IC.

Current sensing occurs in parallel to the main power device and does not require any series sense element inserted into the high current path that can degrade performance by increasing conduction or switching losses. As a mirror, many common-mode perturbations in its operation are cancelled out. The accuracy of the current mirror sensing technique and its related circuitry is therefore relatively immune to noise, changing load currents, supply voltage fluctuations, and to temperature variation. Implementation of a current-sensing power MOSFET using the split-drain current mirror technique involves minimal circuitry consuming low quiescent currents and does not require generating any floating supply voltages for circuit biasing.

The term "current mirror" is used throughout this disclosure in a broadly defined manner. According to a narrower definition, a MOSFET current mirror establishes its $V_{GS}$ gate bias using a threshold connected MOSFET where one device operates with a gate bias near its threshold voltage because it is hard-wired with its gate tied to its source, i.e. where $V_{GS}=V_{DS}$. A split-drain MOSFET pair is defined as a current mirror herein even though $V_{GS}$ is imposed on both devices from a gate buffer, not derived from the main device's drain current. A split-drain MOSFET pair behaves in a manner similar to a current mirror according to the narrower definition inasmuch as the current in one MOSFET is a scalar multiple of the current in the other MOSFET and common-mode noise that perturbs the drain current is cancelled out.

The split-drain current mirror offers superior current matching in its linear region of operation provided that the current-sense and main power MOSFETs are monolithically integrated using identical geometries and gate orientations, and in operation biased to the same $V_{DS}$ values. The split drain also offers moderately good current matching in saturation, i.e. as a current source, with the advantage that current matching accuracy in this region is relatively immune to $V_{DS}$ bias conditions, provided that the device is operated outside of its quasi-saturation "knee" region. In other words, when biased in saturation, the split-drain current mirror sense technique ignores variations in the drain voltage.

The split-drain current mirror power MOSFET can easily be fabricated as a low-voltage power device in a planar CMOS process by scaling the power MOSFET to very large gate widths, millions of microns in width, to reduce its on-state resistance. Fabrication in 0.5 micron, 0.35 micron and even 0.18 micron CMOS processes with thick multi-layer metallization yields devices with low specific on-resistance capable of blocking three to five volts in their off state. The devices utilize lateral current flow, parallel to a die's surface, under a planar gate located atop the silicon surface. Using such planar IC processes, five-volt MOSFETs with milliohm on-resistances have been demonstrated and commercialized. Being CMOS-compatible, the device can easily be integrated within monolithic PWM switching voltage regulators, smart switches and current limiter circuits, and integrated battery chargers.

Despite its numerous benefits, however, the split-drain current-mirror current sensing technique suffers from a number of significant deficiencies. One major disadvantage of this circuit is that the drain of the main power MOSFET, often the noisiest and highest voltage node in a system, must be monitored in order to control the current biasing the current sense MOSFET.

In FIG. 2C for example, operational amplifier 48, used to control current source 44, has its input connected to the $V_x$ node of a boost converter 41. If boost converter 41 is a high voltage circuit, operational amplifier 48 requires a high-voltage input rating in order to survive the entire range of voltages that occur at the $V_x$ node, including transients. Moreover, any voltage error in the operational amplifier due to input voltage offset is manifested as a current mismatch and an error in the circuit's ability to accurately measure current.

Another limitation of sensing current with a split-drain MOSFET current-mirror sensing technique is that it is unable to measure avalanche current or forward biased diode current. As a result, it cannot detect certain fault conditions that the sense resistor method of FIG. 1A can detect. The greatest limitation of the split drain MOSFET current sensor, however, is its technological specificity—it can only be fabricated in planar power devices, and planar MOSFETs suffer from many limitations.

Limitations of Planar Power MOSFETs: Planar power MOSFETs comprise large gate width MOSFETs with top-side source and drain connections and a metal-oxide-semi-conductor or "MOS" gate structure formed atop the silicon's planar surface. The devices may comprise N-channel or P-channel MOSFETs or the complementary combination thereof often referred to as CMOS. Despite their versatility, such devices suffer from numerous restrictions inherent in their construction. These limitations restrict the use of planar power MOSFETs in a variety of areas, including voltage scaling, reliability and circuit topology.

Voltage Scaling Limitations in Planar MOSFETs: Lateral MOSFETs produced using a planar CMOS fabrication process have a limited voltage scalability. In a lateral MOSFET, a lightly-doped-drain extension, also known as an extended drain or drift region, is used to increase the avalanche breakdown voltage. In a high-voltage LDD device, the breakdown voltage increases linearly with drift length $L_D$. The breakdown voltage BV increases about 10V to 12V for every micron of drift length, as measured by the critical electric field of avalanche $E_{crit}$. Due to surface effects, the strength of this critical field at the wafer's surface is only one half of what it is in the silicon bulk. For long drift lengths, the breakdown voltage $BV \approx E_{crit} \cdot L_D$, or $L_D \approx BV/(E_{crit})$, so that a 10 micron drift region breaks down at about 100V, at 20 micron drift region breaks down at about 200V and so on.

The transistor area efficiency, or packing density A/W, is significantly lower for lateral devices than vertical devices because the high-voltage drift region and both the drain and the source contacts are located on the die's surface. For a device having a striped surface geometry with a long drift, for example, a lateral high voltage MOSFET with a gate width W consumes an area of $W \cdot L_D$ so that for every micron of gate width the device's packing density $A/W \approx L_D$. Increasing the drift length also linearly increases the drift resistance as given by the relation $R_{DS}W \approx R_\square \cdot L_D$ where $R_\square$ is the sheet resistance of the implanted drift in ohms per square. Given that the specific on-resistance $R_{DS}A$ can be calculated by multiplying the transistor's resistivity $R_{DS}W$ times it's A/W packing density, the combining the two equations reveals for long drift devices $$R_{DS}A \approx R_{DS}W \cdot \frac{A}{W} = (R_S L_D) \cdot (L_D) \propto (L_D)^2$$

and since $L_D \approx BV/(E_{crit})$ then $$R_{DS}A \approx R_S(L_D)^2 = R_S\left(\frac{BV}{E_{crit}}\right)^2 \propto BV^2$$

Thus the specific on-resistance of a lateral device increases in proportion to the square of the breakdown voltage because increasing the drift length of the lightly doped drain extensions both increases resistance of the transistor for a given gate width and also decreases the amount of gate width than can be packed into a given area.

So while low-voltage lateral MOSFETs can be made with low on-resistance, high-voltage lateral MOSFETs have a limited power handling capability. Metal resistance and high voltage reliability considerations further degrade the capability of lateral MOSFETs. Accordingly, while a lateral MOSFET can easily monitor current using a split-drain current mirror method, it is not very useful as a main power MOSFET.

Lateral MOSFET Reliability Limitations: Implementing power MOSFETs as lateral devices in a planar process imposes certain limitations on device reliability. Specifically, planar devices exhibit their highest current densities and highest electric fields near the silicon surface when the device is in saturation, conducting current at large values of $V_{DS}$. The combination of high electric fields and high current conduction leads to impact ionization and the formation of carriers accelerated to high velocities by localized electric fields.

These so called "hot" carriers, if injected into the nearby gate oxide can damage the dielectric and degrade the performance of the MOSFET, shift its threshold voltage, increase its on-state resistance and lower its transconductance. In some cases, it can short the gate entirely and kill the device. Such hot carrier-induced damage and especially hot electron injection or HEI-induced damage is virtually unavoidable in lateral MOSFETs formed at the silicon surface.

The problem becomes even worse at high voltages, where the conductivity of lightly-doped drain extensions can become modulated by impact ionization and pre-avalanche conditions. Impact ionization can also cause unwanted substrate currents and activate parasitic bipolar transistor action in the MOSFET, leading to voltage snapback and device destruction. This snapback problem in a device conducting current is known as a limitation in its "safe-operating-area". Snapback in the off-state when the device is driven into avalanche is referred to as a limitation in the ruggedness of the device.

Regardless of whether the failure of the device is instantaneous in avalanche or in its safe-operating-area, or a gradual hot carrier-induced degradation, a lateral MOSFET's reliability and survivability can only be improved by limiting its current density, increasing its breakdown voltage, or limiting its maximum operating voltage. Unfortunately, running a device at a lower current density means the device must be oversized for its current rating, i.e. the device will be too big and too expensive a solution to be competitive in the marketplace. Increasing a lateral MOSFET's breakdown voltage adds series resistance to the device, again making the device too big and limiting it to non-power control circuit applications. And since many power applications operate at voltage above 5V, e.g. at 12V, 18V, 30V, 60V and even several hundred volts, limiting the device's maximum applied voltage is not an option.

Circuit Topology Limitations of Integrated MOSFETs: The power circuit topology describes the physical relationship between the power source, the electrical load, and the power devices used to control the flow of energy in the load. Specifically, the power circuit topology determines which circuits can be integrated and which circuits must utilize discrete power MOSFETs.

FIG. 3 illustrates several common power circuit topologies using power MOSFETs as the semiconductor control element in the circuit or system. The MOSFETs are often referred to as "switches", and the circuit topology as switch-load topology with the understanding that the definition of switch uses the broad IEEE definition as a device that "completes or breaks an electrical circuit", without limiting whether the switch behaves digitally, resistively, or controls the magnitude of the current.

The three broadest topologies involve the high-side switch or high-side transistor, the low-side switch or low-side transistor, and the push-pull or half-bridge structure. Using MOSFETs, these topologies can also be referred to as a high-side MOSFET, a low-side MOSFET and push-pull MOSFETs. Topologically, two push-pull bridges can be used to construct an H-bridge or full bridge, while three or more push-pull outputs can be used to make a three-phase bridge or multiphase bridge driver common for motor drive and high-power converters, regulators, and uninterrupted power supplies.

In a high-side switch or HSS topology as shown in FIGS. 3A and 3B, the electrical load 62 or 66 is connected to ground and the MOSFET is connected between the positive input $V_{batt}$ and the load. The load may comprise a resistive, capacitive, inductive, motor or transducer type device. Inductive loads include inductors or transformers comprising portions of switching power supplies or solenoids in electro-mechanical systems. Independent of the load type, no P-N diodes in the HSS topology become forward-biased, and they are therefore not represented schematically. If however, if load 62 is inductive, any interruption in its current will drive the voltage $V_x$ below ground, forcing MOSFET 61 or 67 into avalanche breakdown in a condition known as unclamped inductive switching.

Without indicating how it is implemented, a current-sensing circuit for detecting the current I is preferably positioned on the high-side of MOSFET 61 or 67, where power from the battery input $V_{batt}$ enters the circuit. Ideally, the current-sensing circuitry can detect the current in normal load operation as well as in shorted load and avalanche current conditions. MOSFETs 61 and 67 in circuits 60 and 65 are P-channel and N-channel devices, respectively, and as shown each MOSFET includes a source-body short. Integration of N-channel MOSFET 67 requires a special process to isolate its source-body short from ground.

In a push-pull or half-bridge topology, as shown in FIGS. 3C and 3D, one side of an electrical load 73 or 78 is connected to a midpoint $V_x$ between a Vcc-connected high-side MOSFET 72 or 77 and a ground-connected low-side MOSFET 71 or 76. The load 73 or 78 may comprise a resistive, capacitive, or transducer type device. Inductive loads, solenoids and motors are given special treatment as illustrated in FIG. 3E. The side not connected to voltage V, may be connected to ground, $V_{batt}$, or another power source either directly of through another MOSFET or MOSFETs. A current-sensing circuit for detecting the current I is preferably positioned on the high-side, of MOSFETs 72 of 77, where power from the battery input $V_{batt}$ enters the circuit. In other cases, it may be desirable to monitor the current in loads 73 and 78 directly.

The high-side MOSFET 72 or 77 in push-pull circuits 70 and 75 is a P-channel or N-channel device, respectively, and as shown includes a source-body short. Integration of high side N-channel MOSFET 77 requires a special process to isolate its source-body shorted connection from ground. Low-side N-channel MOSFETs 71 and 76 do not, however, require any special fabrication process.

The circuit of FIG. 5E illustrates a push-pull circuit where the load 82 is inductive—a topology common to synchronous Buck switching voltage regulators. This circuit is also useful for loads such as motors and solenoids. Like circuits 70 and 75, low-side MOSFET 81 is an N-channel MOSFET while high-side MOSFET 83 is either an N-channel or a P-channel MOSFET. A current-sensing circuit for detecting the current I is preferably performed on the high-side of MOSFET 83, where power from the battery input $V_{batt}$ enters the circuit. In other cases it may be desirable to monitor the current in inductive load 82 directly or in the load which it powers. Because the $V_x$ node drops below ground whenever current in high-side MOSFET 83 is interrupted, recirculation rectifier diode 84 connected in parallel with low-side MOSFET 84 is shown.

In a low-side switch or LSS topology, shown in FIG. 3F, the electrical load 86 is connected to the positive battery input $V_{batt}$ and an intermediate node Vx while MOSFET 87 is connected between the node $V_x$ and ground. Load 86 may comprise a resistive, capacitive, or transducer type device. Inductive loads including inductors, transformers, solenoids and motors are given special consideration in FIG. 3G. Independent of the load type, no P-N diodes in the LSS topology become forward-biased, and they are therefore not represented schematically.

A current-sensing circuit for detecting the current I is generally positioned on the low-side of N-channel MOSFET 87. MOSFET 87 controls the flow of power into circuit 85 and requires no special process to implement its grounded source-body short. While theoretically current sensing could be performed anywhere in the series path of load 86 and MOSFET 87, low-side circuitry is simpler to implement since it is ground-referenced and does not float with the potential $V_x$.

FIG. 3G illustrates a LSS topology when load 91 is inductive, e.g., an inductor, solenoid, motor, or transformer. As shown, the voltage $V_x$ is clamped by a clamping diode 92, a synchronous rectifier MOSFET 94, or both, which conduct whenever N-channel low-side MOSFET 93 interrupts the current flowing in inductive load 91 and the voltage $V_x$ exceeds the voltage $V_y$ across any capacitance 95. Topology 90 is common for boost and synchronous boost switching voltage regulators. Without clamping diode 92 or synchronous rectifier MOSFET 94, the voltage at $V_x$ will rise without limit until low-side MOSFET 93 goes into avalanche breakdown during unclamped inductive switching.

A current-sensing circuit for detecting current I in circuit 90 is generally positioned on the low-side of MOSFET 93 and can detect the current in normal load operation as well as shorted-load and avalanche breakdown conditions. N-channel MOSFET 93 requires no special process to implement its grounded source-body short. If floating synchronous rectifier MOSFET 94 is a P-channel device, no special fabrication steps are required to implement a source body-short in the devices. Conversely, if MOSFET 94 is an N-channel device, an integrated source-body short requires electrical isolation to separate it from a surrounding P-type substrate.

In conclusion, the location of monitoring current in a circuit may vary depending on the topology of the circuit, i.e., relative positions of the load, the MOSFETs, and the power sources. Sensing the current in low-side N-channel MOSFETs, high-side P-channel MOSFETs, or floating P-channel synchronous rectifier MOSFETs requires no special fabrication steps using a CMOS process. Conversely, sensing current in high-side N-channel MOSFETs or in floating synchronous rectifier N-channel MOSFETs with integrated source-body shorts requires a more complex fabrication process to form electrical isolation. Since, without isolation, only P-channel MOSFETs may be used on the high-side, the power level achievable by integrated devices is limited to lower voltages and lower currents.

Current Sensing in Vertical DMOS: One way to improving MOSFET reliability, performance and topological versatility is to employ vertical rather than lateral MOSFETs. In vertical MOSFETs, the current flows vertically from the top surface to the backside of the wafer, in a direction perpendicular to its surface. With vertical current flow MOSFETs, high current densities in high surface field regions are avoided.

The vertical MOSFETs 100 and 120, shown FIGS. 4A and 4B, are often referred to as DMOS devices, the "D" nomenclature referring to a double-diffused or dual-junction structure comprising a first body-to-drain junction contained within an epitaxial drain and a second source-to-body junction contained within a body region. In the N-channel vertical DMOS shown in FIGS. 4A and 4B, body regions 107 or 123, contacted by P+ implants 108 and 124, are diffused or implanted into a lightly-doped epitaxial layer 102 or 122 that is grown atop a heavily doped substrate 101 or 121. N+ source regions 109 and 125 are shorted to the body regions 107 or 123 by thick metal layers 110 and 128 and by optional barrier metal 110.

In the trenched DMOS device 100, a polysilicon gate 104 is embedded within a trench 105 etched into the silicon and lined with gate oxide 105; in the planar DMOS device 120, a polysilicon gate 127 is located above the surface of epitaxial layer 122 atop a gate oxide layer 126. The gate oxide layer 105 is protected from hot carrier injection by symmetrical body regions 107 on each side of trench 103 in trench MOSFET 100; the gate oxide layer 126 is protected from hot carrier injection by P-type body diffusions 123 that form a parasitic JFET structure beneath gate 127 and electrostatically shield gate oxide 126 in planar vertical MOSFET 120.

To achieve high-voltage operation in a vertical DMOS transistor, the thickness of the epitaxial layer must be increased and its doping concentration decreased, but the device's geometric cell density need be only moderately decreased. The on-resistance increase is therefore impacted only by the more resistive epitaxial layer. The specific on-resistance of the device is given by $$R_{DS}A=BV^n$$

where including the impact of both the doping and thickness of the epitaxial layer, above 200V n≈2.5. Below 100V, the critical electric field of avalanche is also a factor of doping so that n≈1.0 and as a result the device's on-resistance depends more linearly on its breakdown voltage. So while vertical DMOS transistors exhibit a stronger dependence of on-resistance on breakdown voltage, their higher cell density A/W gives them superior performance over lateral MOSFETs with increasing voltage, especially at voltages over 20V.

A third variant of a vertical DMOS device, the super-junction DMOS illustrated in FIG. 4C exhibits a lower voltage dependence "n" but needs a slightly thicker epitaxial layer making it more useful at higher voltages, e.g. above 400V.

Shown in cross section, the super-junction DMOS 140 comprises a surface structure similar to that of a planar DMOS with a polysilicon gate 148 and gate oxide 149 overlapping a planar DMOS channel formed within a P-type body 144 and an N+ source region 145, both of which are formed within one or more of N-type epitaxial layers 142A-142F grown atop an N+ substrate 141. What differentiates super-junction DMOS 140 from conventional vertical DMOS 120 is its epitaxial layer, which rather than being all N-type material contains photomask-defined vertical columns 143 of P-type material, referred to as vertical charge control regions. P-type charge control columns 143 form a grid like pattern, separating the lightly-doped N-type epitaxial layer into vertical columns 142 of N-type material, having a surface geometry of stripes, rectangles, squares, or other closed polygonal shapes.

By limiting the total charge, i.e. the concentration times the column width, of both the P-type columns 143 and the N-type columns 142 to some maximum amount, the tradeoff between breakdown and on-resistance can be improved for high-voltage DMOS, especially above 400V. Using a principle similar to previously described lateral lightly doped drain MOSFETs, the P- and N-columns exhibit two-sided depletion spreading under reverse bias, and completely deplete before they reach the critical avalanche field and breakdown. The concentration of the N-type columns 142 does not matter so long that they fully deplete before the device reaches avalanche breakdown. Once fully depleted, the only electric field of importance is the vertical field between the P+ contact regions 146 and the N+ substrate 141. Similar to a P-I-N junction the vertical field is relatively constant, so the voltage varies linearly with vertical position within the P- or N-type columns. Because N-type columns 142 are fully depleted when DMOS device 140 is in its off state, the doping concentration of N-type columns 142 can be quite high, thereby reducing the resistance of the thick epitaxial drain when DMOS device 140 is conducting. The net benefit is a reduction in on-resistance in high breakdown voltage devices, so that in the relationship $R_{DS}A=BV^n$, the exponent n is reduced below that of a conventional DMOS, i.e. below 2.

The advantage of vertical DMOS devices 100, 120 and 140 is that the they offer higher cell densities and greater ruggedness and reliability than lateral MOSFETs, especially since the gate oxide of a vertical DMOS is electrostatically shielded and not subject to hot carrier damage in saturation or in avalanche breakdown.

Current Sensing in Vertical DMOS: Unfortunately all vertical DMOS cells, whether planar, trench-gated or super-junction, share a common drain and substrate. Because of their common drain construction, the aforementioned split drain current sensing method 22 or 42 cannot be integrated into a vertical DMOS transistor.

For example, a vertical trench-gated DMOS 200 of FIG. 5A is split into two devices with sources S1 and S2 and a common drain, wherein DMOS source S1 comprises a metal layer 203A, an N+ source region 205A, a P-body region 206A and a trench gate 204A and wherein DMOS source S2 comprises a metal layer 203B, an N+ source region 205B, a P-body region 206B and a trench gate 204B, all sharing a common drain comprising an N epitaxial layer 202 and an N+ substrate 201. The equivalent circuit diagram 220 in FIG. 5B reveals that the two MOSFETs 221A and 221B are connected as a common drain pair where the cathodes of body diodes 222A and 222B are common and only the anodes are separate.

It is extremely difficult to separately detect current in the two devices in this configuration. As shown in the low-side switch application 250 of FIG. 5C, trying to use a common-drain N-channel DMOS 251B to monitor current in a low resistance DMOS 251A requires a sense resistor 253, monitored by an amplifier 254, to be inserted between the source of DMOS 251B and ground. No resistor can be inserted into the grounded source of low resistance DMOS 251A without degrading its performance and increasing conduction losses. As a result, source voltage $V_{S2}$ is no longer the same potential as grounded $V_{S1}$, and a measurement error results. Not only does this condition force the two transistors to exhibit different values of $V_{DS}$, but since they share a common gate bias $V_G$, they each are biased to a different value of $V_{GS}$ further degrading their current matching, i.e. $V_{GS1} \neq V_{GS2}$.

A similar scenario results in high-side monitoring circuit 270, shown in FIG. 5D, where a grounded sense resistor 273 in series with a sense DMOS 271B forces the voltage at $V_{S2}$ to be different from the source follower output $V_{S1}$ of power DMOS 271A. With differing gate-to-source and drain-to-source voltages, the mismatch in current can be severe. Attempts to force $V_{S1}$ and $V_{S2}$ to the same level are problematic, not only complicating the bias circuitry, but making the signal across sense resistor 273 too small for amplifier 274 to detect.

For the above reasons, the split-source vertical DMOS does not facilitate a useful current mirror. Sensitive to both $V_{GS}$ and $V_{DS}$ mismatches, the split source sense MOSFET is vastly inferior to and incompatible with the more normal split drain circuitry described previously. Unfortunately, the split drain device cannot be integrated into any vertical DMOS transistor, whether planar, trench or super-junction. These limitations, practically speaking, relegate all of today's vertical DMOS to the current sense resistor and $V_{DS}$ sensing methods for monitoring current. The problem is further exacerbated in high power devices.

Current Sensing in High Power Devices: Unfortunately, vertical devices capable of delivering higher power to a load, especially those in high-voltage applications, comprise device structures and use technology not amenable to the aforementioned integrated current mirror and $V_{DS}$ sense current monitoring methods.

Such high power devices, including thyristors, gate turn-off thyristors or GTO's, insulated-gate bipolar transistors or IGBT's, utilize some mix of minority carrier and majority carrier current flow, making it virtually impossible to integrate the current sensing within the high power device. Specifically, minority carrier conduction easily short-out or bypasses any integrated sensing method. Devices with minority carrier conduction also exhibit non-linear or exponential current-voltage relationships extremely sensitive to temperature, non-uniform conduction, and hot spots.

For example, insulated gate bipolar transistor or IGBT 170, shown in FIG. 4D, has a cross section similar to that of vertical planar DMOS 120, shown in FIG. 4B, but utilizes a P-type substrate 171 instead of an N-type substrate. Holes are injected into a thick epitaxial layer 173 and collected by a deep P+ region 174 resulting in conductivity modulation of the epitaxial layer 173, reducing the drain resistance of the DMOS comprising an N+ source region 176, a P-type body region 175 and an N drain 173.

Thyristor 180 in FIG. 4E includes an N+ cathode 185, a P-type base 183 with a P+ contact region 184, a thick N– type epitaxial layer 182, and a P+ substrate anode 181. By forward-biasing cathode 185 to base terminals 187 and 186, injected electrons forward-bias the P-N junction between N-epitaxial layer 182 and P+ substrate 181, and the entire device latches into an on condition during which time N-epitaxial layer 182 becomes flooded with minority carriers. The main current must be diverted, i.e. commutated, to turn off the device. One variant, the gate turn off thyristor, or GTO, diverts the base current to provide some degree of gate control to shut the device off.

Measuring current in the P-N and P-I-N rectifier diodes 189, shown in FIG. 4F is also problematic, since minority carrier conduction occurs throughout a thick epitaxial layer 191, resulting in non-linear, temperature-sensitive conduction characteristics. As shown, P+ anode contact 194 and P-body region 192 injects holes into N-epitaxial layer 191, which recombine to form electron current in N+ substrate 190.

While Schottky diode 195, shown in FIG. 4G, does not exhibit significant minority carrier conduction, the diode's forward-bias characteristics of Schottky diode depend heavily on the built-in barrier potential between metal layer 198 and N-type epitaxial layer 197. Dividing anode 199 into segments does not insure that an accurate current reading can be made on only a fraction of the current into cathode 196.

In all of the devices described above, only the resistor current-sensing method is applicable. But because the currents are high, the voltage drop across the resistor can cause increased power dissipation. Reducing the size of the resistor increases the sensitivity of the current-sensor to noise.

Summary of Current Sensing Techniques: Table 1 compares the four common current sensing methods available today, namely the sense resistor, $V_{DS}$ sensing, the split-drain current mirror and the split-source current mirror or "sense FET" technique. The factors considered are summarized into sense methods, applicability of the technique to various devices, the operating conditions which the current sensing method applies, and certain circuit considerations.

As shown, the series sense resistor is most versatile but increases power losses by inserting a series resistance in the high current path. The resistor's power loss can be reduced by lowering the resistor's value, but this adversely results in a smaller signal and greater noise sensitivity. This tradeoff is a fundamental limitation of the otherwise versatile sense resistor method. With the caveat that the sense resistor is not integrated into the device being monitored, the sense resistor can sense current in virtually any device including discrete or integrated MOSFETs with lateral, vertical, DMOS, or super-junction implementations. It can also measure current in diodes or in devices with minority carrier conduction such as IGBT's and thyristors. Integrating the sense resistor into the device being measured is ill advised, limiting its accuracy by subjecting it to heating, package stress, and electrical noise. Moreover, silicon wafer fabrication does not produce precision resistors with high absolute accuracy, low temperature coefficients, or high current capability.

Referring again to Table 1, $V_{DS}$ sensing is much less accurate than using a precision sense resistor because it is sensitive to temperature, bias conditions, and noise and it is only applicable to MOSFETs operating in their linear operating region. $V_{DS}$ sensing does not work for devices with diode conduction, in avalanche, employing minority carrier conduction, or otherwise exhibiting non-linear current-voltage characteristics. To be applied to high-voltage applications, the $V_{DS}$ sensing circuitry requires an operational amplifier with a high voltage input capability.

The split-drain current mirror is good for monitoring the current in integrated lateral devices, but such devices are useful only for low voltage operation, primarily below 20V. It cannot be integrated into vertical devices. It is also not useful in diodes or devices exhibiting diode conduction, devices with minority carrier conduction, or operating in avalanche. To be applied to high-voltage applications, the split-drain current mirror sensing circuitry requires an operational amplifier with a high-voltage input capability.

The split-source current mirror or sense FET suffers numerous disadvantages compared to the split-drain current mirror, and it requires complex biasing to minimize the influence of source voltage biasing from causing both $V_{DS}$ and $V_{GS}$ mismatch error in its current measurement. Aside from its severe bias sensitivity, it also is subject to temperature variation, and noise, and incompatible with devices operating in avalanche breakdown, with diode conduction, or exhibiting minority carrier conduction. Its only real advantage is that it can be integrated into vertical DMOS devices, and with the aforementioned limitations, its use is practically limited to vertical DMOS discrete transistors operating below 100V.

TABLE 1

| Consideration | Sense Resistor | $V_{DS}$ Sensing | Current Mirror | Sense FET |
|---|---|---|---|---|
| Sense Topology | series | parallel | Parallel | parallel |
| Method | measure resistor | measure $R_{DS(on)}$ | split drain mirror | split source mirror |
| Series Resistor | tradeoff vs. noise | none | None | none |
| Disc or IC Switch | either | either | IC only | VDMOS only |
| Tech Applicability | any | MOSFET only | lateral, IC only | VDMOS only |
| HV Efficiency | not V specific | not V specific | poor (BV <20 V) | limited (BV <100 V) |

TABLE 1-continued

| Consideration | Sense Resistor | $V_{DS}$ Sensing | Current Mirror | Sense FET |
|---|---|---|---|---|
| Linear or Sat Op | both | linear only | both | better in linear |
| Diode Oper | yes | no | no | no |
| Bipolar Cond Op | yes | no | no | no |
| Avalanche Oper | yes | no | no | no |
| Noise Sensitive | tradeoff vs. effncy | yes | minimal | yes |
| Bias Sensitive | no | extremely | minimal | yes |
| Temp Sensitive | minimal | extremely | minimal | somewhat |
| Integrate w PWM | poor quality | optional | optional | no |
| Sense Bias Crkt | none | off during sat | simple bias I required | complex, floating required |
| HV Op Amp | no | required | required | required |

In conclusion, as shown in Table 1, no current sensing method available today is able to accurately measure current for the full range of available discrete and integrated power devices. What is needed is a current sense technique applicable for both integrated and discrete devices with minimal power dissipation and reduced noise and temperature sensitivity that does not require a high voltage input sense amplifier or unusual fabrication technology to implement.

Ideally the sensing method should be able to measure any combination of MOSFET current, forward-biased diode current, or avalanche current and should be compatible with majority carrier devices like MOSFETs and vertical DMOS or devices including minority carrier conduction such as IGBT's or thyristors.

SUMMARY OF THE INVENTION

These requirements are achieved in a cascode current sensor according to this invention. The cascode current sensor contains a main MOSFET and a sense MOSFET. The main MOSFET is connected in the path of a current that is to be measured through a power device. A source terminal of the main MOSFET is coupled to a source terminal of the sense MOSFET. The respective gate terminals of the main and sense MOSFETs are connected together, and the voltage at the drain terminal of the controlled to be equal to the voltage at the drain terminal of the main MOSFET. Typically, the gate width of the main MOSFET is larger than the gate width of the sense MOSFET by a factor n, and consequently the current in the sense MOSFET is larger than the current in the main MOSFET by the factor n. Thus, the cascode current sensor of this invention does not introduce a significant power loss in the main power circuit yet allows the current to be accurately detected in the sense MOSFET.

In one embodiment, the drain terminals, respectively, of the main and sense MOSFETs are coupled to the input terminals of a negative feedback circuit, the negative feedback circuit comprising a voltage difference detector, the voltage difference detector being adapted to detect a difference between a first voltage at the second main terminal of the main MOSFET and a second voltage at the second main terminal of the sense MOSFET. The voltage difference detector is coupled so as to drive a current source, the current source being connected in a current path through the sense MOSFET. These components are arranged such that when a difference develops between the first and second voltages, responsive to the voltage difference the difference detector drives the current source to alter the current flowing through the sense MOSFET, altering the voltage drop across the sense MOSFET and thereby equalizing the first and second voltages. The difference detector may also drive a second current source so as to generate a sense current which is representative of the current through the main MOSFET.

In some embodiments the difference detector comprises an operational or differential amplifier or a digital comparator.

The main and sense MOSFETs may be either N-channel or P-channel devices, and the cascode current sensor may be used with a wide variety of power devices, including, for example, P-channel and N-channel MOSFETs, P-channel and N-channel insulated-gate bipolar transistors (IGBTs), an N-channel junction field-effect transistors (JFETs) or static inductor transistors (SITs), thyristors, bipolar transistors, P-I-N rectifiers and Schottky diodes, regardless of the specific manufacturing process used to fabricate the power device. Similarly, the cascode current sensor may be utilized in numerous types of circuits, including, for example, DC-DC converters of the Buck or boost variety and totem pole push-pull load drivers.

The invention also includes a method of sensor a current in a power device. The method includes connecting a drain terminal of a main MOSFET to the power device; connecting a source terminal of the main MOSFET to a source terminal of a sense MOSFET, a gate width of the main MOSFET being larger than a gate width of the sense MOSFET; connecting a gate terminal of the main MOSFET to a gate terminal of the sense MOSFET; causing a voltage at the drain terminal of the main MOSFET to be equal to a voltage at a drain terminal of the sense MOSFET; causing a current to flow through the power device and the main MOSFET; and measuring the magnitude of a current in the sense MOSFET.

BRIEF DESCRIPTION OF THE DRAWINGS

FIGS. 3A-3G are circuit diagrams illustrating various MOSFET switch-load topologies with current sensing, including P-channel high-side (FIG. 3A), N-channel follower high-side (FIG. 3B), complementary push-pull (FIG. 3C), N-channel totem-pole push-pull (FIG. 3D), synchronous Buck (FIG. 3E), low-side N-channel (FIG. 3F) and synchronous boost (FIG. 3G).

FIGS. 4A-4G are cross-sectional views of various known discrete vertical devices, including a trench-gated vertical DMOS (FIG. 4A), a planar DMOS (FIG. 4B), a super-junction vertical DMOS (FIG. 4C), a vertical IGBT (FIG. 4D), a vertical thyristor (FIG. 4E), a P-I-N diode (FIG. 4F) and a Schottky diode (FIG. 4G).

FIG. 9A is a circuit diagram of the high-current path in a dual gate drive cascode current mirror sensed N-channel power MOSFET FIG. 9B is an equivalent circuit of the off state of the dual gate drive circuit.

FIG. 9C is an equivalent circuit of the on-state of the dual gate-drive circuit.

FIG. 9D is a circuit diagram of the high-current path in a cascode current mirror sensed N-channel power MOSFET with an always-on sensor.

FIG. 9E is an equivalent circuit diagram of the off state of the always-on sensor circuit.

FIG. 9F is an equivalent circuit diagram of the on-state of always-on sensor circuit.

DESCRIPTION OF THE INVENTION

Figure 1B:
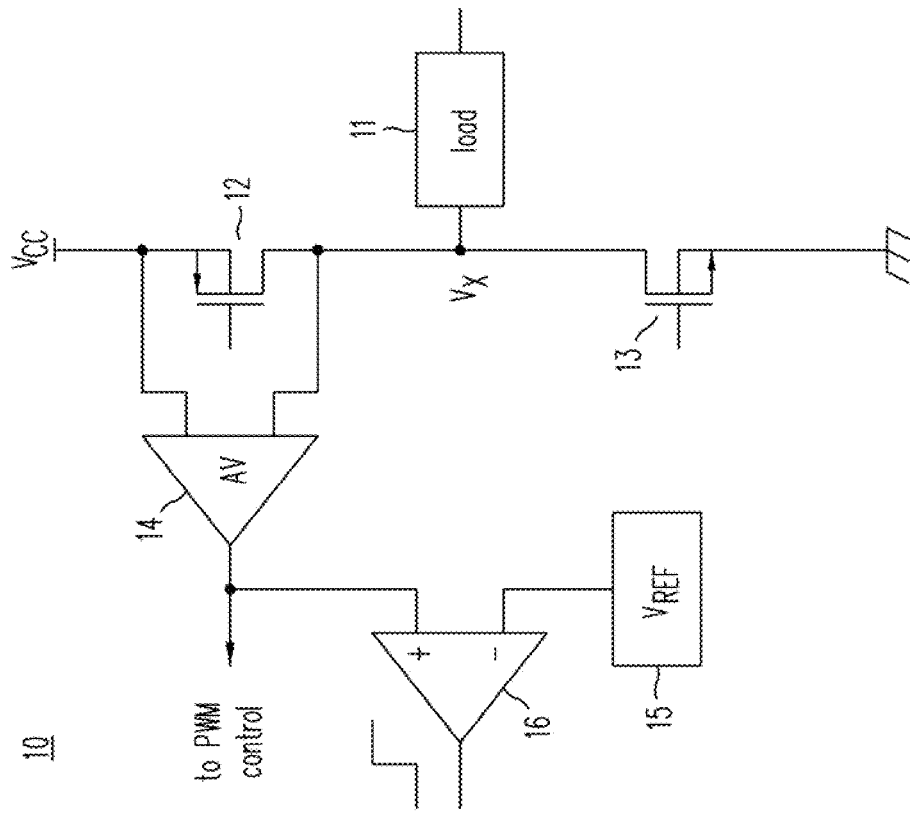
FIG. 1B is a circuit diagram of a prior art current sensing circuit that relies on $V_{DS}$ sensing.
Figure 1A:
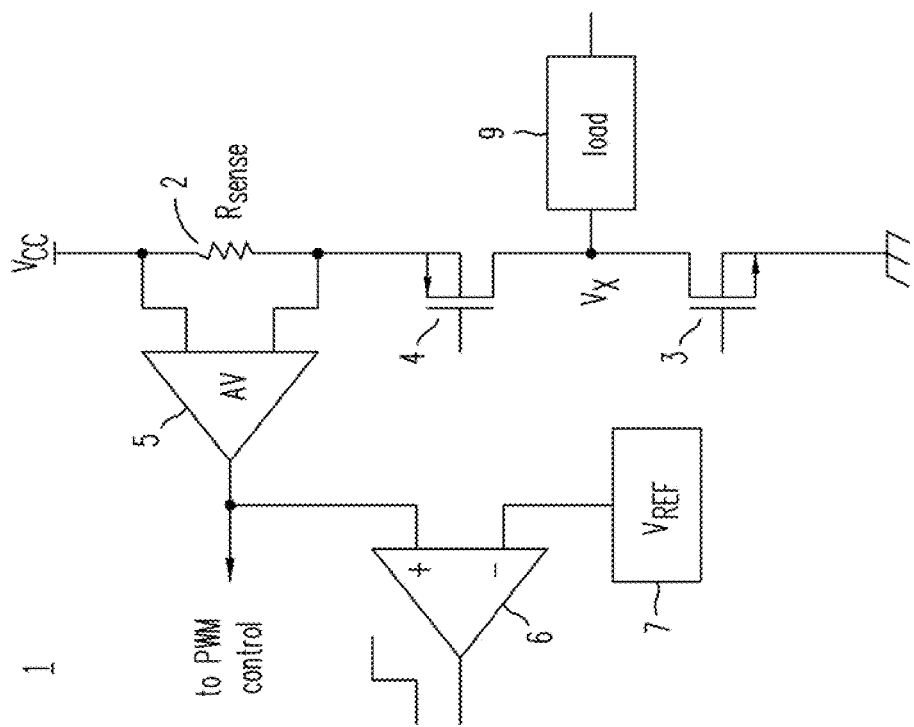
FIG. 1A is a circuit diagram of a prior art current sensing circuit that employs a sense resistor.

Described herein is a new method for current sensing, a cascode current sensor, or "$C^2S$." A $C^2S$ is capable of accurately monitoring the current in any device, component, or circuit without introducing any significant series resistance, voltage drop, or power loss in the high-current circuit path. Marrying the ability of a current sense resistor to measure current in any type of power device with the ability of a split-drain current mirror to measure current at small voltage drops, the cascode current sensor is, in its preferred embodiment, not operated as a device for switching or controlling power, but simply for monitoring current.

The $C^2S$ technique, like the technique using a sense resistor, does in fact introduce a loss in series with the main power device, but this element can accurately measure current with much less voltage drop than required by a current sense resistor. In fact, the power loss in a $C^2S$ series current monitoring element, i.e. the $C^2S$ insertion loss, can be designed to be significantly less than the requisite voltage drop needed by a sense resistor. Using the $C^2S$ method, the problematic compromise between noise and unwanted power loss can be avoided altogether.

As further described herein, a cascode current sensor may be implemented in two different polarities, N-channel (or $NC^2S$), and P-channel (or $PC^2S$). The benefit of either polarity varies depending on MOSFET-load topology, circuit complexity, die cost and die area, and power efficiency requirements. The unique C²S method may be employed to monitor the current in either P-channel or N-channel power MOSFETs, whether high or low-voltage, integrated or discrete, trench-gated, planar or super-junction.

The C²S sensing method may be applied to high-side, low-side, or floating power devices, including high-side source-follower configured power MOSFETs using floating or bootstrap gate drive circuitry. The method applies equally to IGBT's, JFETs, MESFETs, static inductor transistors or SITs, thyristors, bipolar transistors, and to P-I-N rectifiers and Schottky diodes, regardless of the specific manufacturing process used to fabricate the power device.

In high-voltage applications, the C²S method completely eliminates the need for measuring voltages on high-voltage nodes, i.e. no high-voltage operational amplifier or sense circuitry is needed, regardless of the operating voltage of the power device being monitored. In fact, the actual sensing device can be designed to experience no more than a fraction of a volt as its maximum voltage drop during conduction, and is not required to block any voltage in its off condition. In some cases the C²S monitor circuitry can remain on continuously with little or no power dissipation while the main device is in a light load, shutdown, or sleep mode.

Furthermore, the C²S method can be used to measure the current in any region of device operation, including linear, saturation, quasi-saturation, avalanche, etc. in either static, quasi-static, small signal or dynamic operation. The method can be used to monitor forward biased diode current and diode recovery, or as desired, it can be configured to measure active device operation without monitoring diode conduction. The method maintains its current sensing accuracy over a wide range of ambient conditions, temperatures, and load conditions.

The current sensing output of the cascode current sensor is a current that may be converted into a voltage as needed. The current sense information, if converted into a voltage proportional to the current in the main power device, need not be as small as the voltage developed across the current sensing element. The accuracy of the cascode current sensor can be actively trimmed during manufacturing using metal fuses or one-time programmable (OTP) memory, to reach any specified accuracy, e.g. $I_{OUT} \pm 1\%$ as an accuracy tolerance range significantly better than the $\pm 30\%$ range offered by the $V_{DS}$ sensing or the split-source "sense FET" method, described above.

The output signal of the C²S is linearly proportional to the current in the main power device. The C²S output signal may be used as an analog value to implement current limiting or current-mode control in DC/DC switching regulators, or it may be compared to some reference signal by a comparator to facilitate over-current shutdown, fault detection, and other system protection features.

Figure 6A:
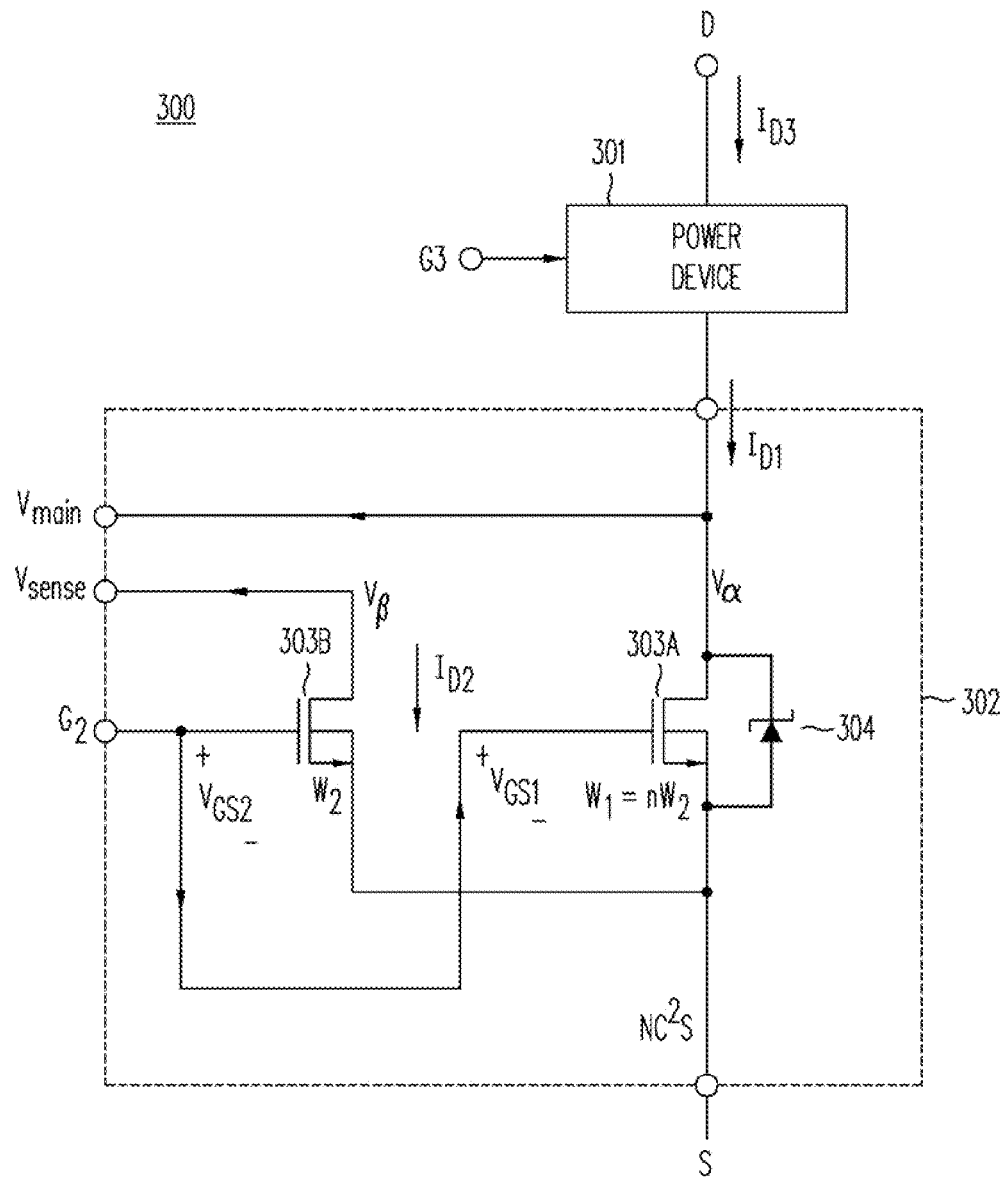
FIG. 6A is a circuit diagram of a low-side cascode current mirror current sensor in accordance with the invention, including a power device and a current sensor.

The N-channel Cascode Current Sensor; FIG. 6A illustrates an N-channel cascode current sensor (NC²S) 302 for monitoring a high current $I_{D3}$ in a generic power device 301. A gate connection G3 of power device 301 is shown to illustrate that the gate signal for device 301 is not related to the operation of current sensor 302. The main relationship between power device 301 and current sensor 302 is that they share a single high current path, i.e. $I_{D3}=I_{D1}$. In this embodiment, current sensor 302 comprises a low-voltage split-drain current mirror comprising a main MOSFET 303A and a sense MOSFET 303B, neither of which is monolithically integrated into power device 301.

As indicated, the gate width $W_1$ of main MOSFET 303A is "n" times bigger than the gate width $W_2$ of sense MOSFET 302B, so that $W_1 = n \cdot W_2$ and under similar bias conditions, the current in sense MOSFET 303B should be smaller than the current $I_{D1}$ in main MOSFET 303A by a factor of n, i.e., $I_{D2} \approx (I_{D1})/n$. To insure operation at similar gate-to-source bias conditions, MOSFETs 303A and 303B share a common gate connection G2 and a common source connection S so that $V_{GS2}=V_{GS1}$. To achieve similar drain-to-source bias conditions, the drain voltage $V_\alpha$ of main MOSFET 303A and the drain voltage $V_\beta$ of sense MOSFET 303B are adjusted to be the same voltage. In current sensor 302, these voltages are made available via separate external terminals $V_{main}$ and $V_{sense}$ that are operated by external bias circuitry. A diode 304 comprises the intrinsic P-N junction of main MOSFET 303A or it represents an additional Zener diode for voltage clamping and protection. The maximum voltage across normally reverse-biased diode 304 is $V_\alpha$, the voltage across the drain and source terminals of main MOSFET 303A.

Figure 6B:
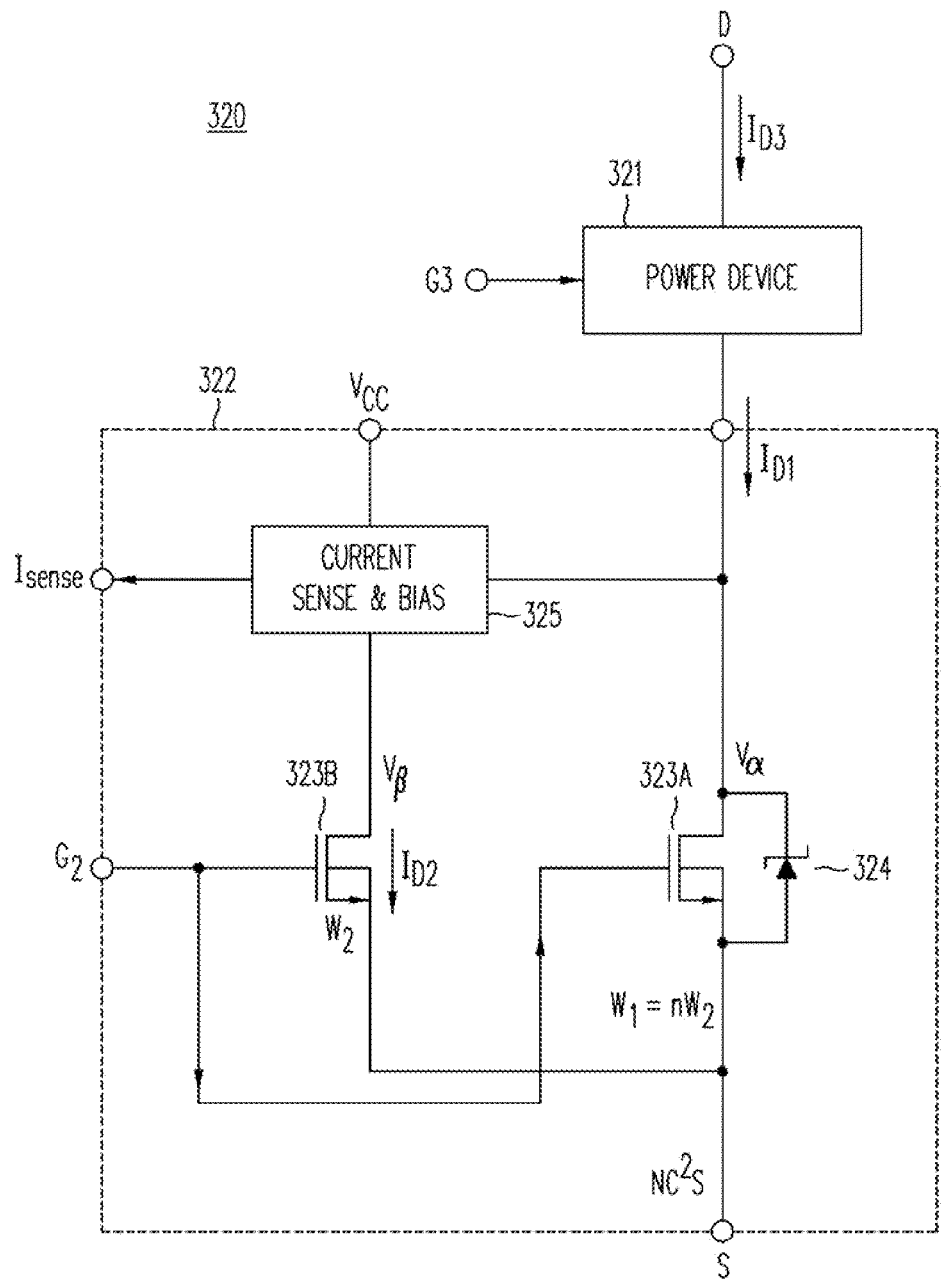
FIG. 6B is a circuit diagram of a low-side cascode current mirror current sensor in accordance with the invention, including a sensor with an integral current sense bias.

In FIG. 6B, an N-channel cascode current sensor 322 measures the current in a gated power device 321 using a main MOSFET 323A and a sense MOSFET 323B in conjunction with a current sense and bias circuit 325, the function of which is to generate a current $I_{D2}$ such that sense voltage $V_\beta$ is the same as $V_\alpha$. While any number of circuits may be implemented to perform the bias function, in one embodiment, current sense and bias circuit 325 measures the voltage $V_\alpha$ at the drain of main MOSFET 323A and then by analog feedback or algorithmically adjusts the drain current $I_{D2}$ in MOSFET 323B until its drain voltage $V_\beta$ matches the drain voltage $V_\alpha$ of MOSFET 323A. Current sensor 322 also outputs a current $I_{sense}$ identical to or proportional to the magnitude of drain current $I_{D2}$. While current sense and bias circuit 325 can derive its power from its connection to node $V_\alpha$, alternatively it may be powered from a separate battery or supply input $V_{cc}$ referenced to the potential at the source terminals of MOSFETs 323A and 323B.

A diode 324 comprises the intrinsic P-N junction of main MOSFET 323A or it represents an additional Zener diode for voltage clamping and protection. The maximum voltage across the normally reverse-biased diode 324 is the voltage $V_\alpha$ across the drain and source terminals of power MOSFET 323A.

For small values of $V_\alpha$ and $V_\beta$, MOSFETs 323A and 323B both operate in their linear region, regardless of the operation of power device 321. The currents through MOSFETs 323A and 323B in their linear region are approximated by the equations $$I_{D1} \approx \frac{W_1}{L_1} \mu \cdot C_{ox} \cdot (V_{GS} - V_{t1}) \cdot (V_\alpha)$$

and $$I_{D2} \approx \frac{W_2}{L_2 \pm \Delta L} \mu \cdot C_{ox} \cdot (V_{GS} - V_{t2}) \cdot (V_\beta \pm V_{offset})$$

where μ is electron mobility in the channel of the MOSFET, $C_{ox}$ is its gate capacitance, $V_{t1}$ and $V_{t2}$ are the threshold voltages of MOSFETs 323A and 323B, respectively, and $L_1$ and $L_2$ the channel lengths of MOSFETs 323A and 323B, respectively. The term $\Delta L$ represents a slight difference in the channel lengths $L_1$ and $L_2$ of MOSFETs 323A and 323B, giving rise to current mismatch between the devices. This difference primarily results from special non-uniformities in the photolithographic process used to fabricate MOSFETs 323A and 323B. $V_{offset}$ represents a difference in the source voltages $V_\alpha$ and $V_\beta$ imposed on MOSFETs 323A and 323B, respectively.

Since $W_1 = n \cdot W_2$, the ratio of currents $I_{D2}$ and $I_{D1}$ can be expressed as follows:

$$\frac{I_{D2}}{I_{D1}} \approx \frac{W_2}{(n \cdot W_2)} \cdot \frac{L_1}{L_2 \pm \Delta L} \cdot \frac{(V_{GS} - V_{t2})}{(V_{GS} - V_{t1})} \cdot \frac{(V_\beta \pm V_{offset})}{(V_\alpha)}$$

Assuming that the channel lengths match, i.e., $\Delta L=0$, then $L_1=L_2$. Furthermore, assuming that the threshold voltages of MOSFETs 323A and 323B match, then $V_{t1}=V_{t2}$. Likewise, assuming any mismatch in the drain voltages $V_\alpha$ and $V_\beta$ is included in the term $V_{offset}$, the ratio of currents $I_2$ and $I_2$ simplifies to:

$$\frac{I_{D2}}{I_{D1}} \approx \frac{1}{n} \cdot \frac{(V_\alpha \pm V_{offset})}{(V_\alpha)} = \frac{1}{n}\left(1 \pm \frac{V_{offset}}{V_\alpha}\right)$$

Mathematically, the offset term $V_{offset}$ can actually be used to "model," or account for, all origins in any mismatch between main MOSFET 323A and sense MOSFET 323B. Numerically, if the magnitude of $V_{offset}$ is small compared to the magnitude of the drain voltage $V_\alpha$ on main MOSFET 323A, then the entire equation simplifies to the relation $$\frac{I_{D2}}{I_{D1}} \approx \frac{1}{n}$$

If the magnitude of $V_{offset}$ is not negligible and a current mismatch results, the offset may be eliminated using active trimming as detailed subsequently and disclosed herein as a related embodiment of this invention.

Figures 2A, 2B:
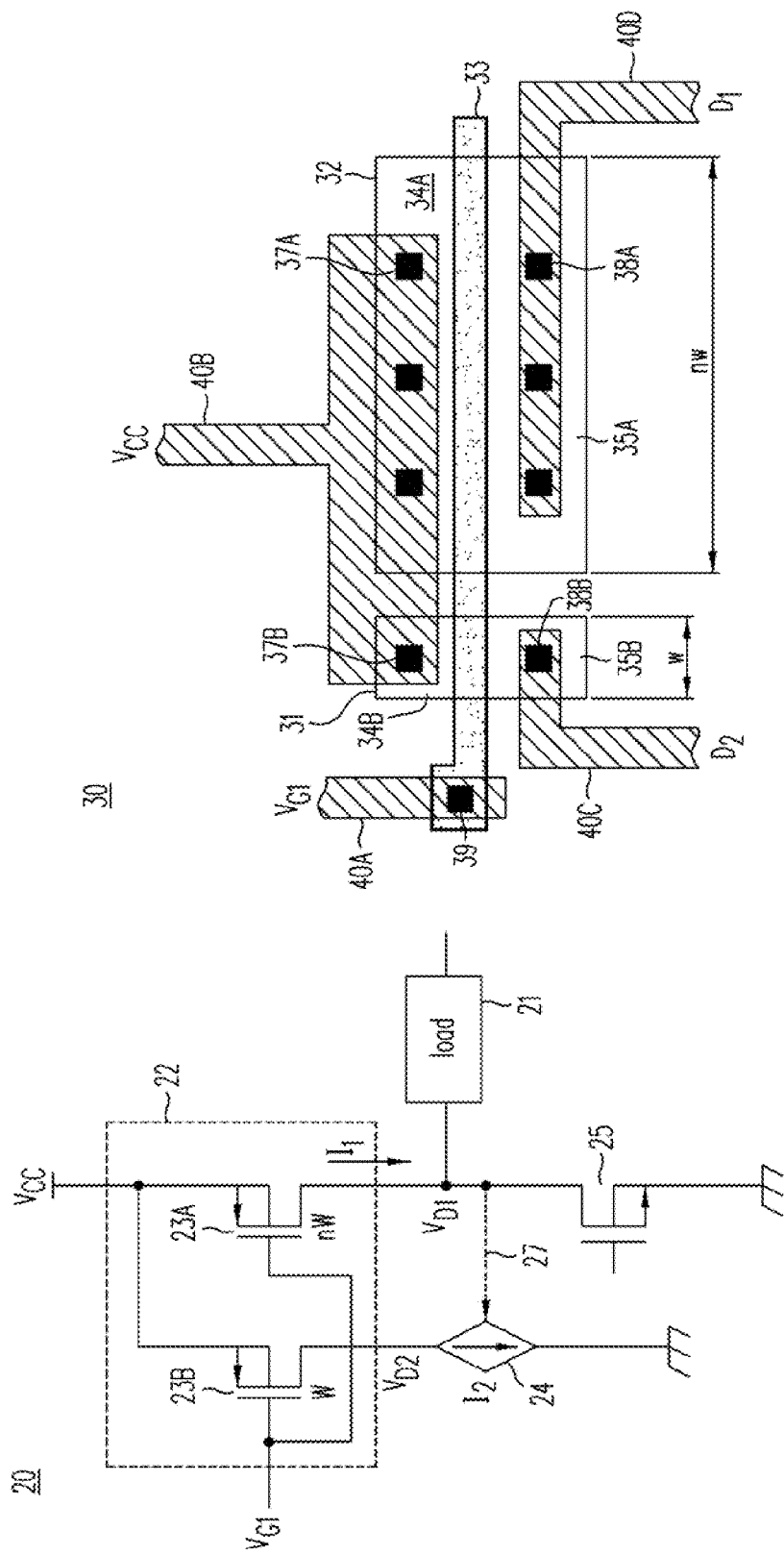
FIG. 2A is a circuit diagram of a prior art high-side split drain current mirror sensing circuit.
FIG. 2B is a plan view of the circuit shown in FIG. 2A.
Figure 2C:
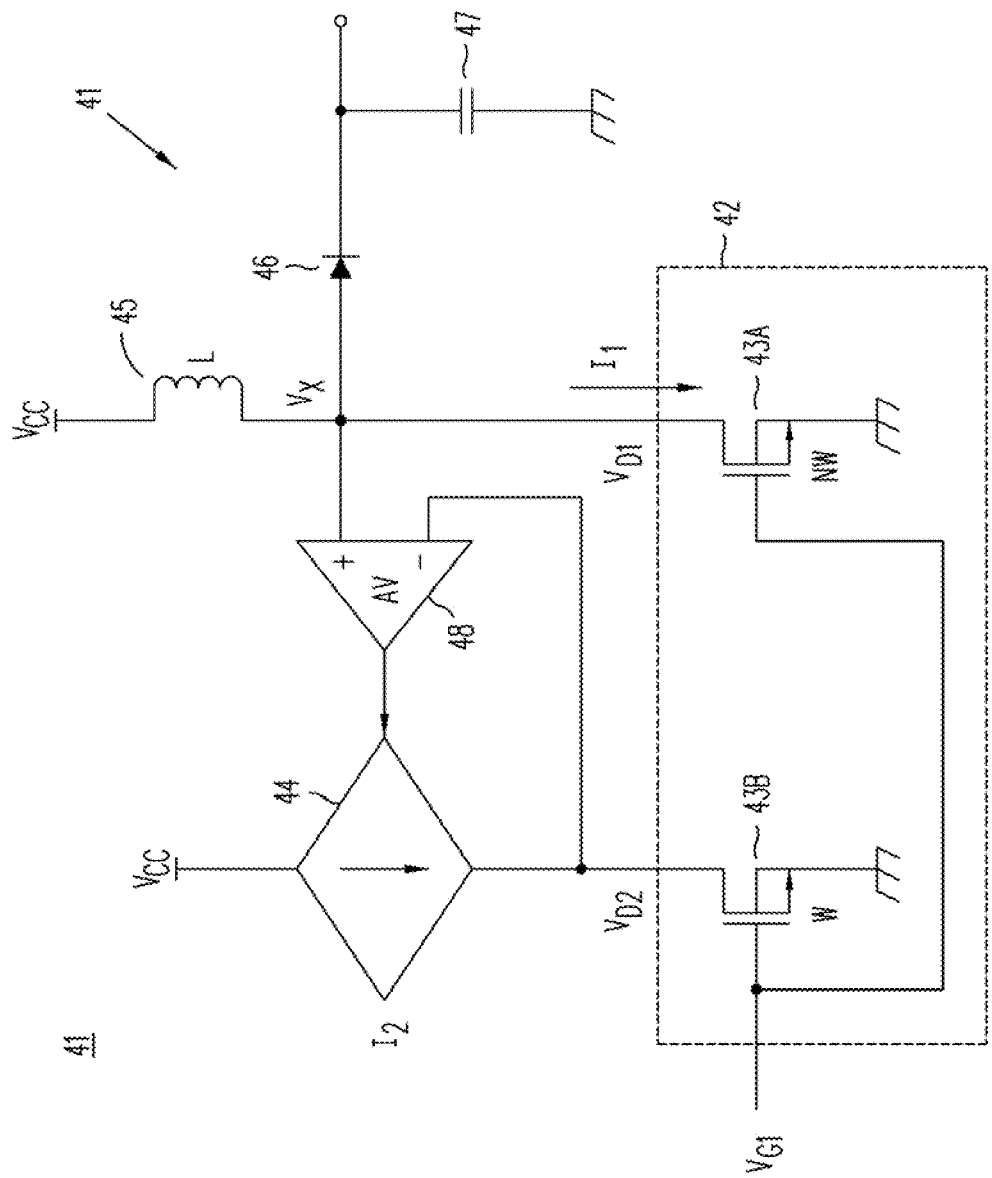
FIG. 2C is a circuit diagram of a prior art low-side split drain current sensing circuit.
Figure 2D:
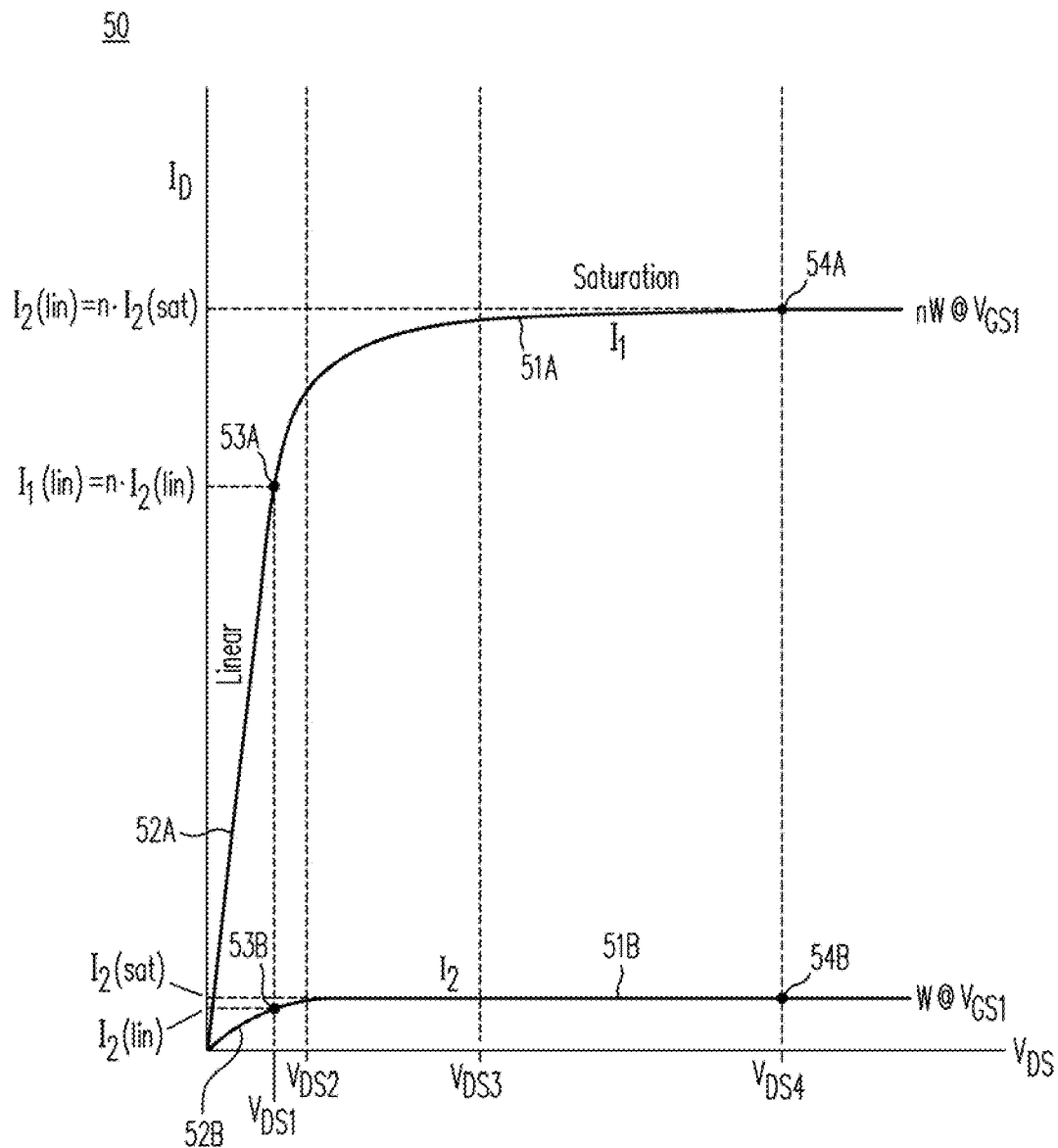
FIG. 2D is a graph showing the I-V characteristics for main and sense MOSFETs.
Figure 2E:
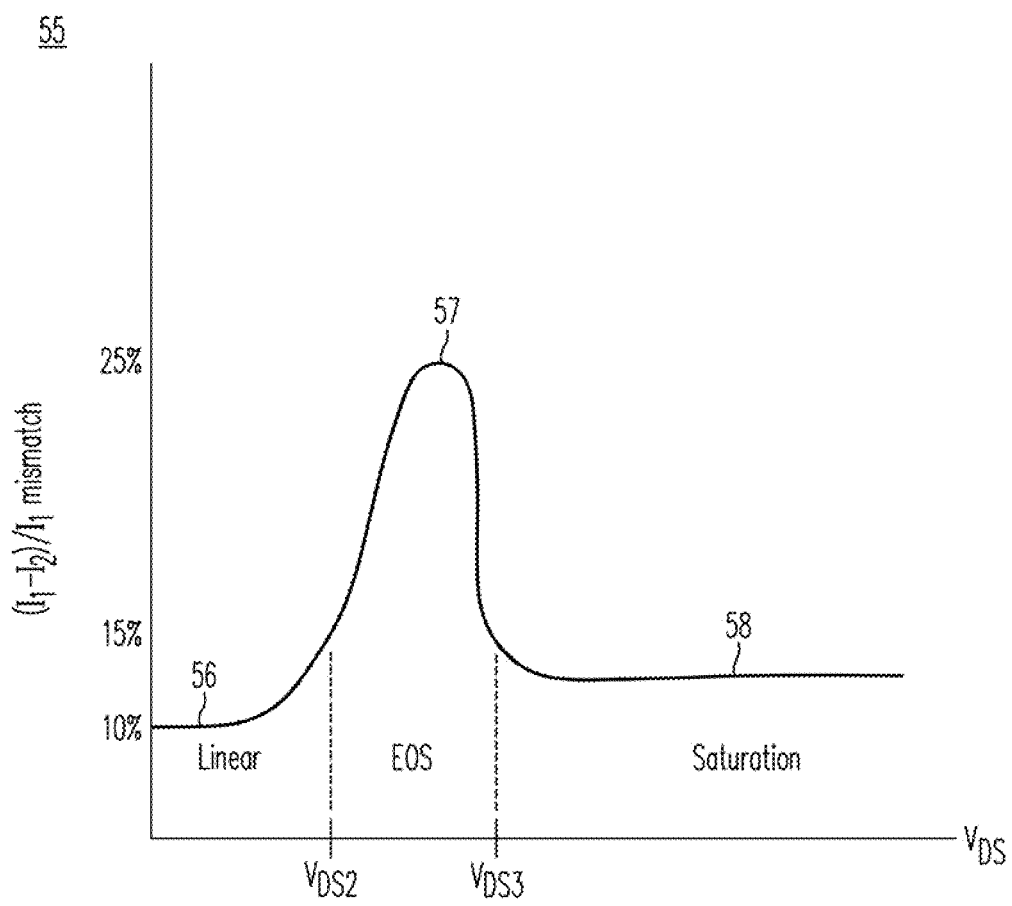
FIG. 2E is a graph of the current mismatch of the main and sense MOSFETs.
Figure 4A:
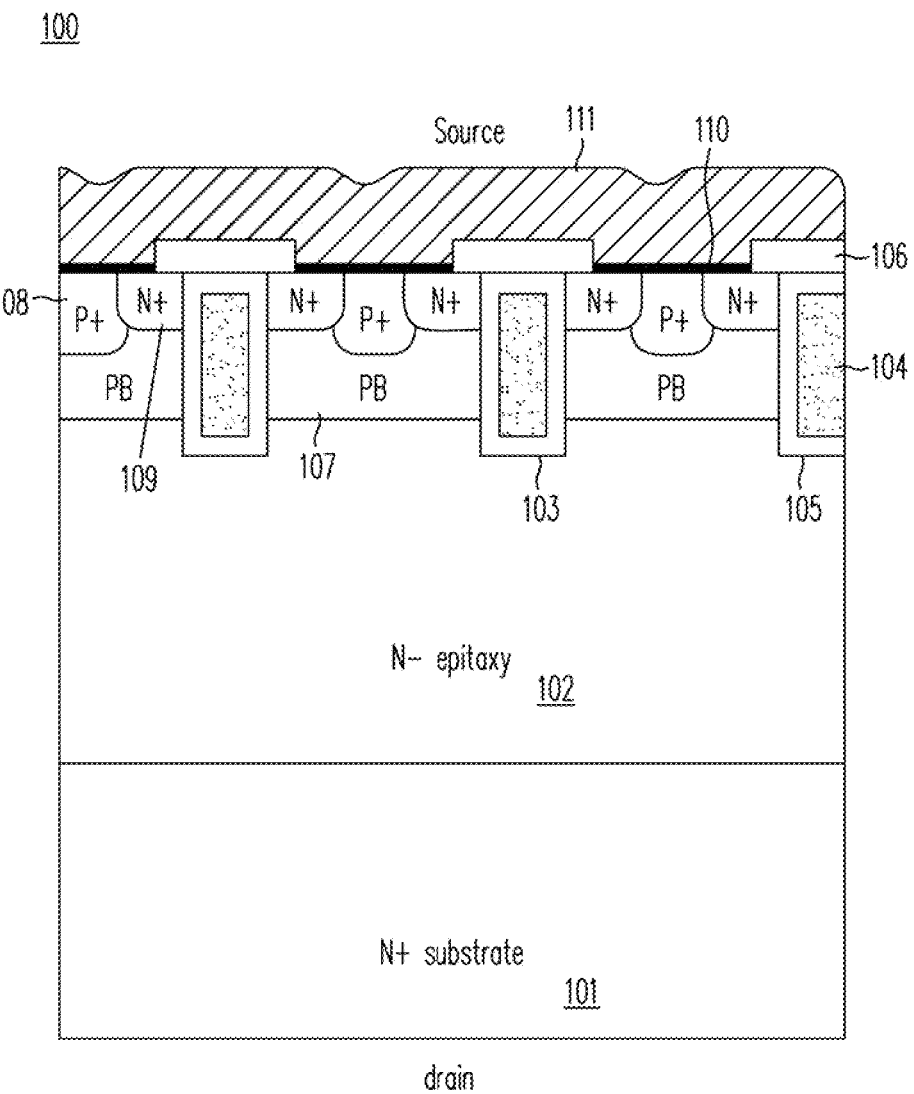
Figure 4B:
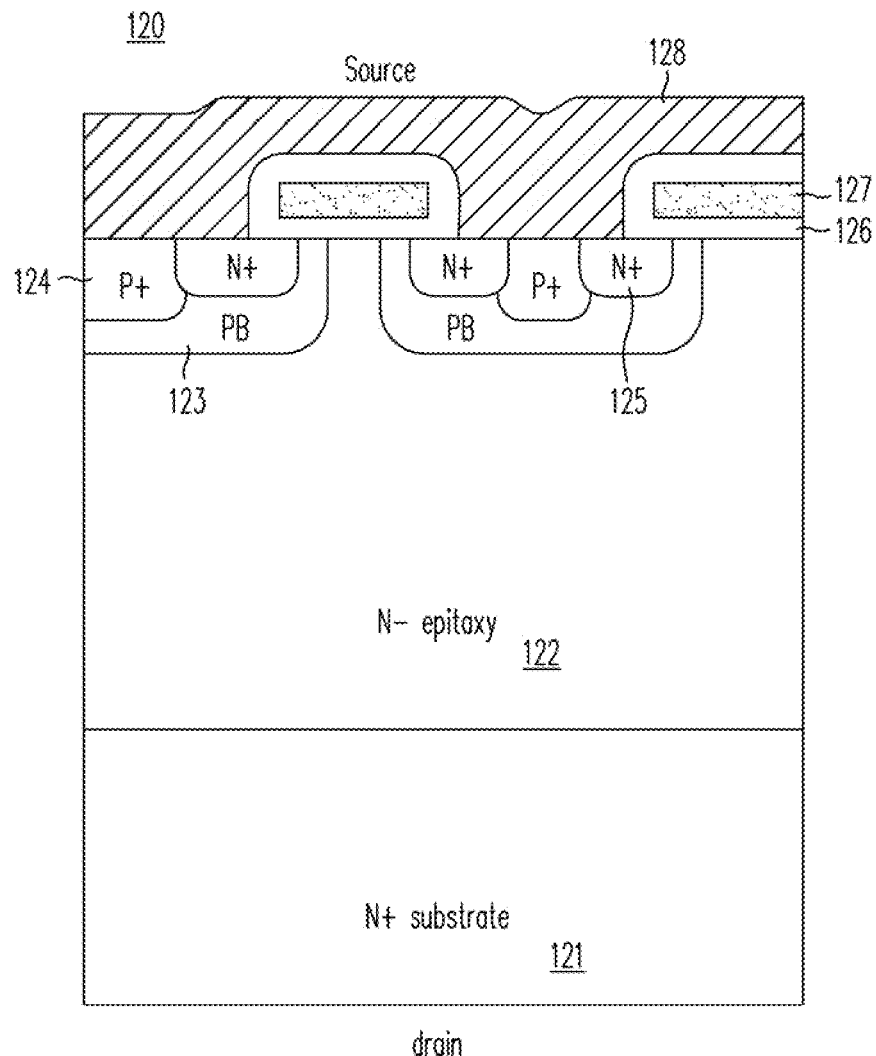
Figure 4C:
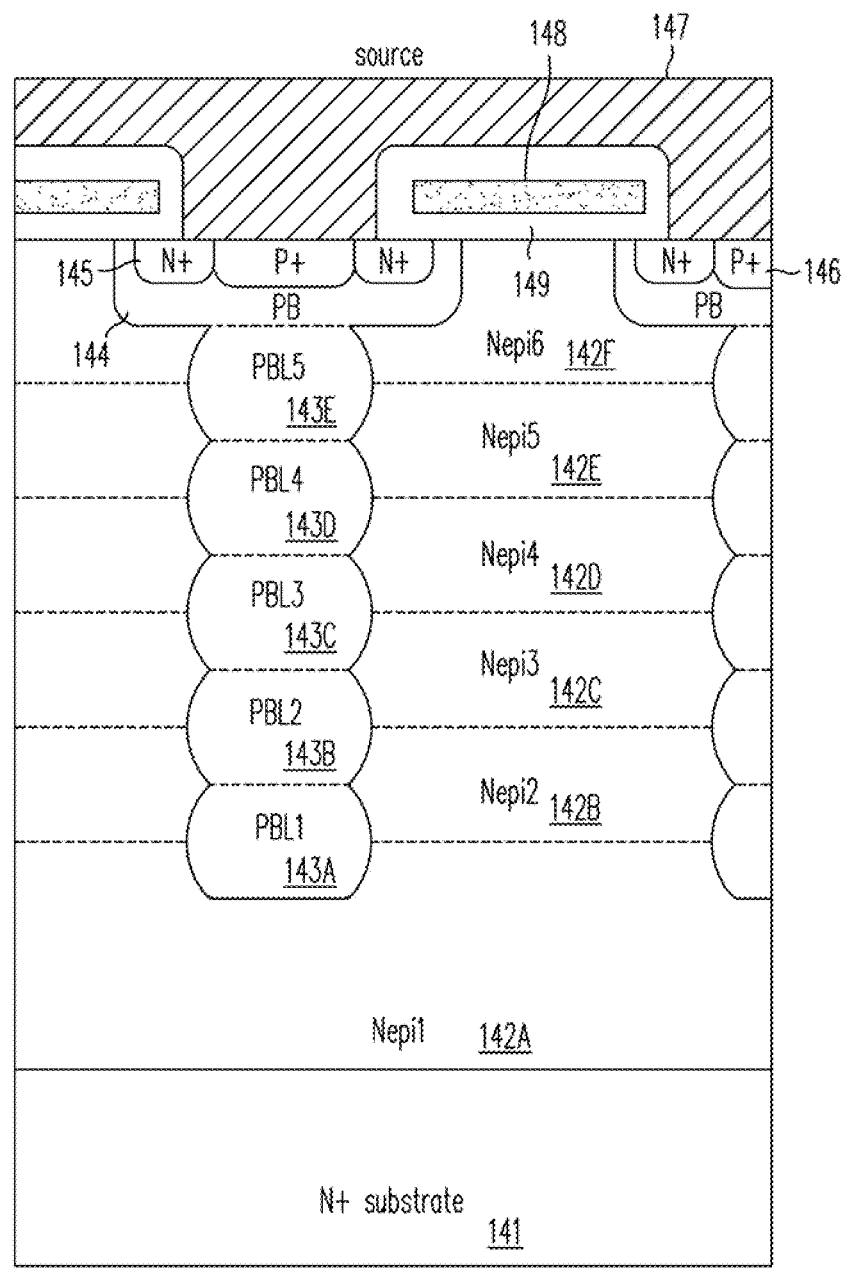
Figure 4D:
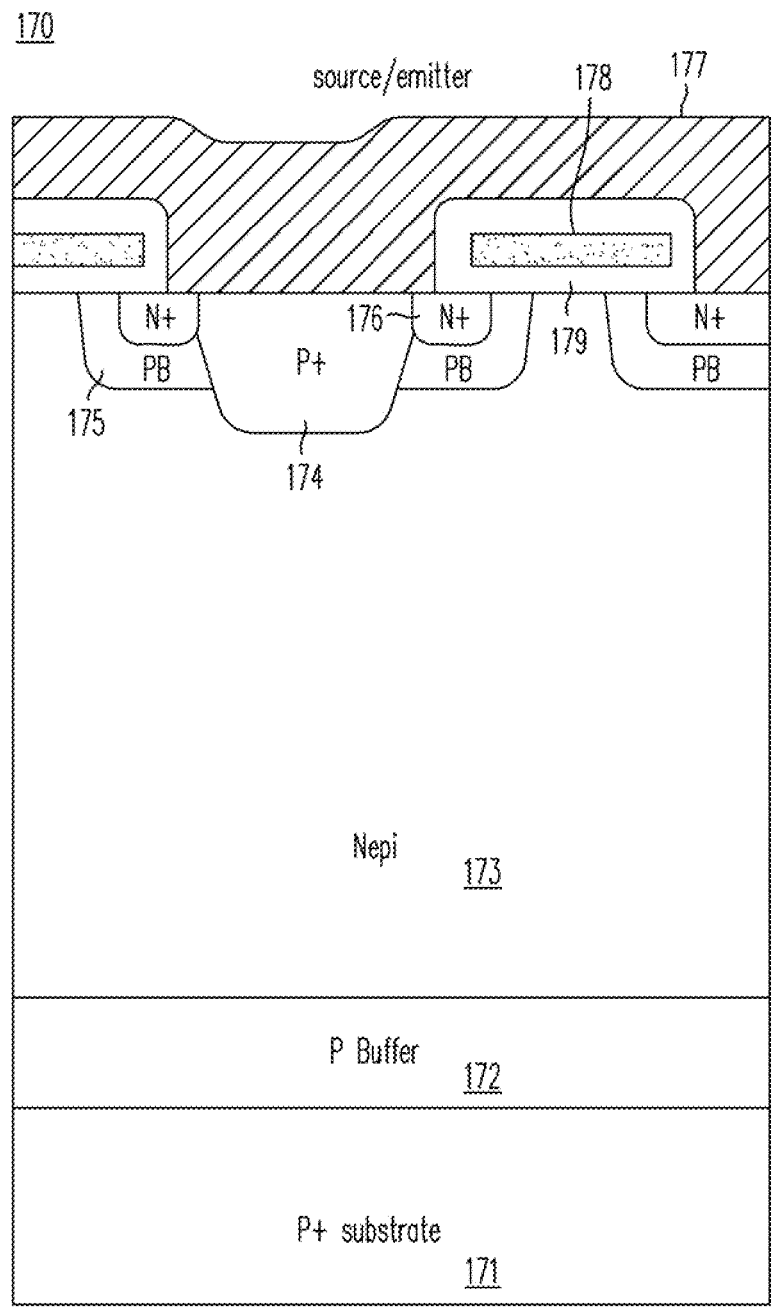
Figure 5A:
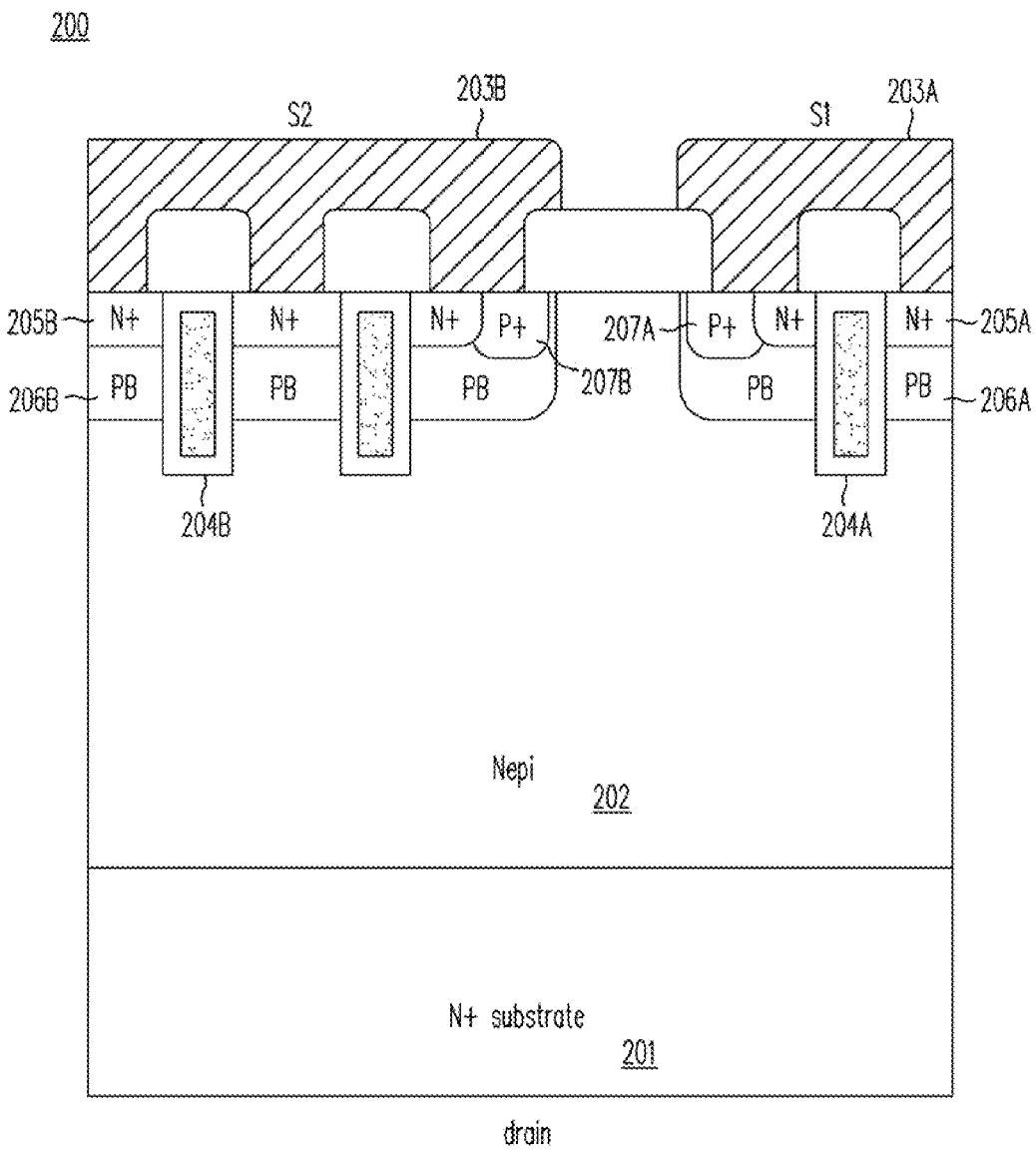
FIG. 5A is a cross-sectional view of a prior art split-source current mirror trench DMOS.
Figure 5D:
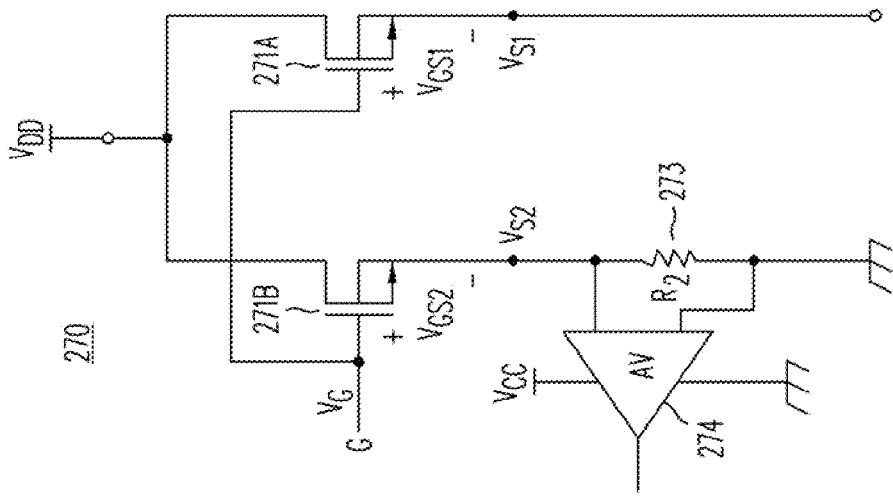
FIG. 5D is a circuit diagram of the device in a high-side application.
Figure 5C:
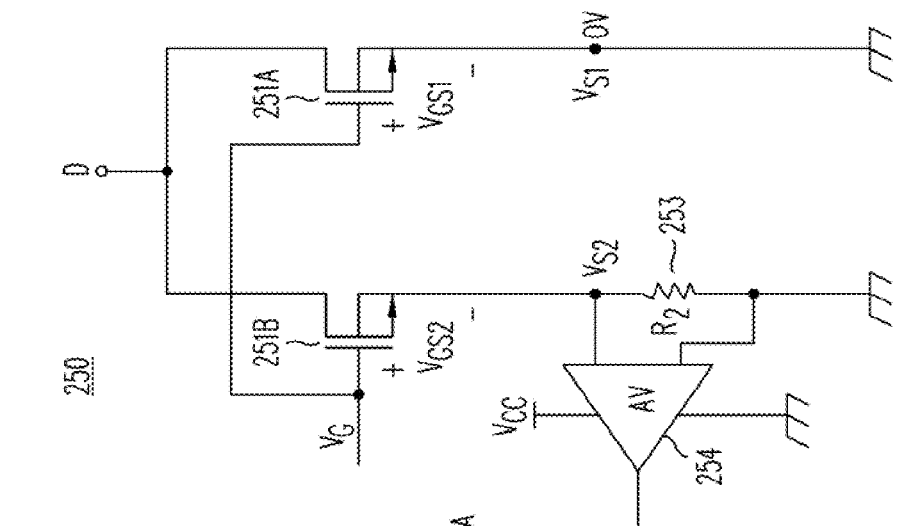
FIG. 5C is a circuit diagram of the device in a low-side application.
Figure 5B:
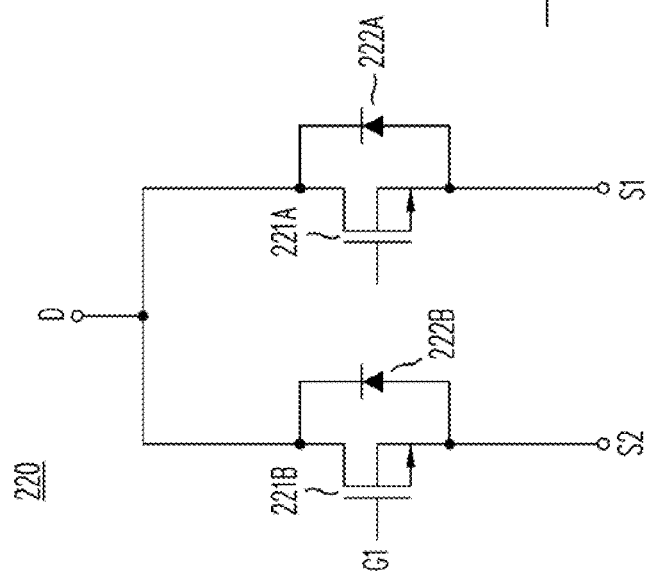
FIG. 5B is an (A) trench DMOS cross section (B) equivalent circuit diagram of the device shown in FIG. 5A.
Figure 7A:
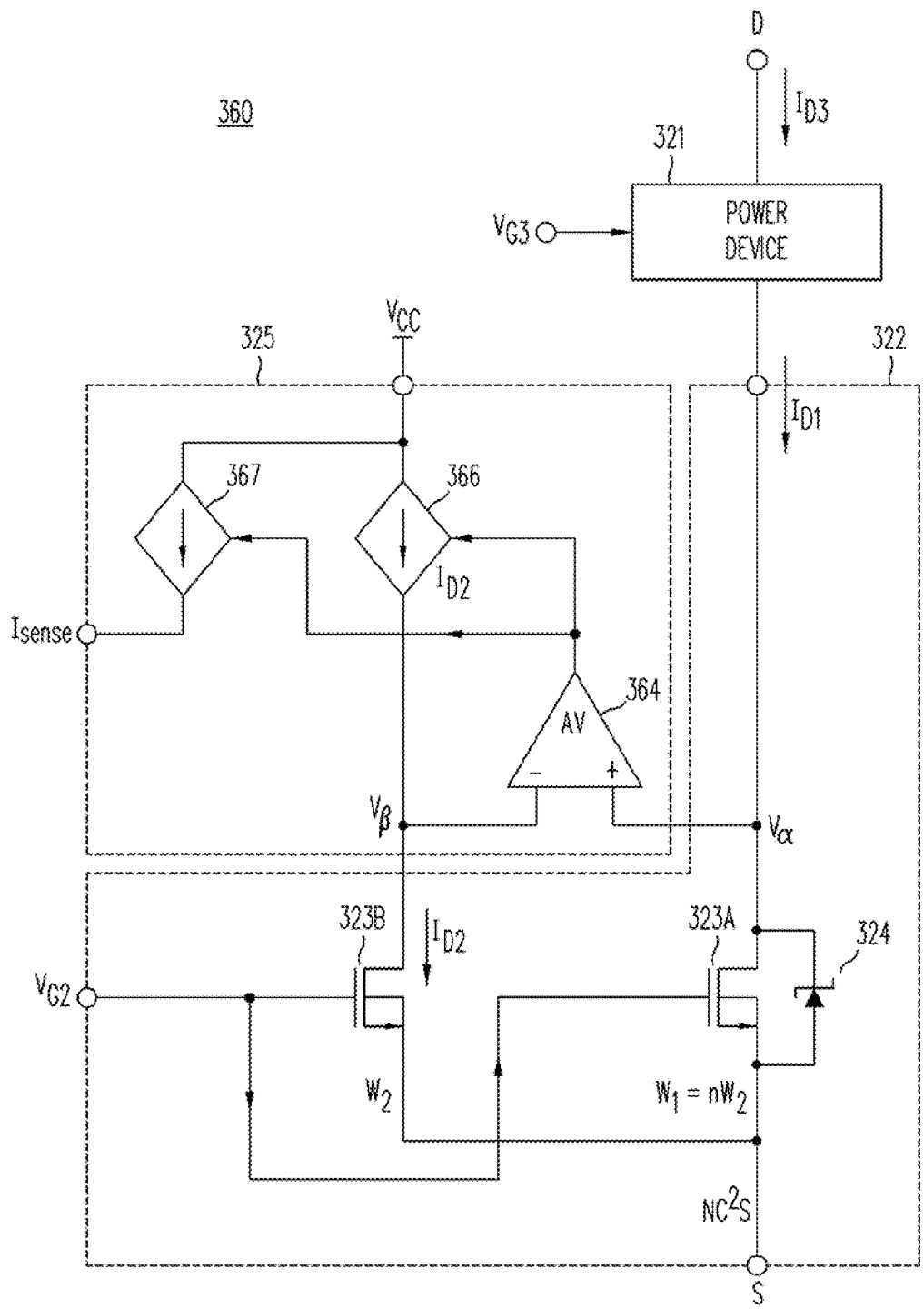
FIG. 7A is a functional circuit diagram of a low-side cascode current mirror current sensor using dependent current sources and an operational amplifier.

Current Sense And Bias Circuit Implementation: One embodiment of current sense and bias circuit 325 is illustrated in FIG. 7A. As shown, current sense and bias circuit 325 includes a combination of a dependent current source 366 controlled by an operational amplifier 364, which together bias the drain terminals of MOSFETs 323A and 323B. As noted above, the maximum voltage across the reverse-biased diode 324 is the voltage $V_\alpha$ across the drain and source terminals of main MOSFET 323A. In any case, the maximum input voltage on the non-inverting (+) input terminal of operational amplifier 364 is a voltage of a magnitude which is clearly less than the breakdown voltage $BV_Z$ of diode 324 or the $BV_{DSS}$ breakdown voltage of MOSFET 323A. Unlike the current-sensing circuits shown in FIGS. 1B and 2C, operational amplifier 364 in current sense and bias circuit 325 does not require high-voltage inputs to measure the current in power device 321, even in the event that power device 321 operates at high-voltages. This benefit makes sensing the voltage $V_\alpha$ with operational amplifier 364 more easier to implement.

With high gain, operational amplifier 364 will produce an output which adjusts the current $I_{D2}$ in dependent current source 366 and drives the voltages $V_\alpha$ and $V_\beta$ toward a single value. For example, if the voltage at $V_\alpha$ rises without warning, an error signal ($V_\alpha-V_\beta$) will develop at the input terminals of operational amplifier 364, which in turn will cause the current $I_{D2}$ in dependent current source 366 to increase proportionately. As a result, the voltage $V_\beta$ present across the drain and source terminals of sense MOSFET 323B will increase until it matches the value of $V_\alpha$. Operational amplifier 364 in conjunction with dependent-current-source 366 together form a transconductance amplifier having an error voltage ($V_\alpha-V_\beta$) as an input and a current $I_{D2}$ as an output, and transconductance $g_m$ such that $$I_{D2}=g_m \cdot (V_\alpha-V_\beta \pm V_{offset}) \equiv (I_{D1}/n) \pm I_{offset}$$

illustrating clearly that any offset in operational amplifier 364 or any mismatch in MOSFETs 323A and 323B will result in an offset or error in the magnitude of current $I_{D2}$.

Thus operational amplifier 364, dependent current source 366 and sense MOSFET 323B are connected so as to form a negative feedback loop. The error signal is the difference between the voltages $V_\alpha$ and $V_\beta$. Operational amplifier 364 operates as a "voltage difference detector" which detects the difference between the voltages $V_\alpha$ and $V_\beta$. Any difference between the voltages $V_\alpha$ and $V_\beta$ causes operational amplifier 364 to drive current source 366 to increase or decrease the current through MOSFET 323B in such a way that the voltage $V_\beta$ at the terminal of MOSFET 323B is driven into equality with the voltage $V_\alpha$. If $V_\alpha$ becomes greater than $V_\beta$, operational amplifier 364 drives current source 366 to provide a larger current, which increases the voltage drop across MOSFET 323B and hence the voltage $V_\beta$ until $V_\beta$ equals $V_\alpha$. If $V_\alpha$ becomes less than $V_\beta$, operational amplifier 364 drives current source 366 to provide a smaller current, which reduces the voltage drop across MOSFET 323B and hence the voltage $V_\beta$ until $V_\beta$ equals $V_\alpha$.

Since dependent current source 367 is also controlled by the output voltage of operational amplifier 364, the current $I_{sense}$ output from dependent current source 367 is just a multiple of the current $I_{D2}$ flowing in current source 366:

$$I_{sense} \approx m \cdot I_{D2} \approx m \cdot \left(\frac{I_{D1}}{n}\right)$$

For convenience, current sources 366 and 367 can have identical construction so that the ratio m≡1, so then $I_{sense}$ and $I_{D2}$ have the same magnitude of current, and in the absence of any offset $I_{sense}=(I_{D1})/n$.

Figure 7B:
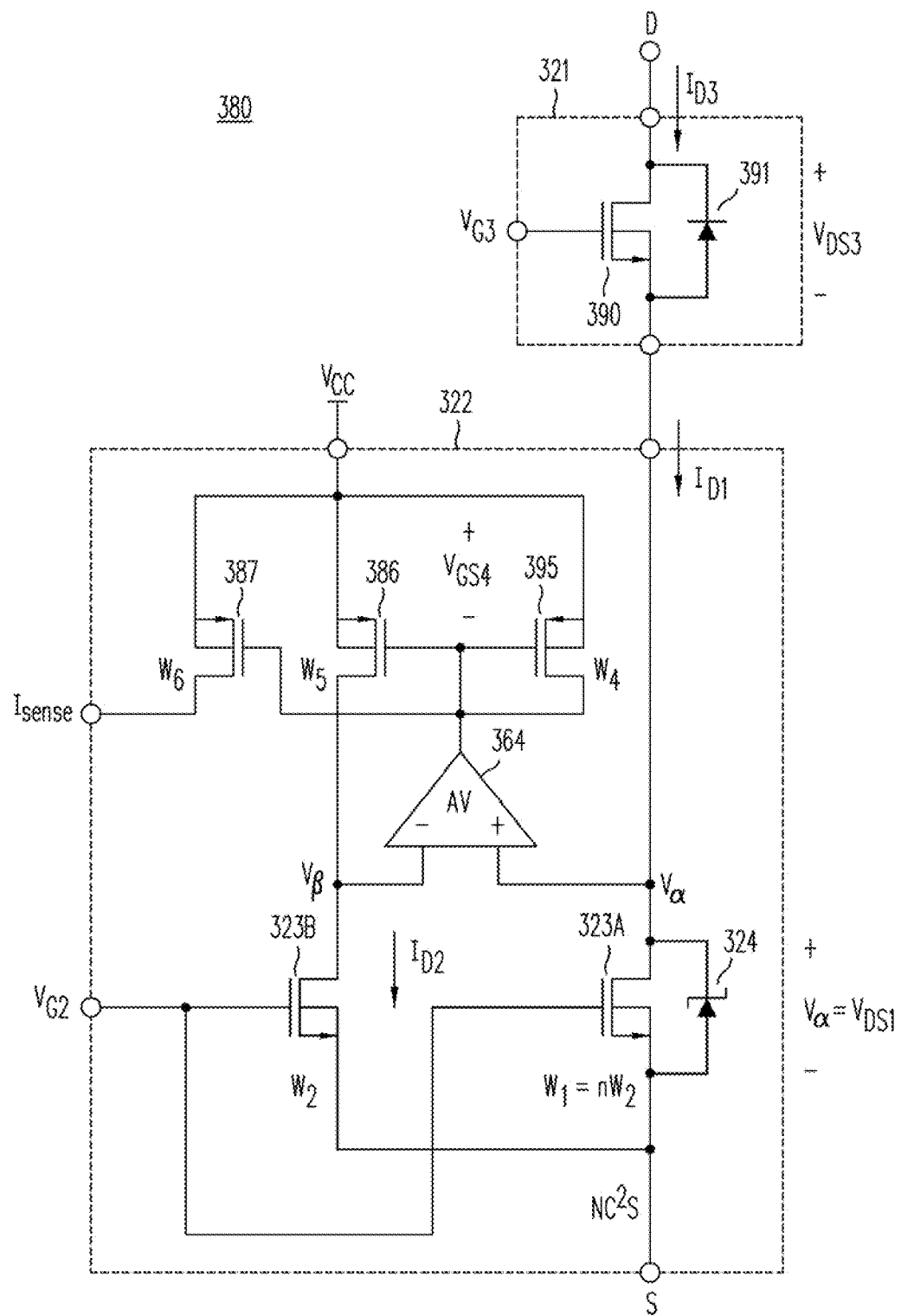
FIG. 7B is a circuit diagram of a low-side cascode current mirror current sensor using an operational amplifier.

An illustrative physical implementation of current sensor 322 and power device 321 is shown in FIG. 7B. Power device 321 comprises an N-channel MOSFET 390 with an intrinsic drain-to-source parallel diode 391. Power MOSFET 390 may be lateral or vertical, and may be constructed as a conventional surface channel, planar DMOS, trench-gated DMOS or super-junction DMOS device. The N-channel cascode-current-source or $NC^2S$ comprises N-channel sense MOSFET 323B of gate width $W_2$ conducting current $I_{D2}$ and main N-channel MOSFET 323A with gate width $W_1=n \cdot W_2$ conducting current $I_{D1}$.

Operational amplifier 364 biases the drain of a "threshold-connected" P-channel MOSFET 395 and the gates of MOSFETs 395, 386 and 387 to a common gate potential $V_{GS4}$. MOSFETs 395, 386 and 387 have the same channel lengths L and ideally should be constructed of similar geometries and orientations on the silicon die to maximize matching accuracy.

Under closed loop control, the high-gain amplifier 364 adjusts $V_{GS4}$ and the current $I_{D2}$ in P-channel MOSFET 386 until the potentials $V_\alpha$ and $V_\beta$ are equal. Assuming the gate bias $V_{G2}$ on N-channel MOSFET 323B is large, MOSFET 323B is operating in its linear region with a small voltage drain-to-source voltage $V_\beta$. As a consequence, P-channel MOSFET 386 will be in saturation with a large $V_{DS}$ and behave as a constant current source. Under such closed loop conditions, the current $I_{D2}$ in MOSFET 386 depends primarily on the value of $V_{GS4}$.

The threshold-connected MOSFET 395 is a clamping device normally used in current mirrors to insure that the MOSFETs remain in saturation. MOSFET 395 is optional but may be included to prevent gate voltage and drain current overshoot during transients. If so, the gate widths of MOSFETs 386 and 395 are preferably equal, i.e. $W_4=W_5$. More importantly, the output current $I_{sense}$ from P-channel MOSFET 387 depends on the ratio of its gate width $W_6$ to the gate width $W_5$ of MOSFET 386

$$I_{sense} \cong I_{D2}\frac{W_6}{W_5} = I_{D3}\frac{W_6}{n \cdot W_5}$$

so long as MOSFET 387 is operated in saturation, i.e. with $|V_{DS6}|>|V_{GS4}-V_t|$.

Operation of current sensor 322 utilizes two matched current-mirror pairs: P-channel MOSFETs 387 and 386, with a small ratio of gate widths $W_6/W_5$ (preferably unity), both operating in saturation with a gate bias $V_{GS4}$ determined by closed loop feedback; and N-channel MOSFETs 323A and 323B with a very large ratio of "n", both preferably operating in the linear region with equal drain-to-source potentials $V_\alpha=V_\beta$. The current measurement is therefore equally accurate regardless of whether power MOSFET 390 is operating in its linear region, saturation region, quasi-saturation "knee" region, and even when diode 391 is in avalanche breakdown or reverse diode recovery.

From an efficiency and power dissipation perspective, it is beneficial to maintain the voltage drop $V_\alpha$ as low as possible since the overall $V_{DS}$ of the NC²S monitored MOSFET 390 is the sum of the series voltage drops.

$$V_{DS}=V_{DS3}+V_\alpha=V_{DS3}+I_{D3} \cdot R_{DS1}$$

For an effective on-resistance $R_{DS}$ of $$R_{DS} = \frac{V_{DS}}{I_{D3}} = \frac{V_{DS3}}{I_{D3}} + R_{DS1}$$

This effective on-resistance is valid for any value of $V_{DS}$. If MOSFET 390 is biased in its linear region with a large gate bias $V_{G3}$, then the equation simplifies to $$R_{DS} = \frac{V_{DS}}{I_{D3}} = R_{DS3} + R_{DS1}$$

clearly illustrating that the overall performance of the current monitored MOSFET 390 improves as $R_{DS1} \to 0$. The resistance of N-channel MOSFET 323A is minimized for large gate drive voltage $V_{G2}$, forcing MOSFET 323A into its linear region and maintaining a small voltage drop $V_\alpha$ regardless of the condition of power MOSFET 390.

Figure 8:
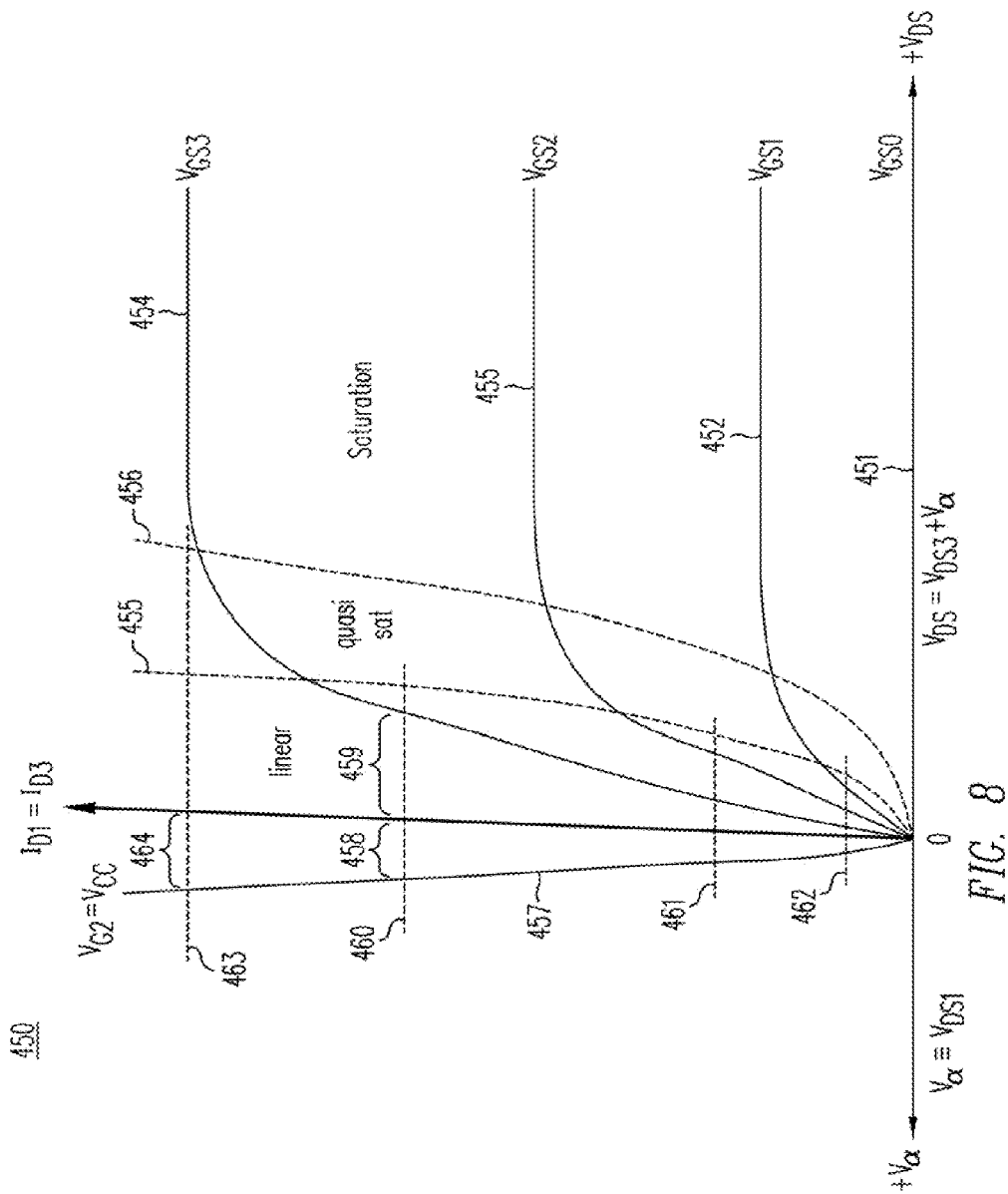
FIG. 8 is a graph showing the current-voltage characteristics of a cascode current sensor and a combined $NC^2S$ with an N-channel power MOSFET.

In a preferred embodiment, gate bias $V_{G2}$ is permanently biased to the supply $V_{cc}$, e.g. to 5V, so that MOSFETs 323A and 323B are both fully "on" and biased into their lowest resistance, most conductive state to reduce power dissipation and series resistance in the high-current path $I_{D1}$. This point is illustrated in the dual graph 450 shown in FIG. 8 comprising a graph of $+V_{DS}$ versus $+I_{D3}$ for NC²S power MOSFET 390 on the right side of the ordinate axis and a second graph of $+V_\alpha$ versus $+I_{D3}$ for sense MOSFET 323A on its left side. As described and illustrated, drain currents $I_{D3}=I_{D1}$, the voltage across current sense MOSFET 323A is $V_{DS1}=V_\alpha$, and the overall $V_{DS}$ is the sum of $V_{DS1}$ and $V_{DS3}$, or as $V_{DS}=V_{DS3}+V_\alpha$.

The graph illustrates four gate bias conditions $V_{G3}$ on power MOSFET 390. In bias $V_{GS0}$ shown by line 451 the gate is biased to zero volts, i.e. to its source, so that $V_{G3}=0$ and power MOSFET 390 is cut off. Curves 452, 453 and 454 represent four sets of drain current curves at increasingly positive gate bias conditions whereby $V_{GS3}>V_{GS2}>V_{GS1}>V_{GS0}$ and correspondingly higher saturated drain currents and lower on-resistances.

The curves can be divided into three regions, one where $V_{DS}$ is less than the values of line 455, known as the "linear" region of power MOSFET 390—a region having linear current-voltage characteristics. In a second region where $V_{DS}$ is greater than the values of line 456, power MOSFET 390 is "saturated", exhibiting constant current while sustaining high source-to-drain voltages, and consequently dissipating high power. Increasing the $V_{GS}$ gate drive on power MOSFET 390 lowers the overall resistance $R_{DS}$ in the linear region and also increases the saturation current $I_{Dsat}$. The "knee" region between lines 456 and 455 is known as the quasi-saturation region where both the current and the slope of the current change with $V_{DS}$. All three regions include a voltage drop $V_{DS3}$ across both power MOSFET 390 and a voltage drop $V_\alpha$ across current sense MOSFET 323A.

On the left side of graph 450, the current-voltage characteristic of the sense MOSFET 323A is illustrated in a plot of $I_{D3}$ versus $V_\alpha$. Since $I_{D3}$ is the same for both power-MOSFET 390 and sense MOSFET 323A, the two graphs are merged and share a common ordinate axis. Line 457 illustrates that for any current shown, sense MOSFET 323A exhibits a linear I-V characteristic and never saturates or enters quasi-saturation. As illustrated, the voltage drop across sense MOSFET 323A is ideally a small portion of the total voltage drop. For example, at the drain current shown by line 460, the overall voltage drop across MOSFET 390 (line 459) includes a portion across sense MOSFET 323A of magnitude $V_\alpha$ (line 458), a drop less than 25% of the total voltage drop (line 459). The ratio of the power dissipation in sense MOSFET 323A to the overall power dissipation stays roughly equal at lower drain currents (lines 461 and 462), even though all voltages are reduced.

For example, at 3 A, a total resistance $R_{DS}$ of 70 mΩ will dissipate 630 mW. Self-heating will further increase the on-resistance of power MOSFET 390 until power MOSFET 390 arrives at a steady-state thermal condition of power dissipation, self heating, and temperature-induced resistance increases in $R_{DS(on)}$. At 3 A, a 30 mΩ sense MOSFET 323A dissipates 270 mW, or 42% of the overall power dissipation. Since power MOSFET 390 and sense MOSFET 323A likely do not share the same package die pad, the impact of heating on the resistance of sense MOSFET 323A is minimal.

Similarly, heating in sense MOSFET 323A does not interfere with the performance of power MOSFET 390. More importantly, any temperature rise in MOSFET 323A causes a similar rise in sense MOSFET 323B, since the two devices are located in the same sense IC and are likely integrated using a merged geometry, as described below. In practice, the energy dissipation in sense MOSFET 323A is a matter of economics, with lower resistance sense MOSFETs requiring a larger die area, fewer net dice-per-wafer, and consequently higher cost. Percentage of the total power consumption can range from 5% to around 70%, depending on die size. The most important design parameter is to design MOSFET 323A with sufficient gate width that it never saturates, regardless of whether power MOSFET 390 is operating in its saturation regions, its linear region, or its quasi-saturation region.

Current sensors according to the invention work equally well for monitoring the current in saturated power MOSFETs. For example, referring again to FIG. 8, at the current level represented by line 463, power MOSFET 390 saturates (line 454) and the current $I_{D3}$ through MOSFET 390 therefore becomes essentially constant for varying drain voltages $V_{DS}$.

The voltage drop $V_\alpha$ across sense MOSFET 323A likewise remains constant, since $V_\alpha = I_{D1} \cdot R_{DS1}$ and since $I_{D3} = I_{D1}$. Thus, current monitoring of a saturated high power MOSFET 390 does not cause sense MOSFET 323A to operate outside its linear operating region, and the bias circuitry maintains the condition $V_\alpha = V_\beta$.

Figure 7C:
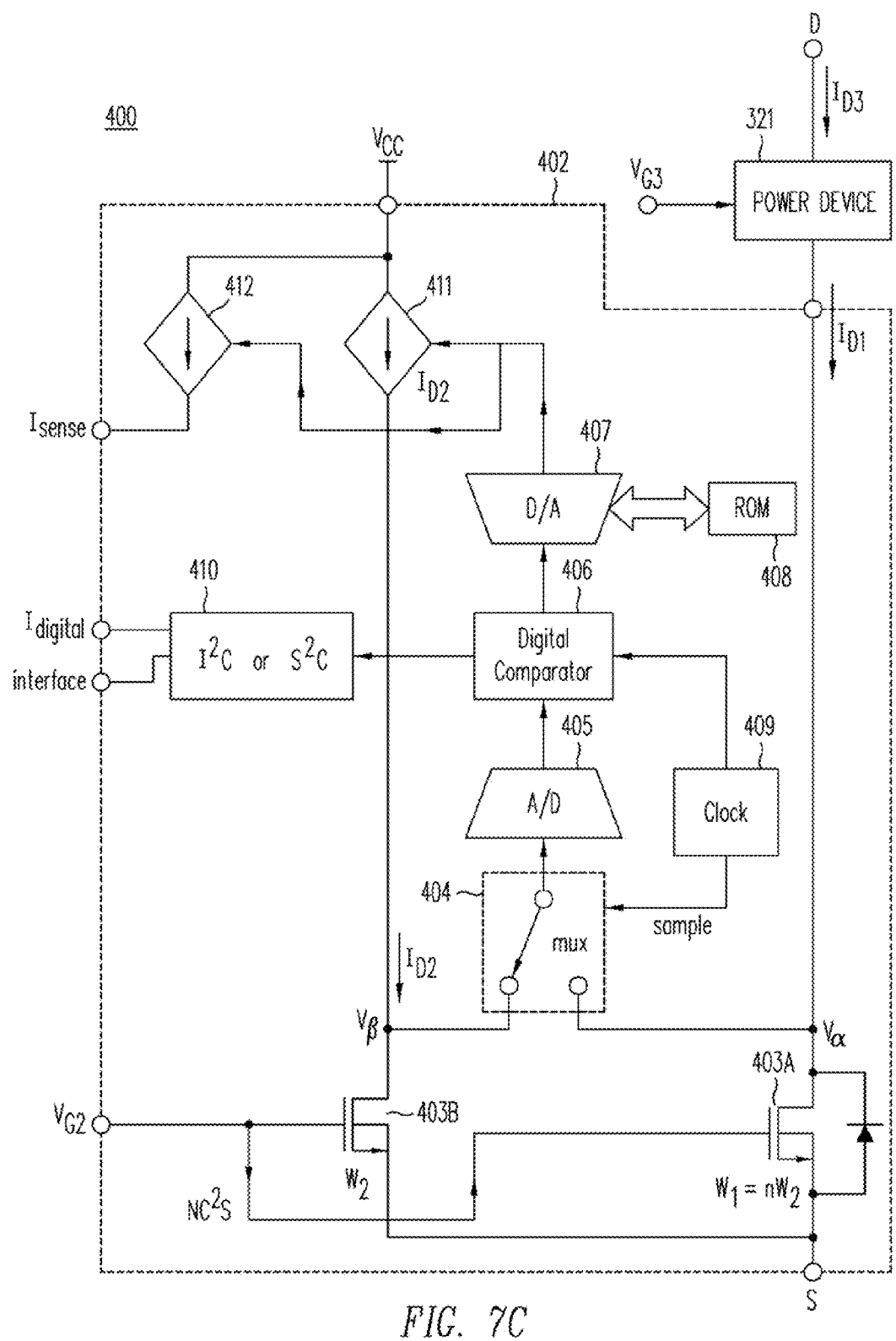
FIG. 7C is a circuit diagram of a low-side cascode current mirror current sensor using digital control.

The use of operational amplifier 364 is not the only means by which to achieve the linear sensing criterion $V_\alpha = V_\beta$. A digital method may also be applied using a combination of data conversion and logic. Circuit 400 in FIG. 7C uses one such digital approach where the current $I_{D3}$ in power device 321 is monitored by a current sensor 402 comprising a main MOSFET 403A, a sense MOSFET 403B whereby a digital control circuit adjusts the current $I_{D2}$ from a current source 411 to ensure that $V_\alpha = V_\beta$. As shown, an analog multiplexer 404 alternately samples the two voltages $V_\alpha$ and $V_\beta$ at a clock rate set by a clock 409. The voltages $V_\alpha$ and $V_\beta$ are converted into a digital representation by an A/D converter 405 and are sequentially stored in the two resisters of a digital comparator or logic block 406. Algorithms may vary, but the simplest approach is that if $V_\alpha > V_\beta$ the current $I_{D2}$ in dependent current source 411 is increased, and alternatively if $V_\beta > V_\alpha$ the current $I_{D2}$ in controlled current source 411 is decreased. The amount of the adjustment in the magnitude of $I_{D2}$ can be determined in proportion to the digital error signal representing the quantity $|V_\alpha - V_\beta|$. Once the desired current $I_{D2}$ is determined, the digital information is converted into an analog signal through a D/A converter 407, which is calibrated through a code stored in a ROM 408. A programmable memory such an EPROM or one time programmable (OTP) memory can be used to set, trim or otherwise calibrate the code contained in ROM 408 during the IC's manufacture of current sensor 402 or thereafter.

The combination of D/A converter 407, ROM 408 and dependent current source 411 together comprise a current output D/A converter, or current DAC. The current in current source 411 is mirrored, scaled, or replicated in current source 412 to produce an analog output current $I_{sense}$. The sense current $I_{sense}$ may also be digitally represented by the output of digital comparator or logic block 407, and converted to a serial interface output 410 such as I²C, S²Cwire or AS²Cwire.

Operating Modes of the Cascode Current Sensor: With an independent input $V_{G2}$, the gate bias on the main and sense MOSFETs in the cascode current sensor can be fixed or adjusted dynamically. One approach, shown in FIG. 9A is to synchronize the gate voltage $V_{G2}$ of a sense MOSFET 473 with the gate voltage $V_{G3}$ of a power MOSFET 472. In circuit 470 a single gate buffer 476 drives the gates of both MOSFETs 472 and 473. In the off state of MOSFETs 472 and 473, diodes 474 and 475 remain reverse biased as shown in the equivalent circuit 477 of FIG. 9B. In the on-state of MOSFETs 472 and 473, with minimal power dissipation MOSFETs 472 and 473 ideally are biased fully in their linear-region and behave as resistors 481 and 482, as shown in the equivalent circuit 480 of FIG. 9C. In the conducting state, diodes 474 and 475 remain off and non-conducting and are therefore not shown. One possible disadvantage of this approach is that the gate drive losses are higher because low on-resistance MOSFETs 472 and 473 are being switched at high frequencies simultaneously.

A preferred option is shown in circuit 485 of FIG. 9D, where the gate voltage $V_{G3}$ of a power MOSFET 487, provided by a buffer 491, is switched at a high frequency between $V_{cc}$ and ground while gate voltage $V_{G2}$ of a sense MOSFET 488 is permanently biased "on" at $V_{cc}$. In off state of power MOSFET 487, shown in the equivalent circuit 492 of FIG. 9E, MOSFET 487 is off, diode 489 is reversed-biased, and MOSFET 488 is in its on state, represented by a resistor 494. Nonetheless, the voltage $V_\alpha$ remains at ground because no current is flowing.

In the on state of MOSFET 487, shown in the equivalent circuit 495 of FIG. 9F, MOSFET 487 is biased on and represented as a resistor 496. MOSFET 488 remains on and continues to be represented by resistor 494. The voltage at node $V_\alpha$ depends on the relative resistance of resistors 496 and 494, so that $V_\alpha = R_{DS3}/(R_{DS1} + R_{DS3})$.

Assembly of a Cascode Current Sensor: One embodiment of a cascode current sensor, shown in the plan view 500 of FIG. 10A, comprises two silicon dice 503 and 504 mounted into a 10-pin surface mount package encapsulated by plastic 505. Cascode current sensor (C²S) die 504 sits atop a conductive die pad 502A with three leads 502B connected to die pad 502A. Gold wire down bonds 510A and 510B connect the surface source pads to die pad 502A and leads 502B. Tie bar 502C is optional since leads 502B provide stability to die pad 502A. Wire bonds 509 to independent leads 511 are used to connect C²S die 504 to $V_{cc}$, $I_{sense}$, and $V_{G2}$ connections. If gate bias $V_{G2}$ is permanently biased to $V_{cc}$, the pin can be eliminated and used as another drain pin.

Power device die 503 comprises a vertical conduction device such as a vertical trench DMOS with topside source and gate contacts and a metalized backside drain. The drain is attached using conductive epoxy to a copper leadframe 501A with three attached leads 501B which carry both drain current and heat from die 503. The source of the DMOS within die 503 is connected to current sensor die 504 using chip-to-chip wire bonds 507A and 507B. As shown, the gate of the DMOS inside die 503 is connected to a dedicated $V_{G3}$ lead by a wire bond 506. Alternatively, the gate of the DMOS can be connected from die 503 to die 504 using a chip-to-chip bond and then to an independent package lead 511. Side view 520 in FIG. 10B illustrates the same device in cross section along section line A-A".

Cascade Current Sensing in Switching Regulators; One class of devices that can benefit from the cascode current sense method disclosed herein is the class of switching voltage regulators, also known as DC/DC converters. Specifically, switching voltage regulators employ a single MOSFET and a rectifier diode or a push-pull power MOSFET stage switching of a high frequency to control the average current in an inductor and the average voltage across an output capacitor. Operated in this manner, a switched inductor acts like a programmable current source but with low power losses. Negative feedback is utilized to adjust MOSFET on-time or duty factor to control the inductor current and ultimately, the voltage across the output capacitor to a predetermined value.

Switching regulators may comprise any number of converter topologies, but for single inductor versions the step-up "boost" converter and the step-down "Buck" converter are the most common. In some cases, the rectifier diode is shunted by a MOSFET synchronized to conduct only during a portion of the time when the rectifier diode is forward biased. Such MOSFETs are known as "synchronous rectifiers".

The controller affecting the MOSFET on-time, duty factor, and frequency is often generically referred to as a "chopper" or pulse-width modulation (PWM) control circuit, even in cases where the frequency varies with load current. PWM controllers may be categorized in two major classes of control algorithm—voltage mode and current mode. In voltage mode, the feedback of the output voltage is amplified and compared to a fixed voltage ramp waveform using an analog comparator to adjust the pulse width and MOSFET on-time.

In current mode control, feedback of the output voltage is compared against a ramp whose slope is adjusted as a function of inductor current.

The inductor current feedback signal, represented herein as $I_{FB}$, is a continuous analog measure of current in the inductor or of the current in an MOSFET driving the inductor. Together current feedback and output voltage feedback are important feedback signals to insure proper current-mode PWM operation. Inaccurate or unpredictable measurement of current can lead to glitches and noise, poor transient response regulation, instability and oscillations.

Figure 11:
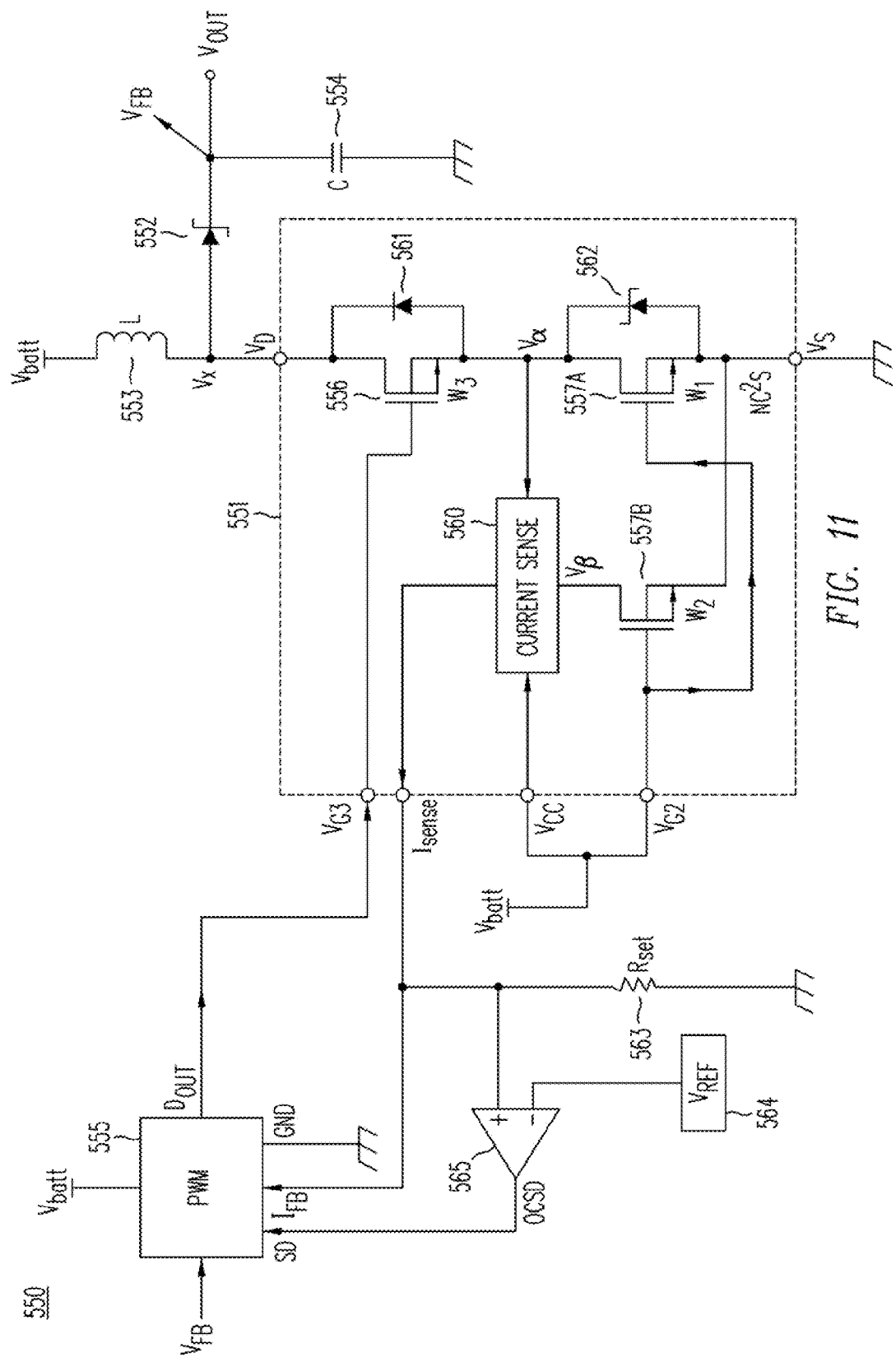
FIG. 11 is a circuit diagram of a boost converter using a cascode current sensor.

An example of a current-mode boost converter utilizing the disclosed cascode current sense technique is illustrated in FIG. 11. As shown, boot converter 550 comprises a current PWM control circuit 555, an inductor 553, a Schottky rectifier 552, an output capacitor 554 and a combination N-channel power MOSFET with integral cascode current sensing 551. PWM controller 555 powered by input $V_{batt}$ produces a PWM or pulsed output $D_{out}$ which is the gate voltage $V_{G3}$ of N-channel power MOSFET 556. PWM control circuit 555 regulates in response to two analog inputs, the $V_{FB}$ and $I_{FB}$ feedback signals. The output voltage feedback signal $V_{FB}$ is a scalar multiple of the output voltage $V_{OUT}$ of converter 550, typically scaled using a resistor divider. The analog feedback current $I_{FB}$ is provided to PWM control circuit 555 from the $I_{sense}$ output of current sensor 551.

To facilitate accurate current sensing, current sensor 551 comprises a cascode circuit comprising power MOSFET 556, a low-resistance main MOSFET 557A and a sense MOSFET 557B, controlled by sense and bias circuitry 560. As shown, the inputs $V_{cc}$ and $V_{G2}$ to sense MOSFET 557A are both hard wired to the battery power source $V_{batt}$ or may be powered from a 3V or 5V regulated supply rail in the system.

Aside from current-mode PWM control, accurate current sensing is also needed for over-current shutdown (OCSD) protection against over-current and short circuit conditions in DC/DC converters. As shown, in boost converter 550, the analog signal representing the $I_{FB}$ current—typically a voltage $R_{set} \cdot I_{FB}$ across a resistor 563, is compared to a reference voltage 564 by an OCSD comparator 565 with built-in hysteresis, and when the current $I_{FB}$ exceeds a certain value the comparator is tripped, the SD shutdown input is forced high, switching ceases and regulation is suspended until the fault condition ends. This function is a consequence of an analog measurement of current. The end of the over-current fault can be identified when the $I_{FB}$ current drops below the comparator's lower trip point, or when some other fault recovery sequence occurs.

Poor quality current measurement can lead to inconsistent DC/DC converter operation. Without accurate current sensing, noise can interrupt regulation; manufacturing variations in the MOSFET can cause inconsistencies in the trip point of over-current shutdown; and high temperatures or power dissipation can cause false triggering of short-circuit protection.

The cascode current sense MOSFET 551 avoids all these issues, since its $I_{sense}$ output is temperature compensated and bias independent, and the magnitude of the signal is sufficiently large to be noise insensitive. The $I_{sense}$ signal can be used simultaneously as an input for both the analog current mode control and the digital over-current shutdown functions.

Figure 12:
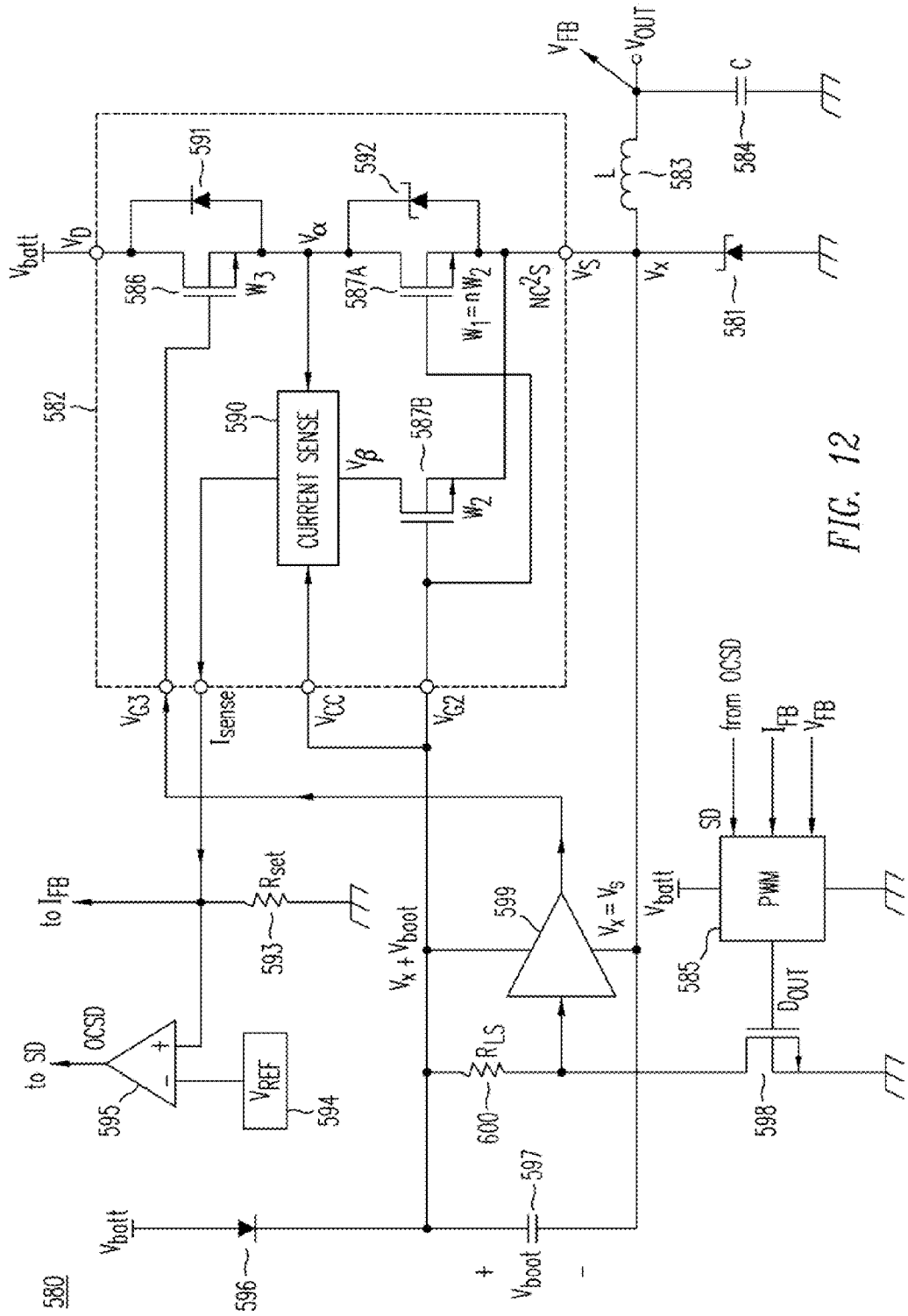
FIG. 12 is a circuit diagram of an N-channel Buck converter using a cascode current sensor.

As shown in FIG. 11, N-channel MOSFET 556 operates as a low-side switch in boost converter 550. In FIG. 12, a current-monitored power MOSFET is instead utilized as a high-side connected MOSFET. As illustrated, Buck converter 580 comprises a PWM control circuit 585, a Schottky rectifier diode 581, an inductor 583, an output capacitor 584, and N-channel power MOSFET 586 within a cascode current sensor 582. PWM control circuit 585 provides pulse-width modulated pulses to the gate of MOSFET 586 in response to feedback signals $V_{FB}$ and $I_{FB}$. The $I_{FB}$ signal, in conjunction with a set resistor 593 and OCSD comparator 595 drives the shutdown (SD) pin in PWM control circuit 585, and thereby facilitates over-current protection for converter 580. As shown, accurate current sensing $I_{sense}$ is achieved in MOSFET 586 using an N-channel cascode current sensor (NC²S) according to this invention. NC²S 582 comprises power MOSFET 586, a main MOSFET 587A, a sense MOSFET 5878 and a current sense and bias circuit 590. MOSFET 586 may be a high- or low-voltage MOSFET.

Operating on the high side, N-channel MOSFET 586 requires special gate biasing to drive its gate to a potential above the input voltage so that MOSFET 586 can conduct when $V_x = V_{batt}$, thereby permitting inductor 583 to be driven rail-to-rail to maximize efficiency and minimize power losses. The most common technique is to utilize a "bootstrap" gate drive, where a pre-charged bootstrap capacitor floats on the $V_x$ node of converter 580 and provides power for the gate buffer driving high-side N-channel power MOSFET 586. The bootstrap capacitor is refreshed each time the $V_x$ node is at ground.

This "bootstrap" technique also works for high-side NC²S MOSFET 586 as well. As shown in converter 580 of FIG. 12, the negative terminal of a bootstrap capacitor 597 is connected to the $V_x$ node and the positive terminal of bootstrap capacitor 597 is connected to the cathode of a bootstrap diode 596. Whenever MOSFET 586 is off and $V_x$ falls below ground, capacitor 597 is charged from the $V_{batt}$ supply via forward biased diode 596 to a voltage of approximately $V_{batt}$.

Whenever MOSFET 586 is on and conducting then $V_x$ rises to $V_{batt}$ and the positive terminal of bootstrap capacitor 597 floats to a voltage of $(V_x + V_{boot}) \approx 2V_{batt}$. During this time, bootstrap diode 596 remains reverse-biased and non-conducting. As in any bootstrap drive, the floating bootstrap capacitor 597 supplies a gate buffer 599 with power, used in switching MOSFET 586 on and off. Because gate buffer 599 is referenced to the $V_x$ node, the net gate voltage $V_{GS}$ supplied to MOSFET 586 remains at $V_{batt}$ regardless of the value of $V_x$. Since the output of PWM control circuit 585 is ground-referenced, the input signal to gate buffer 599 must be level-shifted to properly drive buffer 599.

While several methods exist, a resistor level-shifter is easy to implement. In FIG. 12, the level-shifter comprises only a resistor 600 and a MOSFET 598, the gate of MOSFET 598 being driven by the output signal $D_{OUT}$ of PWM control circuit 585. When the level shift is off, resistor 600 pulls the input of buffer 599 high. Conversely, when MOSFET 598 is on, it pulls down on resistor 600 and drives the input of buffer 599 into a low input state. The low-state input voltage into buffer 599 is determined by the size of MOSFET 598 and the value $R_{LS}$ of resistor 600. MOSFET 598 may be high-voltage as needed.

The bootstrap gate drive may also be used to power the bias circuitry within current sensor 582. By connecting the $V_{G2}$ and $V_{cc}$ terminals of current sensor 582 to the positive terminal of bootstrap capacitor 597, its internal circuitry remains biased at a voltage $V_{boot} \approx V_{batt}$ regardless of the voltage at node $V_x$.

Figure 13A:
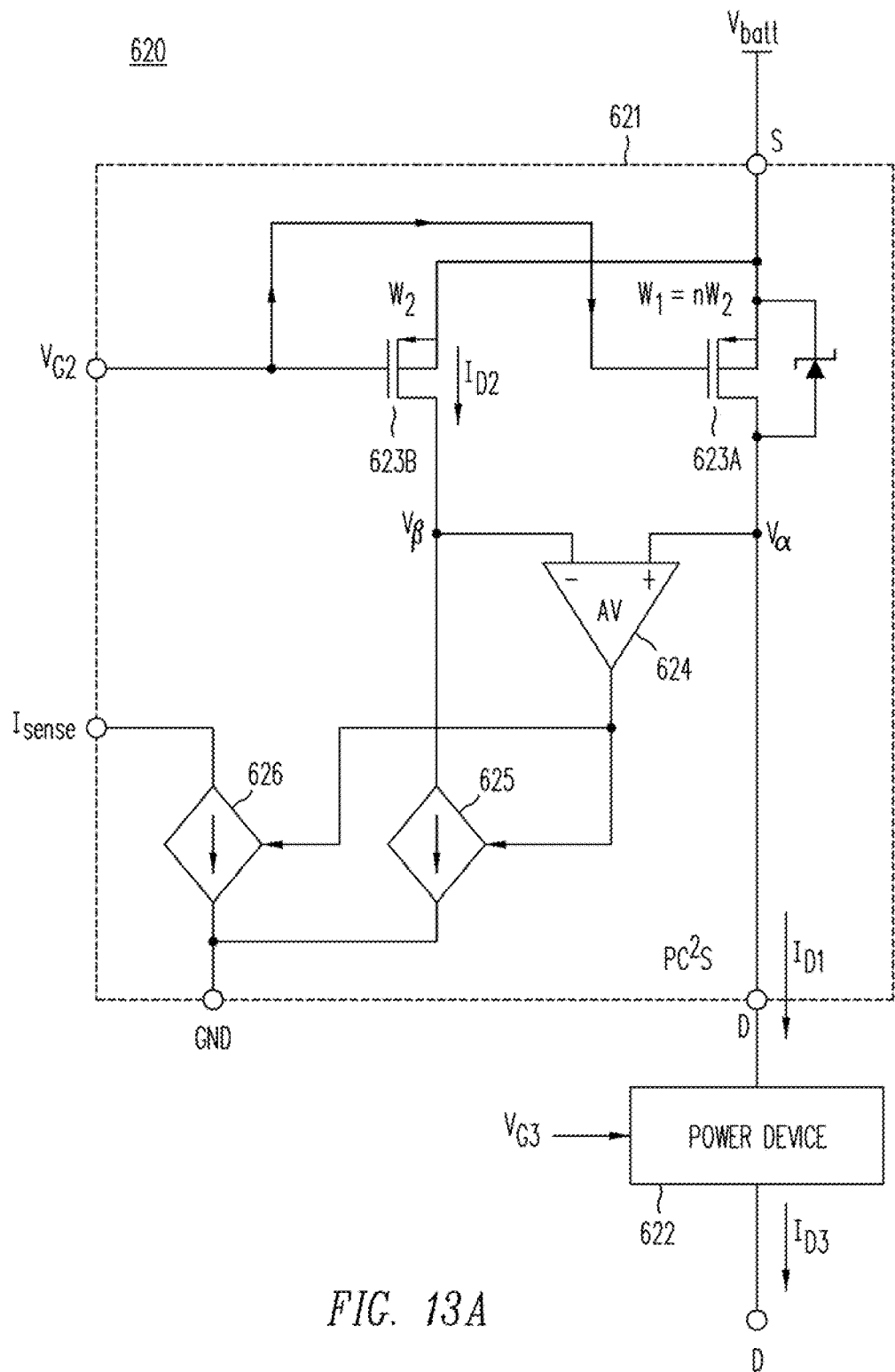
FIG. 13A is a functional circuit diagram of a P-channel high-side cascode current sensor using dependent current sources.

P-channel Cascode Current Sense MOSFET: P-channel MOSFETs are also frequently used as high-side switches. A cascode current sensor can be used with P-channel MOSFETs as well as N-channel MOSFETs. In circuit 620 of FIG. 13A, a gated power device 622 is monitored by a P-channel cascode current sensor (PC²S) 621 comprising a low-resistance main MOSFET 623A with gate width, a sense MOSFET 623B with gate width $W_2$ (where $W_1=n \cdot W_2$), and a dependent current source 625 controlled by operational amplifier 624. Even though cascode current sensor 621 is P-channel, power device 622 may be N-channel or P-channel as long as its gate drive voltage $V_{G3}$ is adjusted accordingly.

The internal operation of the P-channel cascode current sensor 621 is similar to its N-channel counterpart. Thus, an operational amplifier 624 dynamically adjusts the current $I_{D2}$ in a dependent current source 625 so that $V_\alpha = V_\beta$. Under the equipotential drain condition $V_\alpha = V_\beta$, the currents in main MOSFET 623A and sense MOSFET 623B, respectively, scale with the respective gate widths W of these devices, so that $I_{D2} \approx I_{D1}/n$. A dependent current source 626 provides an output signal $I_{sense}$ as a fixed multiple of the current $I_{D2}$ provided by dependent current source 625, typically where $I_{sense} = I_{D2}$. Since the current $I_{D3}$ in power device 622 is the same as drain current $I_{D1}$ in PC²S 621, then combining terms $I_{sense} \approx I_{D3}/n$.

Figure 13B:
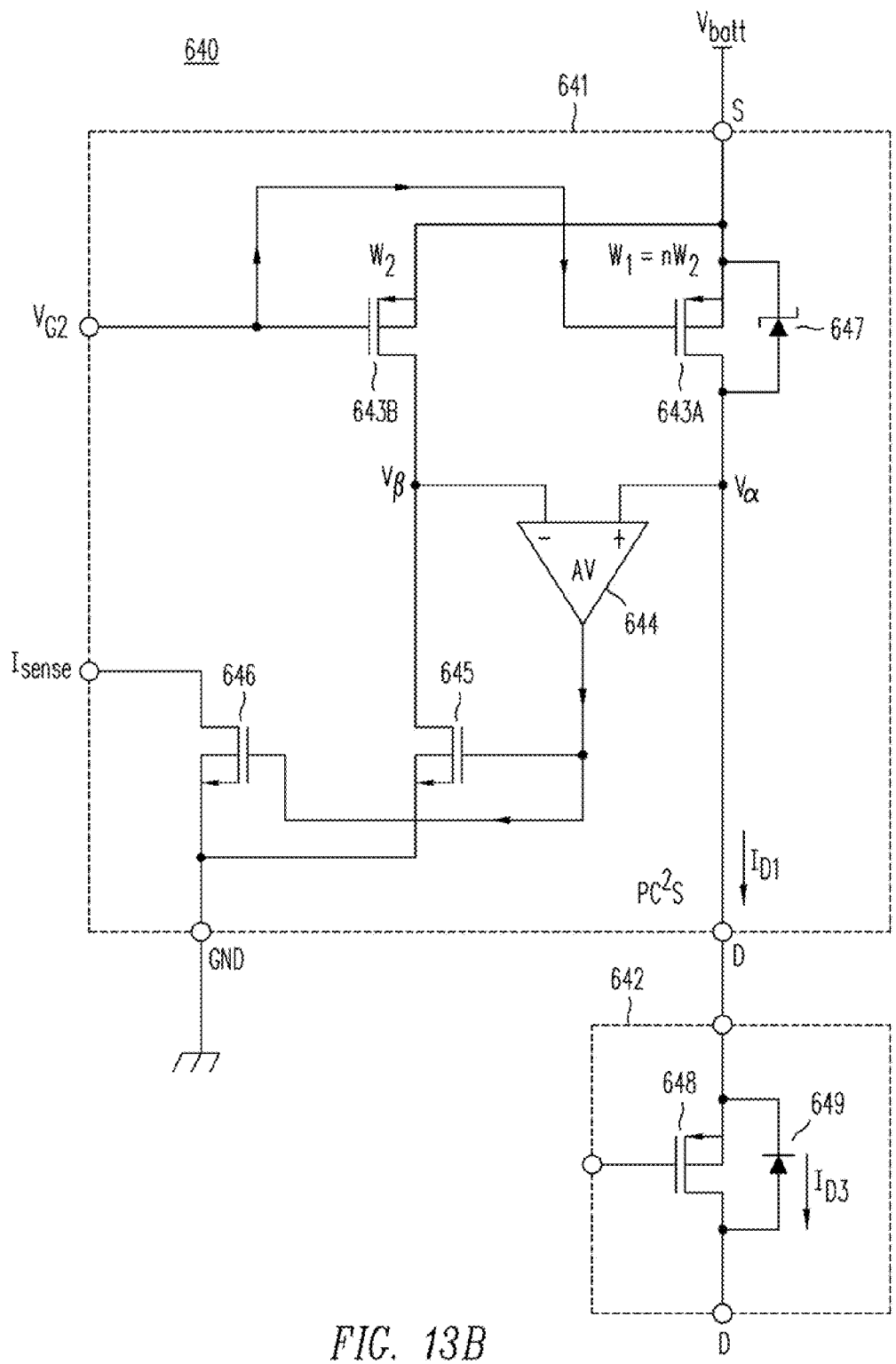
FIG. 13B is a circuit diagram of the current sensor using a current mirror.

One implementation of PC²S 621 and power device 622 is illustrated in circuit diagram 640 of FIG. 13B where dependent current sources 625 and 626 are implemented as a current mirror comprising N-channel MOSFETs 645 and 646 and power device 622 is implemented as a P-channel power MOSFET 648. Since MOSFET 648 is a high-side MOSFET, diodes 647 and 649 remain reversed biased during normal operation.

Figure 14A:
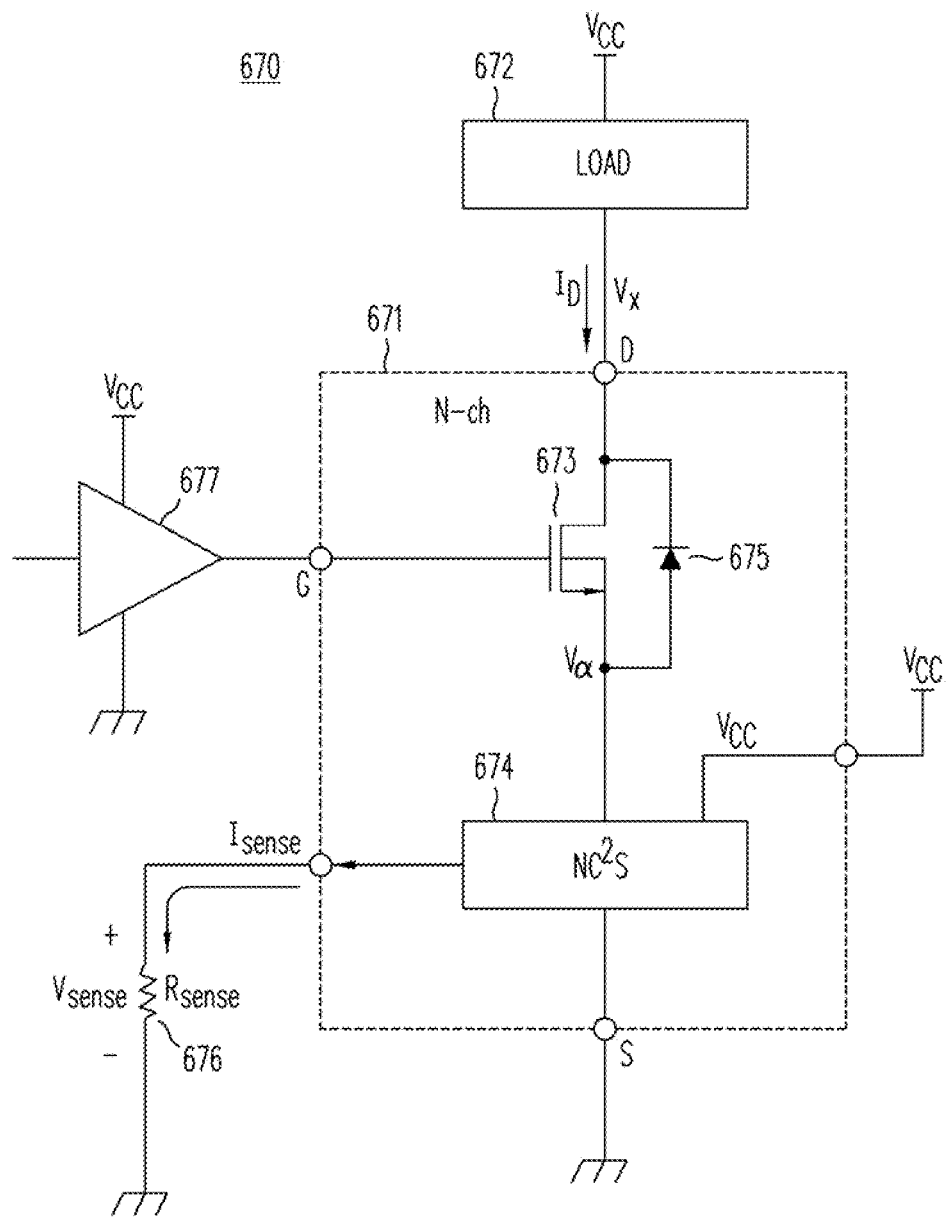
FIGS. 14A-14C are circuit diagrams showing generalized low-voltage cascode current sensor topologies, including low-side N-channel (FIG. 14A), high-side P-channel (FIG. 14B) and totem-pole push-pull with bootstrap (FIG. 14C).

Switch-Load Topology with Cascode-Current-Sensing: Combining P-channel and N-channel cascode-current-sensors with various power devices, accurate current sensing can be facilitated in a large number and variety of switch-load topologies FIG. 14A illustrates an example of a common-source-configured low-side cascode-current-sensing N-channel MOSFET switch 671 driven by a gate buffer 677 and controlling a $V_{cc}$-connected load 672. A high voltage or vertical DMOS device 673 is monitored by an NC²S circuit 674. NC²S circuit 674, powered by supply voltage $V_{cc}$ and connected to ground, generates a current sense output $I_{sense}$ proportional to a drain and load current $I_D$, which can optionally be converted into a voltage sense signal $V_{sense}$ using a resistor 676 having resistance $R_{sense}$. In this topology, an intrinsic P-N diode 675 in parallel with MOSFET 673 remains reverse-biased at all times. In the event that load 672 is inductive, diode 675 will be driven into avalanche breakdown and NC²S circuit 674 will monitor the avalanche current unless the avalanche current is shunted from switch 671, for example by placing another P-N diode in parallel with MOSFET switch 671, with its cathode connected to the drain of switch 671, i.e. to $V_x$, and its anode to the grounded source of switch 671.

Figure 14B:
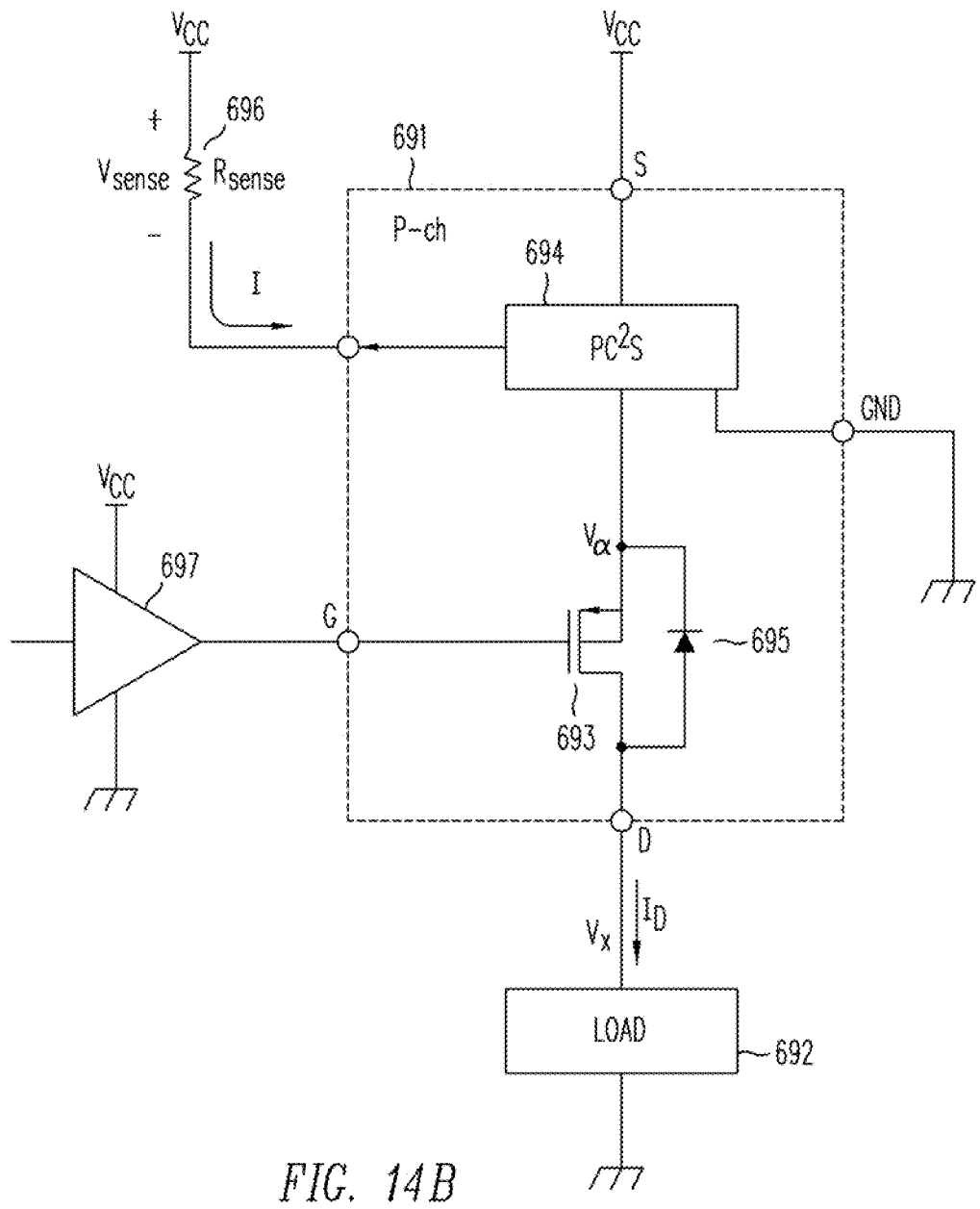

FIG. 14B illustrates an example of a common-source-configured high-side cascode-current-sensing P-channel MOSFET switch 691 driven by gate buffer 697 and controlling a ground-connected load 692. A high-voltage or vertical DMOS device 693 is monitored by a PC²S 694. PC²S 694, powered by supply voltage $V_{cc}$ and also requiring a ground connection, sinks a current sense output $I_{sense}$ proportional to drain and load current $I_D$, which can optionally be converted into a voltage sense signal $V_{sense}$ using a resistor 696 having resistance $R_{sense}$. In this topology, an intrinsic P-N diode 695 in parallel to MOSFET 693 remains reverse-biased at all times. In the event that load 692 is inductive, diode 695 will be driven into avalanche breakdown, and PC²S 694 will monitor the avalanche current unless the avalanche current is shunted from switch 691, for example by placing another P-N diode in parallel with switch 691, with its cathode connected to the source terminal of switch 691, i.e. to $V_{cc}$, and its anode to its $V_x$-connected drain terminal of switch 691.

Figure 14C:
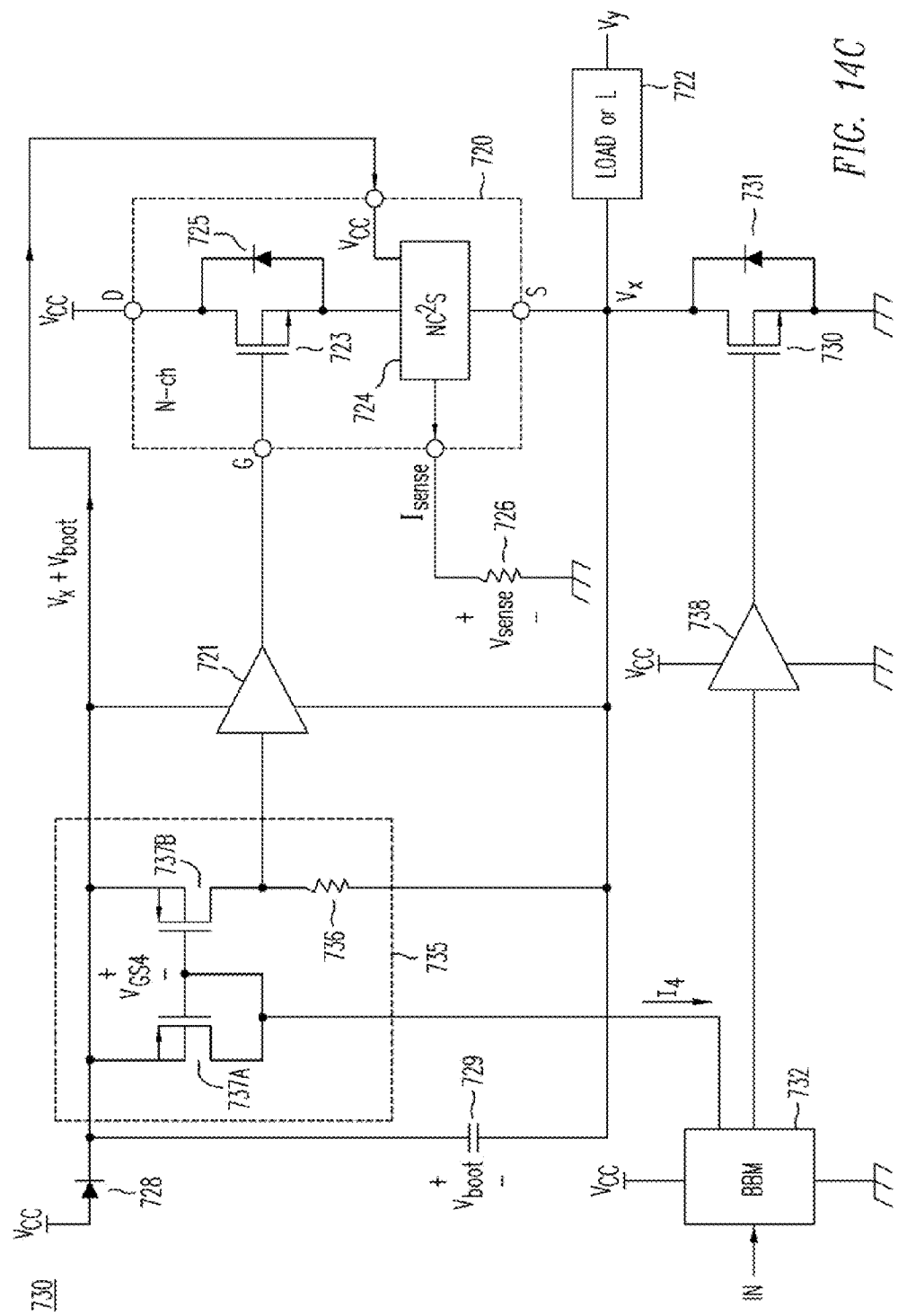

FIG. 14C illustrates an example of a totem-pole N-channel push-pull output controlling a load 722 with a potential $V_x$. The potential $V_y$ on the other terminal of load 722 may be ground, $V_{cc}$, the output of another half-bridge, or some other bias circuit. The push-pull driver or "half-bridge" comprises a low-side common-source N-channel MOSFET 731 and a high-side source-follower N-channel MOSFET 723 with a high-side cascode current sensor 724. Together MOSFET 723 and current sensor 724 are contained within a current-monitored switch 720. A break-before-make circuit 732 drives a low-side gate buffer 738 and high-side gate buffer 721 out of phase with non-overlapping timing to prevent shoot-through conduction between high-side and low-side MOSFETs 723 and 730.

The output of low-side gate buffer 738 drives the gate of N-channel MOSFET 730. The gate of high-side MOSFET 723 is driven through a floating gate buffer 721 and a level-shift circuit 735 whose negative supply terminals are referenced to $V_x$, the source terminal of current monitored switch 720. Level-shift circuit 735 can be implemented in a number of ways. In the example shown, P-channel MOSFETs 737A and 737B form a current mirror with threshold-connected MOSFET 737A driving P-channel MOSFET 737B, which in turn drives the input of buffer 721. Whenever the current $I_4$ through MOSFET 737A is zero, the gate voltage $V_{GS4}$ of MOSFET 737B is zero and P-channel MOSFET 7378 is off. Resistor 736 then biases the input of buffer 721 to $V_x$ and N-channel MOSFET 723 is off. When $I_4$ is flowing, the current is mirrored into P-channel 737B pulling up on the input to buffer 721 and turning on high-side N-channel MOSFET 723.

Gate buffer 721 and level shift circuit 735 are powered from bootstrap capacitor 729 which floats on top of the $V_x$ output voltage. Bootstrap power is supplied to the floating high side in two phases. Whenever low-side MOSFET 730 is on and $V_x$ is near or below ground, bootstrap diode 728 charges the bootstrap capacitor 729 to a voltage $V_{boot} \approx V_{cc}$. Turning on high-side MOSFET 723 pulls $V_x$ up to the supply rail $V_{cc}$. Since the charge on a capacitor cannot change instantly, the positive terminal of bootstrap capacitor 729 jumps to a voltage $(V_x + V_{boot}) \rightarrow 2V_{cc}$, twice the input voltage. The bootstrap capacitor 729 therefore supplies a voltage of approximately $V_{cc}$ to level shift circuit 735, gate buffer 727 and to NC²S bias circuit 724 independent of the $V_x$ output voltage.

The current through high voltage or vertical MOSFET 723 is monitored by NC²S circuit 724. NC²S circuit 724, powered by the floating bootstrap supply, sources an output current $I_{sense}$ proportional to drain and load current $I_D$ which can optionally be converted into a voltage sense signal $V_{sense}$ using a resistor 726 having resistance $R_{sense}$. In this topology, intrinsic P-N diode 725 in parallel with MOSFET 723 remains reverse-biased at all times. In the event that load 722 is inductive, interrupting the current through diode 725 will force $V_x$ negative and forward-bias low-side diode 731, storing charge in the P-N junction of diode 731 while high-side MOSFET 723 is off.

Turning on high side MOSFET 723 while diode 731 remains charged results in forced diode recovery in diode 731. During forced diode recovery, diode 731 conducts current into its cathode, i.e. in reverse direction, until the stored charge dissipates. During this transient, high-side MOSFET 723 must supply both the current into the inductive load 722 and the reverse-recovery current though diode 731. NC²S circuit 724 measures the sum of these two currents.

The $I_{sense}$ output of NC²S circuit 724 is limited to the breakdown voltage of the sensor's current mirror transistors. The level-shifted gate signal $I_4$ is similarly limited by the MOSFET within BBM circuit 732. To adapt NC²S circuit 724 for use in high-voltage high-side or push pull applications, special high-voltage level shift techniques must be employed.

High-Voltage Devices with Cascode Current Sensing: Adapting cascode current sensing for high voltage high side operation must address two major issues, level-shifting the gate drive signal from ground-referenced low-voltage to floating high-voltages, and level-shifting the current sense information from floating high-voltage to ground-referenced low-voltages.

Figure 15A:
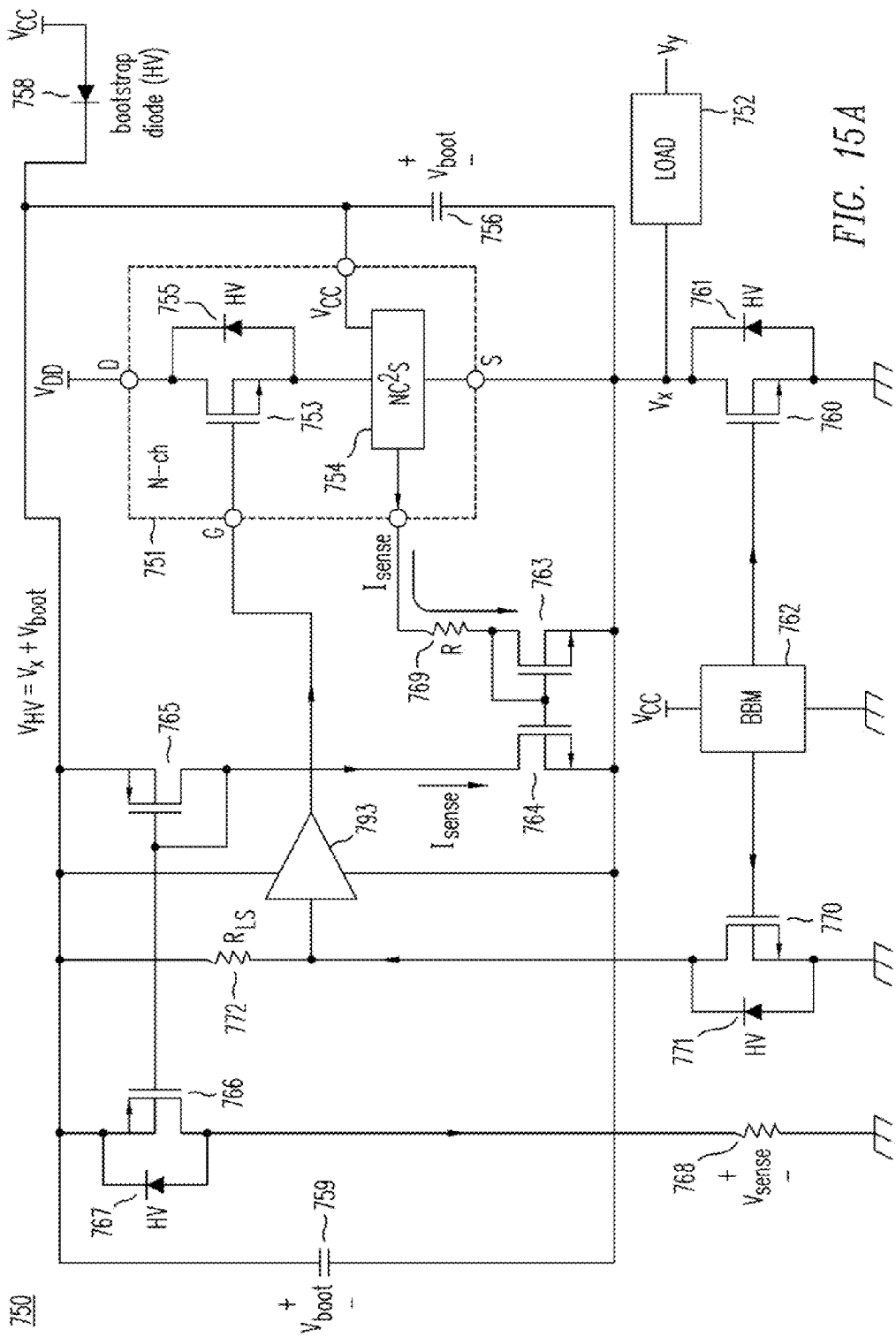
FIG. 15A is a circuit diagram of a cascode current sensor in a high-voltage totem-pole topology containing a level shifter.

An example of a high-voltage half-bridge with high-side cascode-current-sensing is shown in FIG. 15A. As in the prior circuit, circuit 750 includes a load 752, a low-side N-channel MOSFET 760, a current-monitored switch 751 comprising an N-channel MOSFET 753 and NC²S circuit 754, a bootstrap capacitor 759, a bootstrap diode 758, and a low-voltage break-before-make circuit 762. In this case, however, MOSFET 753 with integral diode 755 and MOSFET 760 with integral diode 761 are all rated for high-voltage operation, e.g. at 30V, 60V or 500V, and are powered not by low-voltage supply $V_{cc}$ but by a high-voltage input $V_{DD}$. NC²S circuit 754 uses only low-voltage components, but must float on top of the high voltage inductor node $V_x$.

Gate drive to the gate of N-channel MOSFET 753 is supplied by a floating gate buffer 773, driven by a level-shifted output from BBM circuit 762. At high voltages, simple resistive level shifting is often the most reliable method, comprising a high-voltage low-current N-channel MOSFET 770, driven by BBM circuit 762, and a resistor 772 connected to $V_{HV}$, the floating bootstrap bias supply equal to $(V_{boot}+V_x)$ and having a maximum voltage of $(V_{DD}+V_{cc})$. So while high-side and low-side power MOSFETs 751 and 760 must block the high-voltage input $V_{DD}$, level shifting MOSFET 771 must withstand a high voltage $(V_{DD}+V_{cc})$.

Level shifting the current sensing information down from the high-side is slightly more complex. The main and sense transistors within NC²S circuit 754 cannot be high voltage or their area will be prohibitive and their on-resistance unacceptably high. The level shifting of the signal can however be converted from floating low-voltage devices to high voltage MOSFETs with minimal complications. This method is illustrated in circuit 750, where the source-type $I_{sense}$ output of NC²S circuit 754 is fed into a resistor 769 and a current mirror comprising low-voltage floating N-channel MOSFETs 763 and 764 referenced to the floating $V_x$ potential.

The current $I_{sense}$, or a multiple thereof, is then mirrored into the drain of N-channel MOSFET 364 which biases a threshold-connected P-channel MOSFET 765 which in turn drives high-voltage P-channel 766 with parallel diode 767 in a current mirror configured circuit. Even though MOSFET 765 is not subjected to high voltages, for good matching MOSFET 765 should use the same mask layout as high-voltage MOSFET 766. High voltage P-channel MOSFET 766 and diode 767 are subjected to operation at the highest circuit voltage $V_{HV}$ having a magnitude $(V_{DD}+V_{cc})$. Operating in saturation, MOSFET 766 supplies a current $I_{sense}$, or a multiple thereof to a resistor 768 to create a low-voltage ground-referenced sense signal $V_{sense}$.

Figure 15B:
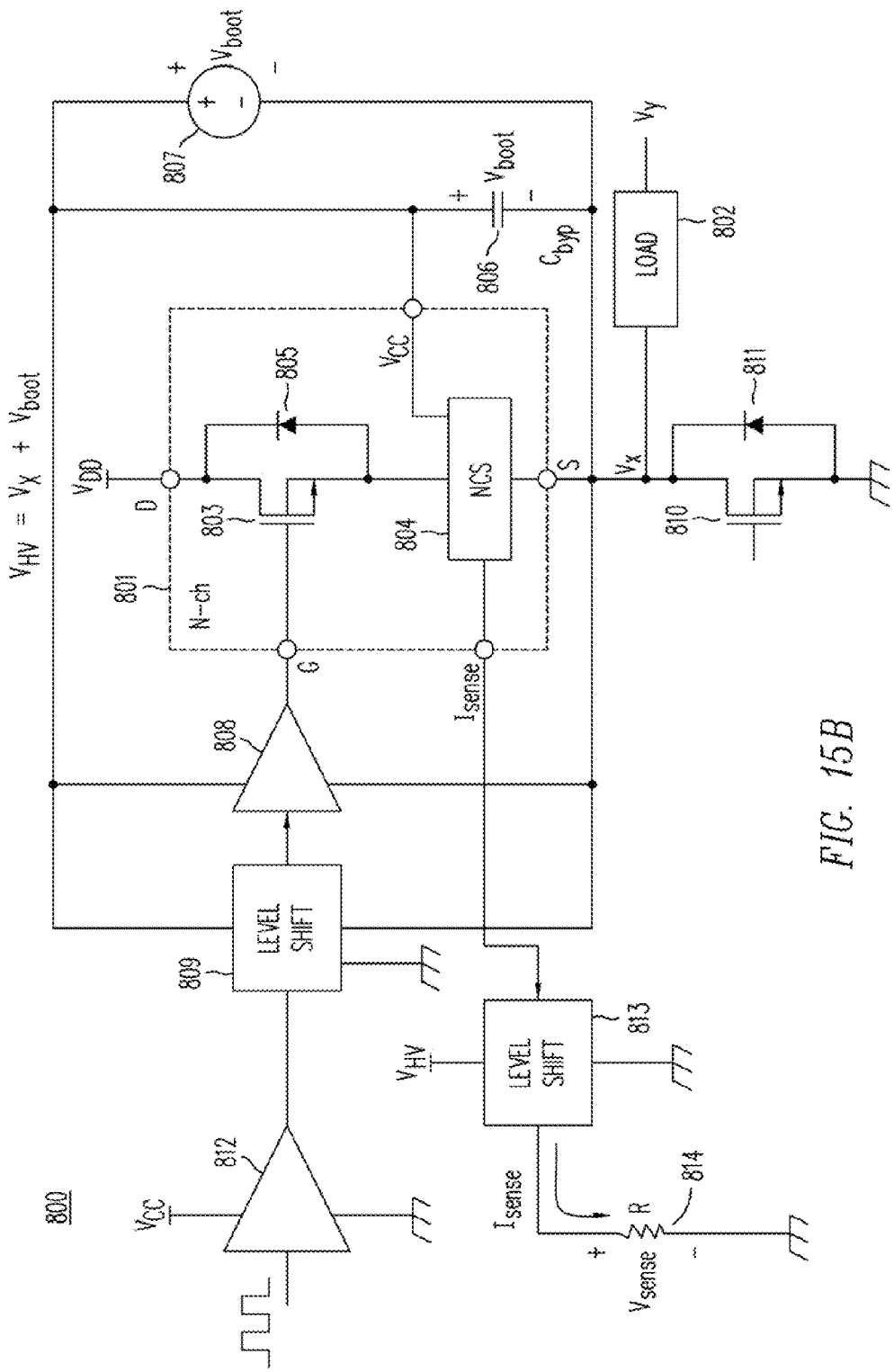
FIG. 15B is a functional circuit diagram of the device shown in FIG. 15A.

Circuit 800 in FIG. 15B represents a simplified version of the circuit 750, where the output of a low-voltage gate buffer 812 is level-shifted by a circuit 809 to drive a low-voltage gate buffer 808 floating to a high voltage $V_{HV}$ equal to in the worst case the sum of high voltage input $V_{DD}$ and low-voltage input $V_{cc}$. The floating but low-voltage $I_{sense}$ output is level-shifted down to a low voltage present across a grounded resistor 814 by a level-shift circuit 813. Both level-shift circuits 809 and 813 must include devices capable of operating reliably at a voltage $V_{HV}$, the sum of $(V_{DD}+V_{cc})$.

Whether the high voltage level shift circuitry is to be integrated into the cascode current sense IC, into a high voltage controller IC, or implemented discretely depends on the target application and market. Some examples of high-voltage devices which can benefit from low-voltage precision current sensing are illustrated in FIGS. 16A-16L.

Figure 16A:
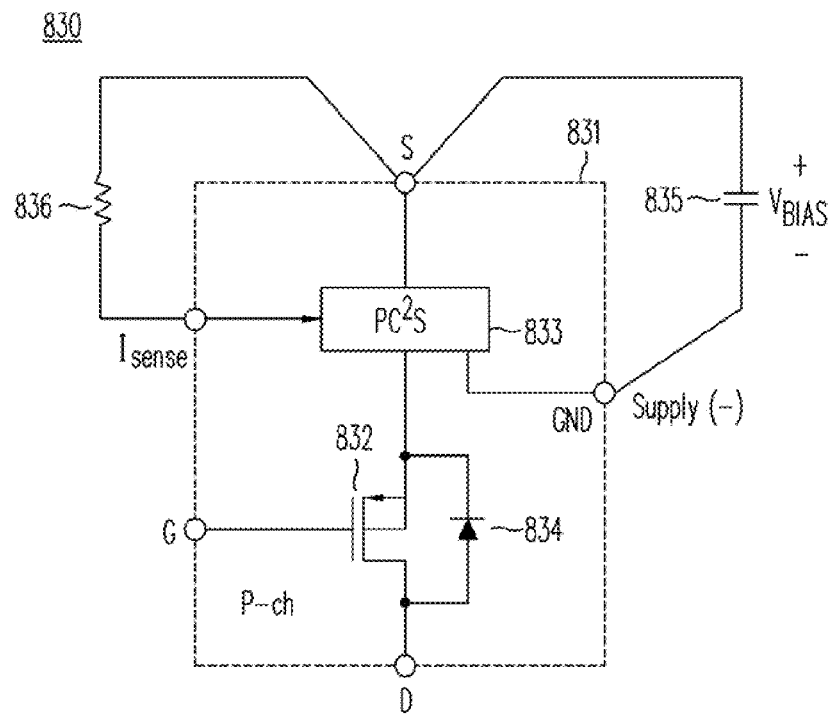
FIG. 16A-16L are circuit diagrams illustrating cascode current sensing of discrete power devices, including a P-channel MOSFET (FIG. 16A), an N-channel MOSFET (FIG. 16B), a P-channel IGBT (FIG. 16C), an N-channel IGBT (FIG. 16D), an N-channel JFET or SIT (FIG. 16E), an SCR or GTO thyristor (FIG. 16F), a generic high power device with parallel diode and PCS (FIG. 16G), a generic high power device with parallel diode and NCS (FIG. 16H), a generic high power device with bypass diode and PCS (FIG. 16I), a generic high power device with bypass diode and NCS (FIG. 16J), a P-N or P-I-N diode with NCS (FIG. 16K) and a Schottky diode with NCS (FIG. 16L).
Figure 16B:
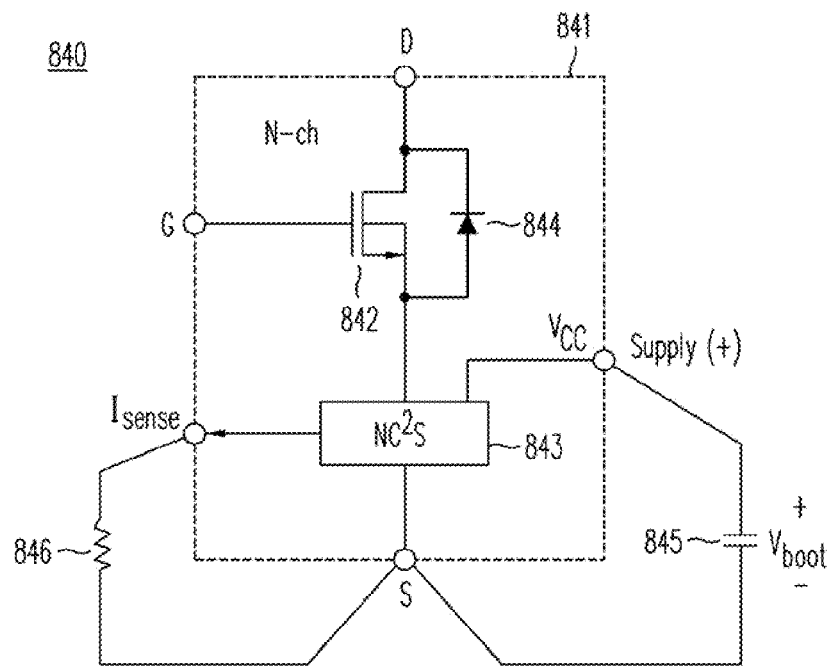

FIGS. 16A and 16B illustrate high-voltage P-channel and N-channel current-monitored MOSFET switches 831 and 841 with current sensing circuitry formed in accordance with this invention. The devices combine the disclosed cascode-current-sense technique with a high voltage MOSFET, planar DMOS, trench DMOS, super-junction DMOS or any high voltage MOSFET with lateral or vertical current flow.

Specifically, in FIG. 16A, a P-channel MOSFET 832 with a parallel diode 834 is biased in series with a PC²S circuit 833 to form cascode-current-sensed P-channel power MOSFET switch 831 having gate, source, and drain terminals, a negative supply connection to power its internal bias circuitry, and an $I_{sense}$ sink-type current sense output. A low-voltage $V_{BIAS}$ power supply and filter capacitor 835 has its positive side connected to the source S of switch 831 and its negative side connected to the Supply (−) pin. Similarly, PC²S circuit 833 sinks current from a resistor 836 also connected to the source pin of P-channel switch 831.

Conversely, in FIG. 16B, an N-channel MOSFET 842 with parallel diode 844 is biased in series with an NC²S circuit 843 to form cascode-current-sensed N-channel power MOSFET switch 841 having gate, source, and drain terminals, a positive supply connection to power its internal bias circuitry, and an $I_{sense}$ source-type current sense output. A low-voltage $V_{boot}$ power supply and filter capacitor 845 has its negative side connected to the source S of switch 841 and its positive side connected to the Supply (+) pin. Similarly, NC²S sense circuit 843 sources current into a resistor 846 also connected to the source pin of N-channel switch 831.

Figure 16C:
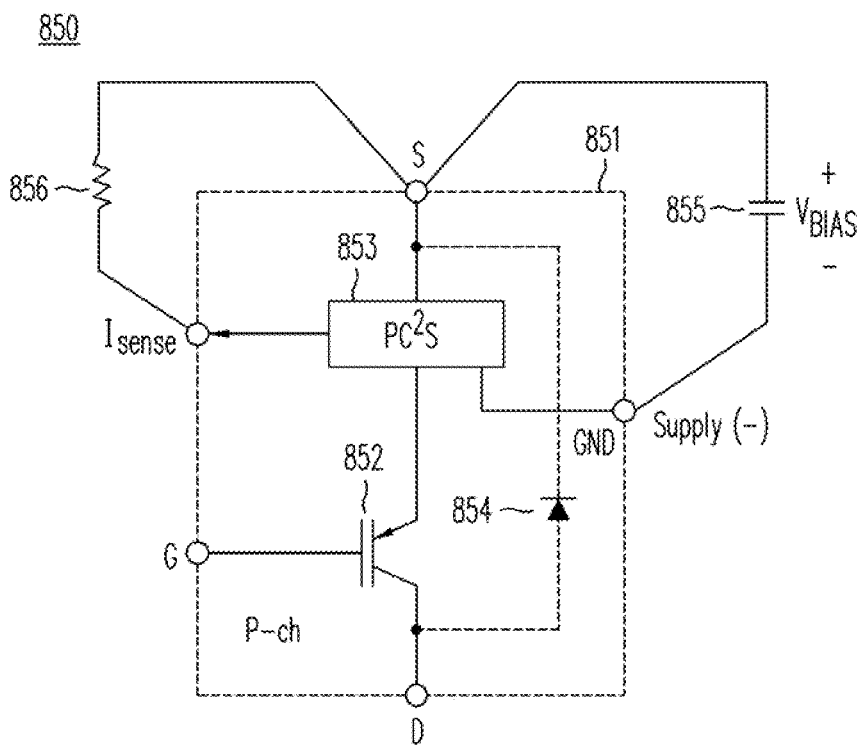
Figure 16D:
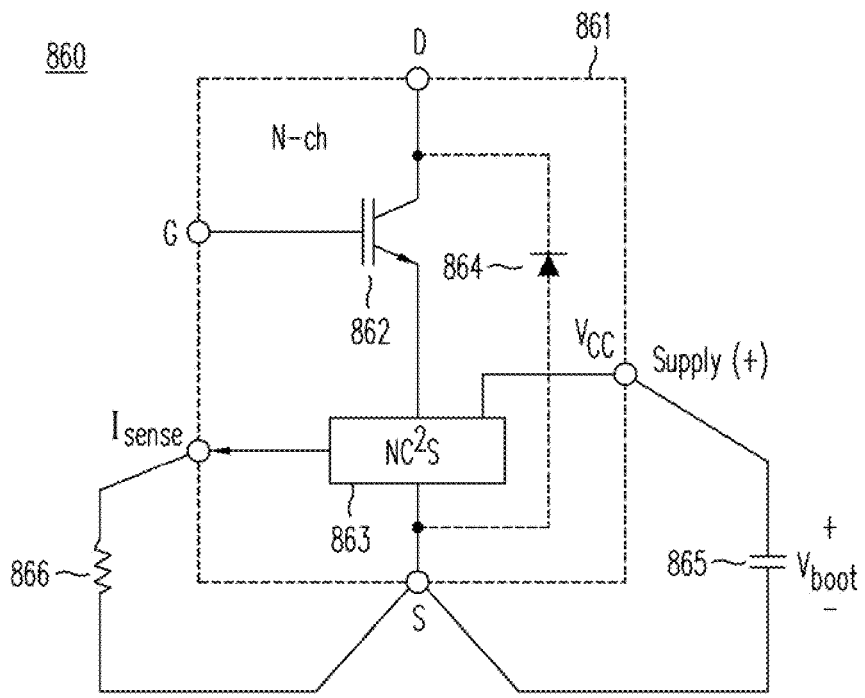

FIGS. 16C and 16D illustrate high-voltage P-channel and N-channel IGBT switches 851 and 861 with current sensing formed in accordance with this invention. The device combines the disclosed cascode current sense technique with a high voltage insulated gate bipolar transistor constructed using a vertical planar DMOS, trench DMOS, or super-junction DMOS or any high-voltage IGBT process with either lateral or vertical current flow.

Specifically, in FIG. 16C, a P-channel IGBT 852 is biased in series with a PC²S circuit 853 to form cascode-current-sensed P-channel power IGBT switch 851 having gate, source, and drain terminals, a negative supply connection to power its internal bias circuitry, and an $I_{sense}$ sink-type current sense output. A low-voltage $V_{BIAS}$ power supply and filter capacitor 855 has its positive side connected to the source S of IGBT switch 851 and its negative side connected to the Supply (−) pin. Similarly, PC²S circuit 853 sinks current from a resistor 856 also connected to the source pin of P-channel IGBT switch 851. An optional P-N diode 854, shunting the source- and drain-terminals of IGBT switch 851, is not formed as a direct consequence of the manufacture of IGBT switch 851. Because diode 854 shunts the current through PC²S circuit 853, the current though diode 854 is not monitored.

Referring to FIG. 16D, an N-channel IGBT 862 is biased in series with an NC²S circuit 863 to form cascode-current-sensed N-channel power IGBT switch 861 having gate, source, and drain terminals, a positive supply connection to power its internal bias circuitry, and an $I_{sense}$ source-type current sense output. A low-voltage $V_{boot}$ power supply and filter capacitor 865 has its negative side connected to the source S of switch 861 and its positive side connected to the Supply (+) pin. Similarly, NC²S circuit 863 sources current into resistor 866 also connected to the source pin of N-channel IGBT switch 861. An optional P-N diode 864, shunting the source- and drain-terminals of switch 861, is not formed as a direct consequence of the manufacture of IGBT switch 861. Because diode 864 shunts the current through NC²S circuit 863, the current through diode 864 is not monitored.

Figure 16E:
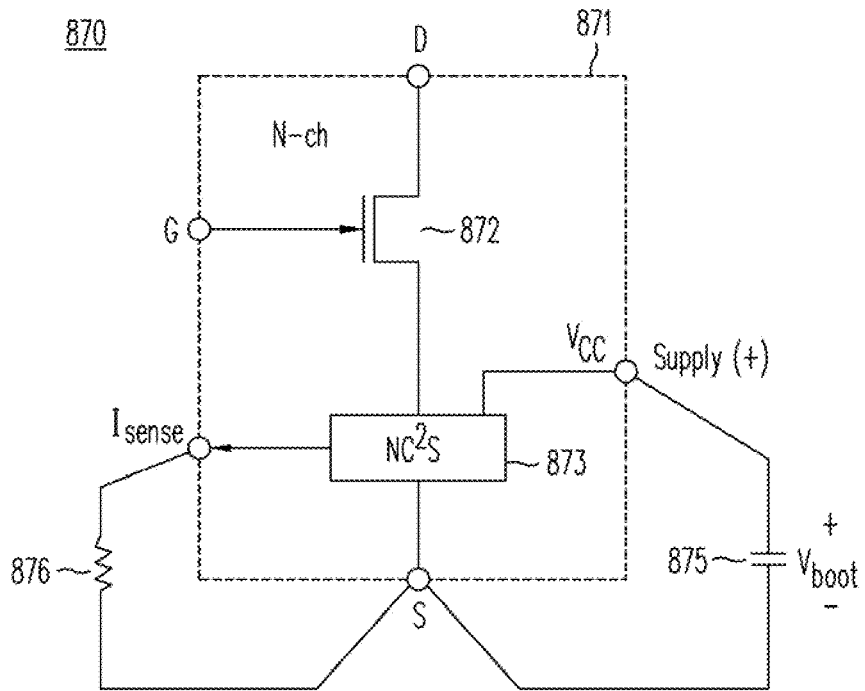

FIG. 16E illustrates a high-voltage JFET, static induction transistor, or MESFET with current sensing formed in accordance with this invention. An N-channel FET 872 is biased in series with an NC²S circuit 873 to form a cascode-current-sensed N-channel FET switch 871 having gate, source, and drain terminals, a positive supply connection to power its internal bias circuitry, and an $I_{sense}$ source-type current sense output. A low-voltage $V_{boot}$ power supply and filter capacitor 875 has its negative side connected to the source S of switch 871 and its positive side connected to the Supply (+) pin. Similarly, NC²S circuit 873 sources current into resistor 876 also connected to the source pin of N-channel switch 871. No P-N diode or rectifier is included in the device as shown but may be added across N-channel FET 872, or across the source and drain terminals of the entire switch 871.

Figure 16F:
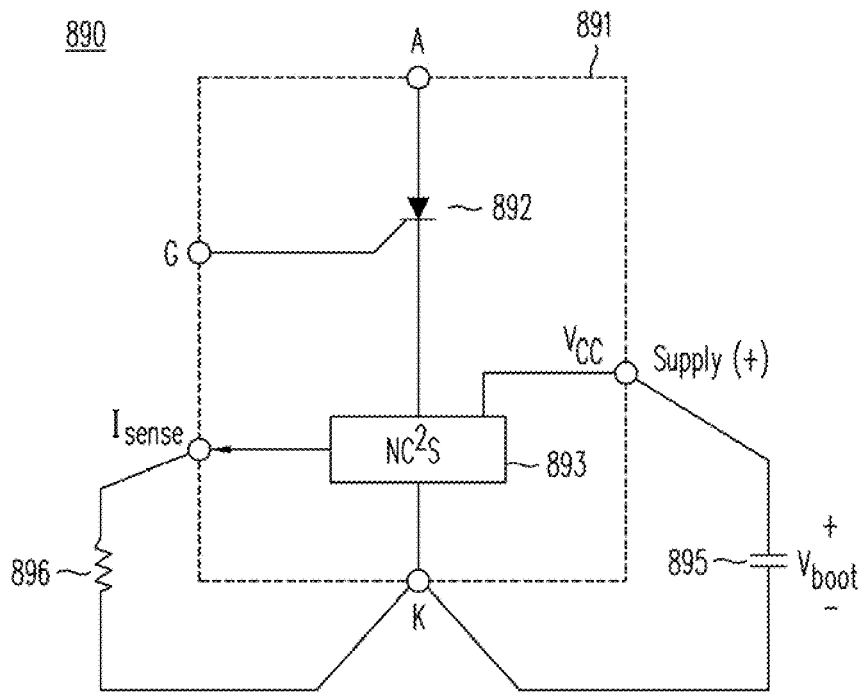

FIG. 16F illustrates a high-voltage thyristor, silicon controlled rectifier or SCR, thyristor or gate-turn-off, i.e. GTO, thyristor or other four layer PNPN devices with current sensing formed in accordance with this invention. Thyristor 892 is biased in series with an NC²S circuit 893 to form a cascode-current-sensed PNPN thyristor switch 891 having gate, anode, and cathode terminals, a positive supply connection to power its internal bias circuitry, and an $I_{sense}$ source-type current sense output. A low-voltage $V_{boot}$ power supply and filter capacitor 895 has its negative side connected to the cathode K of switch 891 and its positive side connected to the Supply (+) pin. Similarly, NC²S circuit 893 sources current into resistor 896 also connected to the cathode pin of four layer switch 891.

No P-N diode or rectifier is included in the device as shown but may be added across thyristor 892, or across the source and drain terminals of the entire switch 891. Unlike the MOSFET and IGBT switches, the gate G of thyristor switch 891 can trigger four layer thyristor 892 but cannot shut off the device once conducting except by commutating the device during an AC zero crossing.

Figure 16G:
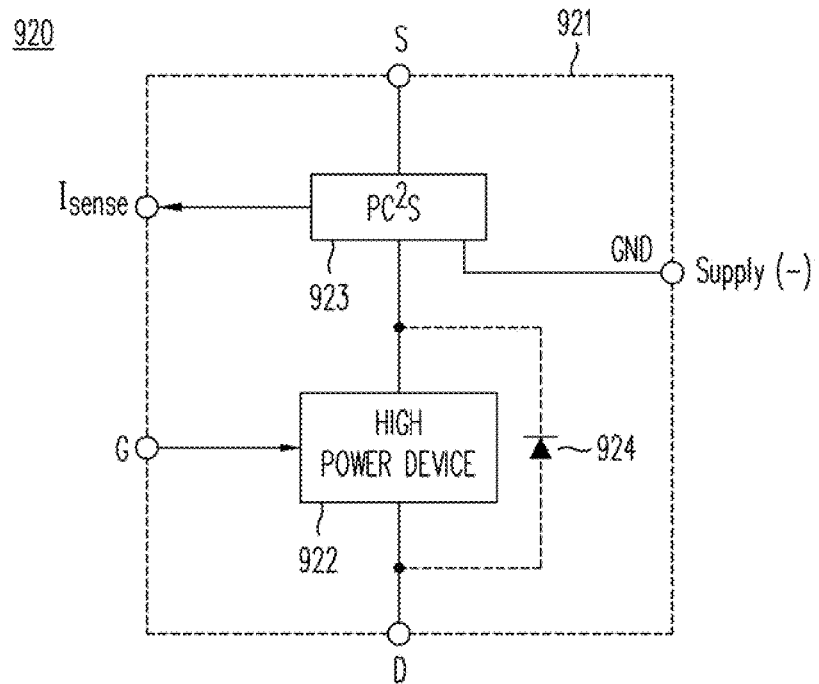
Figure 16H:
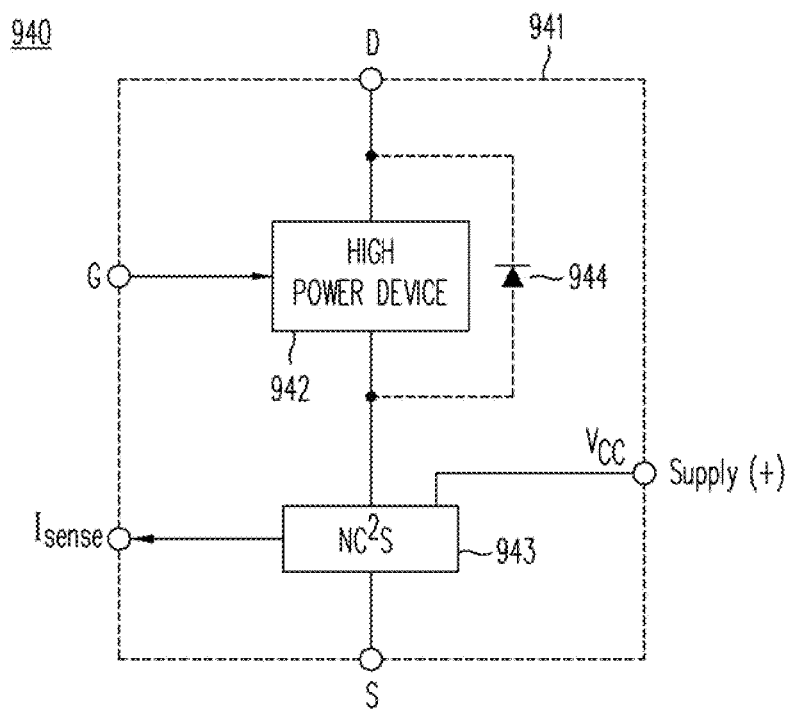

FIGS. 16G through 16J consider diode shunting in cascode-current-sensed high power devices. In FIGS. 16G and 16H, for example, high power devices 922 and 942, shunted by rectifier diodes 924 and 944, respectively, operate in series with PC²S circuit 923 in device 921 or in series with NC²S circuit 943 in device 941. In these configurations, the cascode current sense circuits 923 and 943 measure the operating currents in the power devices 921 and 941 as well as the avalanche currents in the diodes 924 and 944.

As shown, it does not measure forward biased current, e.g. during synchronous rectifier operation. Reversing, i.e. swapping, the relative position of power device 922 and PC²S circuit 923 will accommodate quadrant III operation for forward biased diode conduction and synchronous rectification using P-type current sensing. Similarly swapping high power device 942 with NC²S circuit 943 will accommodate quadrant III operation for forward biased diode conduction and synchronous rectification using N-type current sensing.

Figure 16I:
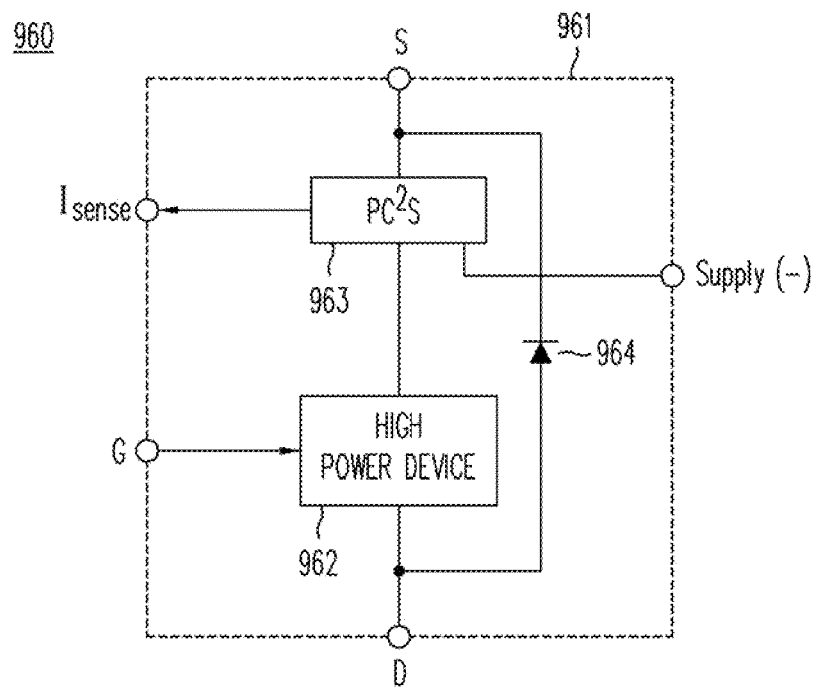
Figure 16J:
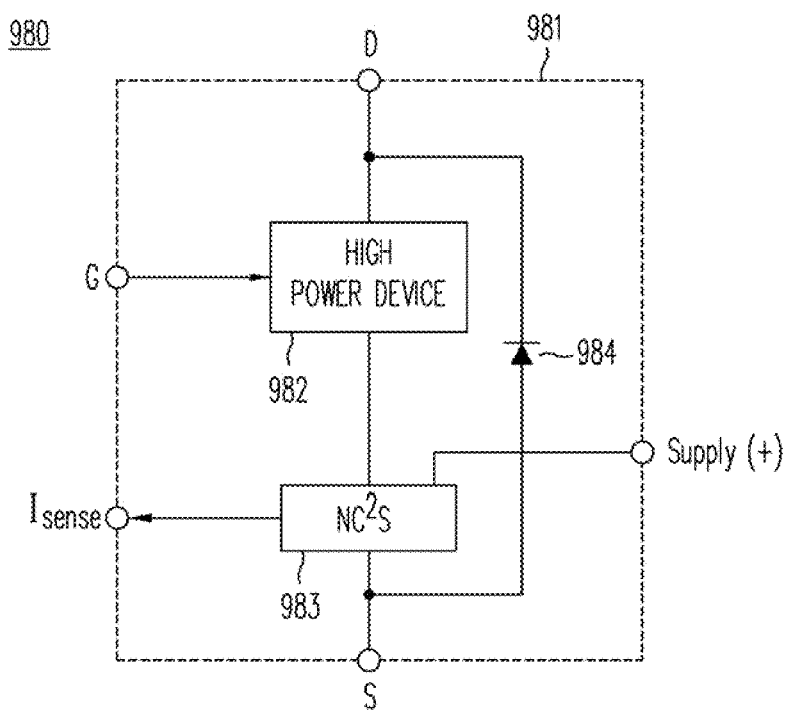

In FIG. 16I, a diode or rectifier 964 has been placed in parallel across an entire P-channel device 961, thereby shunting both the high power device 962 and the PC²S circuit 963. As a consequence of this shunt, PC²S circuit 963 cannot measure any current through diode 964. In FIG. 16J, a diode or rectifier 984 has been placed in parallel across an entire N-channel device 981, thereby shunting both the high power device 982 and the PC²S circuit 983. As a consequence of this shunt, NC²S circuit 983 cannot measure any current through diode 984.

Figure 16K:
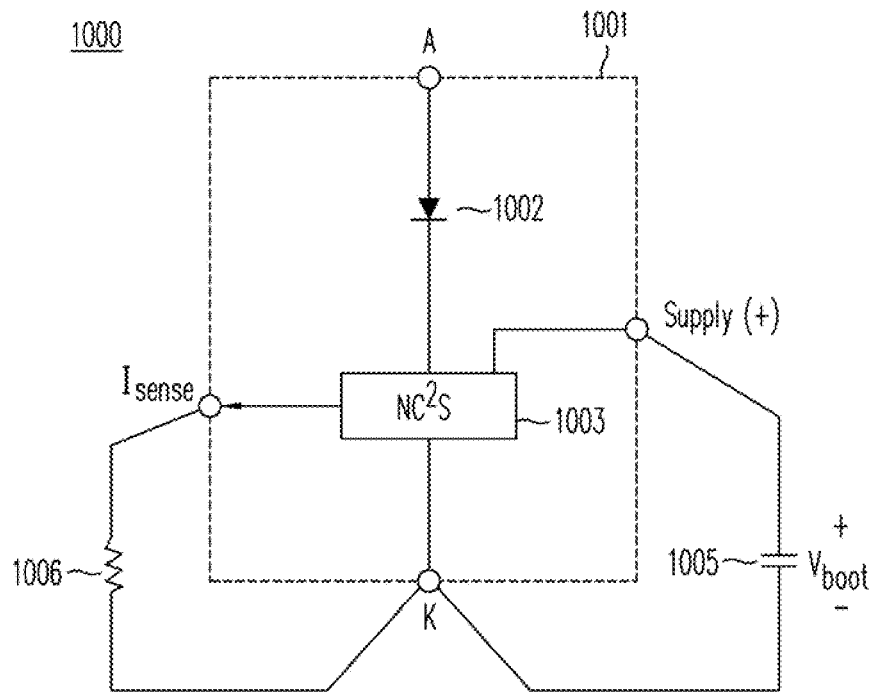
Figure 16L:
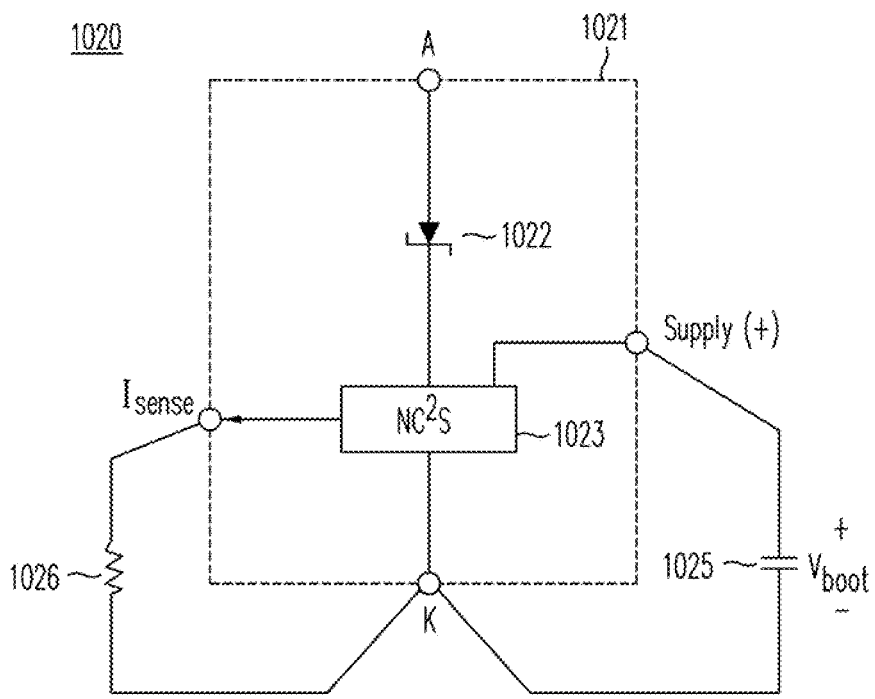

The cascode current sense method works equally well for monitoring the current in a P-N rectifier or Schottky diode. As shown in FIGS. 16K and 16L, NC²S circuits 1003 and 1023, respectively, facilitate direct monitoring of the current in a P-N diode 1002 or a Schottky diode 1022, but a bootstrap or bias supply $V_{boot}$ is required between the Supply (+) pins and the cathodes of diodes 1002 and 1022. The $I_{sense}$ output can source current to the more negative potential cathode with intervening resistors 1006 and 1026, respectively.

Note that while a P-channel cascode current sensor, or PC²S, is convenient for monitoring P-channel power MOSFETs or IGBT's, it may also be used in conjunction with N-channel devices. But since a PC²S requires a larger die size than an NC²S of equal resistance, a PC²S is particularly suitable when the power device is also a P-channel, making level-shifting and gate drive convenient. If the high-power high-side device is a gated, i.e. three terminal, N-channel device, it requires some means by which to drive its gate above the positive $V_{DD}$ supply rail, either by using a floating bootstrap gate drive, as described herein, or an alternative approach such a charge pump or second regulated supply rail. If such a high-voltage gate bias supply is available, it is convenient to use it to power an NC²S and thereby save die area and cost.

Alternatively an N-channel cascode current sense or NC²S, normally used for N-channel MOSFETs, may be used in conjunction with P-channel MOSFETs, but has differing gate drive requirements to operate.

In conclusion, the cascode current sense described herein provides a method and means for accurately sensing current in a large variety of power devices—devices where accurate current sensing was previously unavailable, difficult to implement, or noise sensitive. Its utility is especially valuable in large-area vertical discrete power devices such as vertical DMOS transistors, IGBT's, thyristors, and diodes.

Construction of Cascode Current Sensors: One key design consideration in the high current cascode current sensor is to implement the lateral MOSFET sensing transistor with the lowest possible specific on-resistance. This task is achieved by using MOSFET cell designs with the highest A/W gate packing density; by limiting the sense MOSFET's operating voltage to under a volt and using the shortest channel length device capable of sustaining that voltage with decent matching; and utilizing thick-metal interconnections with fine line geometries to minimize parasitic resistance.

Figure 17A:
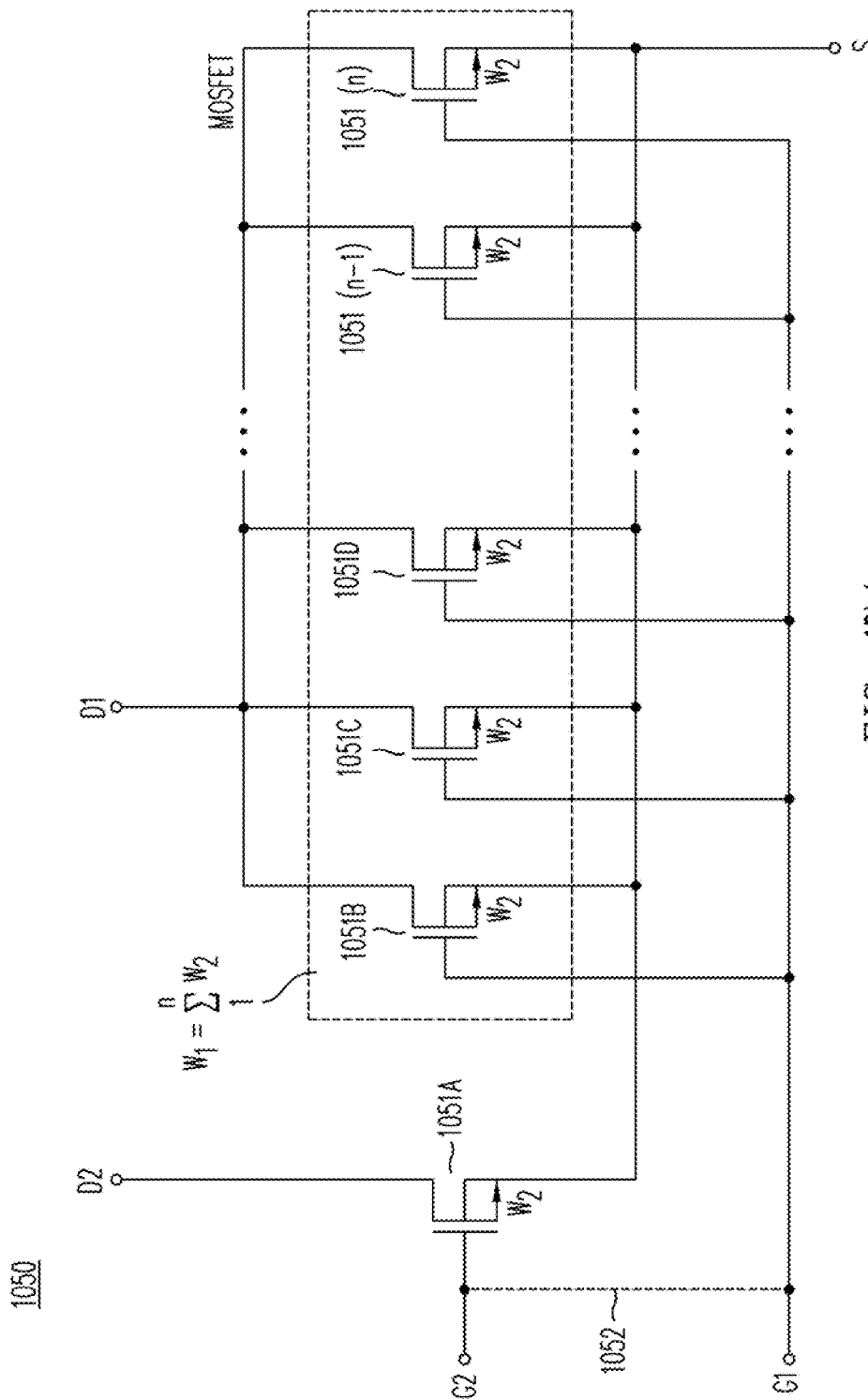
FIG. 17A is an equivalent circuit diagram of an NCS-type cascode current sensing MOSFET array.

The equivalent circuit of cellular based sense MOSFET design is shown schematically in FIG. 17A, where low-voltage main and sense MOSFETs 1050 comprise a regular array of devices with separate drain connections D2 and D1 sharing a common source S. The sense device, N-channel MOSFET 1051A, comprises a cell of gate width $W_2$ having similar or identical geometry to the unit cells comprising the larger sense MOSFET. The low-resistance main MOSFET includes a large number of cells 1051B, 1051C, 1051D ... 1051(n−1), 1051(n), each of gate width $W_2$. In aggregate, the total gate width $W_1$ of "n" cells is given by $$W_1 = \sum_1^n W_2$$

all having identical channel length L. As shown, gates G2 and G1 of the main and sense cells are separate but in a preferred embodiment they are shorted together by an interconnect 1052.

Figure 17B:
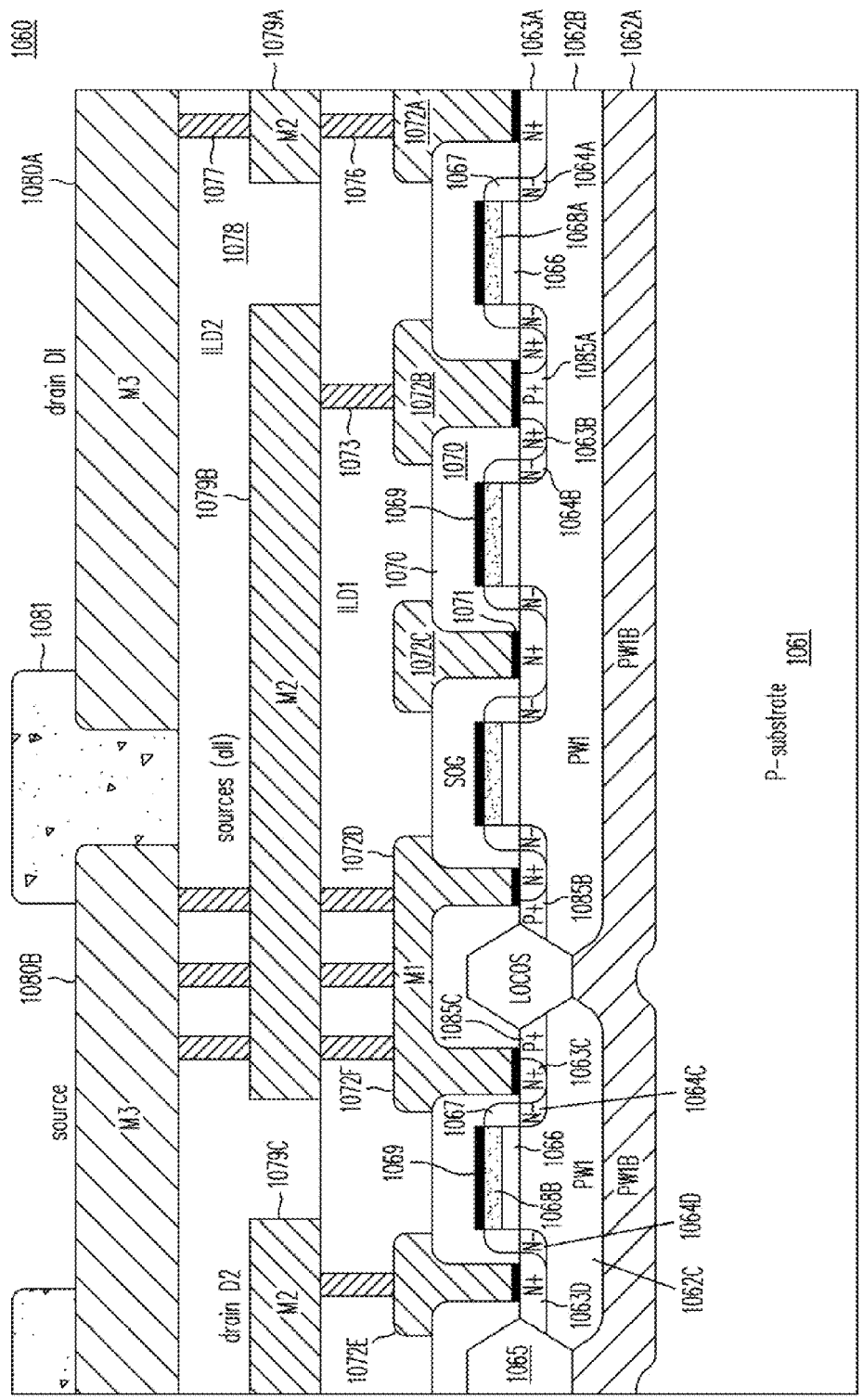
FIG. 17B is a cross sectional view of the device of FIG. 17A.

FIG. 17B illustrates one embodiment of the cascode current sense MOSFET made in accordance with this invention. As shown, NC$^2$S circuit 1060 comprises a P-type substrate 1061 with a conformal P-well comprising a buried portion 1062A and surface portions 1062B and 1062C which do not necessarily exhibit a monotonic or Gaussian decline in doping with depth. Such dopant profiles can be used to minimize short-channel effects such as channel length modulation and barrier lowering, and are preferably constructed using a sequence of two or more boron or BF$_2$ ion implants of varying energy with minimal high-temperature processing or little or no diffusion thereafter.

The sense MOSFET, located between regions of LOCOS field oxide 1065 comprises a polysilicon gate 1068B with a silicide layer 1069, a gate oxide layer 1066, N+ source and drain regions 1063C and 1063D with sidewall oxide spacers 1067, which define lightly-doped drain extensions 1064C and 1064D, and a P+ well contact implant 1085C. The main MOSFET has a multi-cell or stripe structure of similar construction, including a polysilicon gate 1068A with a silicide layer 1069, the same gate oxide layer 1066 as in the sense MOSFET, N+ source and drain regions 1063A and 1063B with sidewall oxide spacers 1067, which define lightly-doped drain extensions 1064A and 1064B, and P+ well contact implants 1085A and 1085B.

The entire device is coated with a glass such as SOG 1070, and contact windows are opened to contact N+ source and drain regions 1063A-1063D with a first-metal layer M1, including main MOSFET drain metal 1072A and 1072C, main MOSFET source-body metal 1072b and 1072D, sense MOSFET source-body metal 1072F, and sense MOSFET drain metal 1072E. All contact windows include a barrier metal 1071 between first-metal layer M1 and the silicon surface.

Above first-metal layer M1, an interlayer dielectric 1076 (ILD1) is deposited and planarized. Within interlayer dielectric 1076, first via regions 1073 are masked, etched, and filled with tungsten plugs, then planarized with chemical mechanical polishing or CMP, followed by the deposition and masked etching of a second-metal layer M2. As shown, second-metal layer M2 includes a layer 1079A indirectly connected to the N+ drain regions 1063A of the low-resistance main MOSFET, a layer 1079B indirectly connected to the source-body regions of all MOSFET cells, and a layer 1079C connected to the N+ drain region 1063D of the sense MOSFET.

The process is then repeated by forming a second interlayer dielectric 1078 (ILD2), a second via layer 1077, and a thick third-metal layer M3, followed by a passivation layer 1081. As shown, third-metal layer M3 comprises D1 drain-metal D1 (1080A) of the high-current main MOSFET, and source-metal D2 (1080B) for the entire device.

The actual device array depends on the geometry of the polysilicon gate layer, first metal M1, and second metal M2 and their interconnection through the contacts and the first via plugs. Considering only the polysilicon and first metal layers, two possible cell geometries are shown in the plan views of FIGS. 17C and 17D.

Figure 17C:
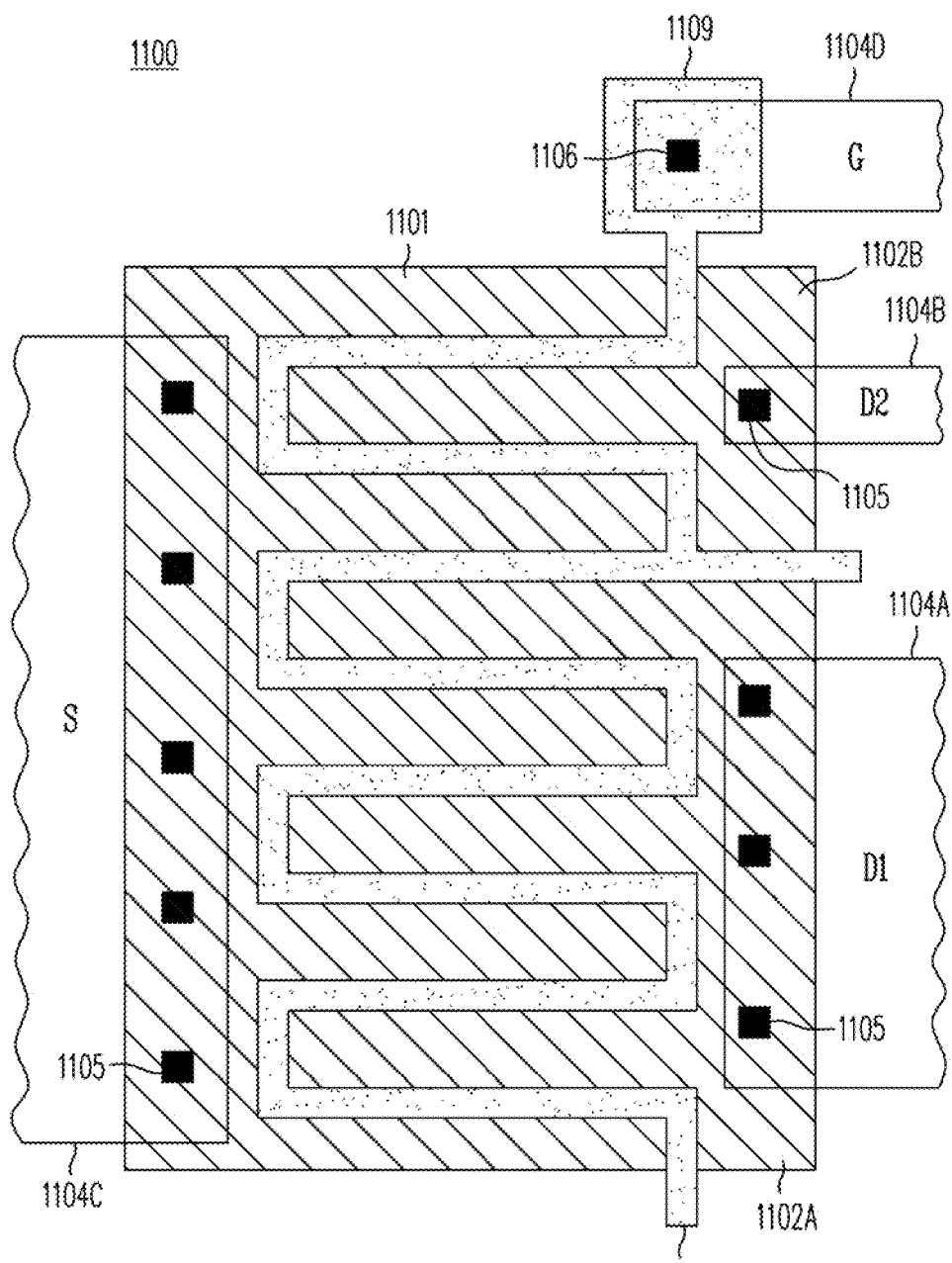
FIG. 17C is a plan view of an interdigitated version of the device.

In stripe geometry 1100 of FIG. 17C, a gate 1109 forms a serpentine pattern dividing the N+ active drain regions into a sense finger 1102B and large-gate-width main fingers 1102A. Source fingers 1101 surround the gate and drain fingers. Metal M1 to silicon connections made through contact windows 1105 include sense finger 1102B contacted by D2 metal 1104B, main fingers 1102A contacted by D1 metal 1104A, and source fingers 1101 contacted by metal 1104C. Contact holes 1106 to polysilicon facilitate gate 1109 contact to metal 1104D.

Figure 17D:
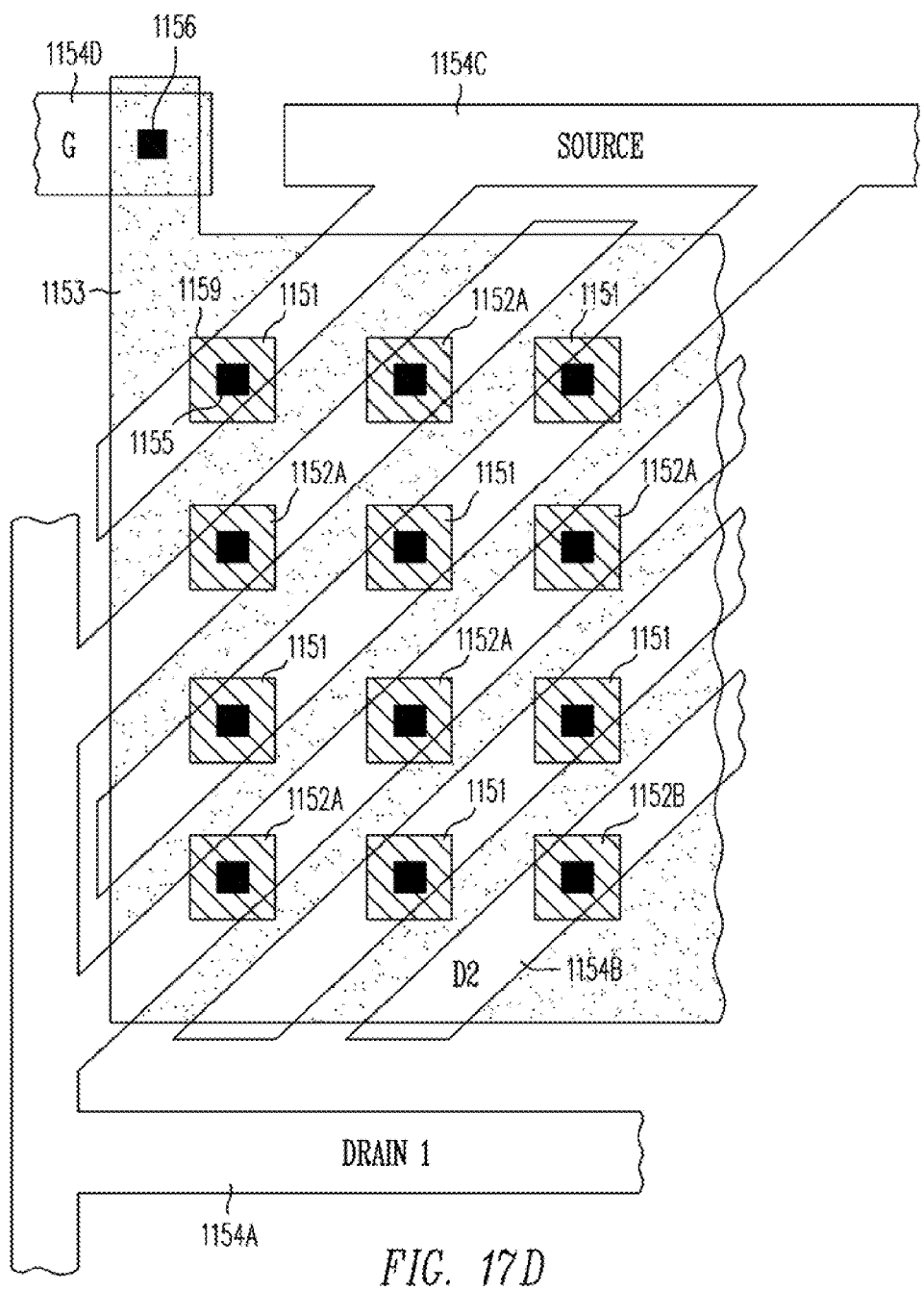
FIG. 17D is a plan view of a closed-cell version of the device.

In closed geometry 1150 of FIG. 17D, a gate 1153 forms a grid pattern dividing the N+ active drain regions into mirror MOSFET cells 1152B and large-gate-width main MOSFET cells 1152A. Source cells 1151 alternate with drain cells 1152 throughout the pattern. Metal M1 to silicon connections made through contact windows 1155 include sense MOSFET cells 1152B contacted by D2 metal 1154B, main MOSFET cells 1152A contacted by D1 metal 1154A, and source cells 1151 contacted by metal 1154A all on a diagonal grid. Contact holes 1156 to polysilicon facilitate contact between gate 1153 and metal 1154D.

Figure 17E:
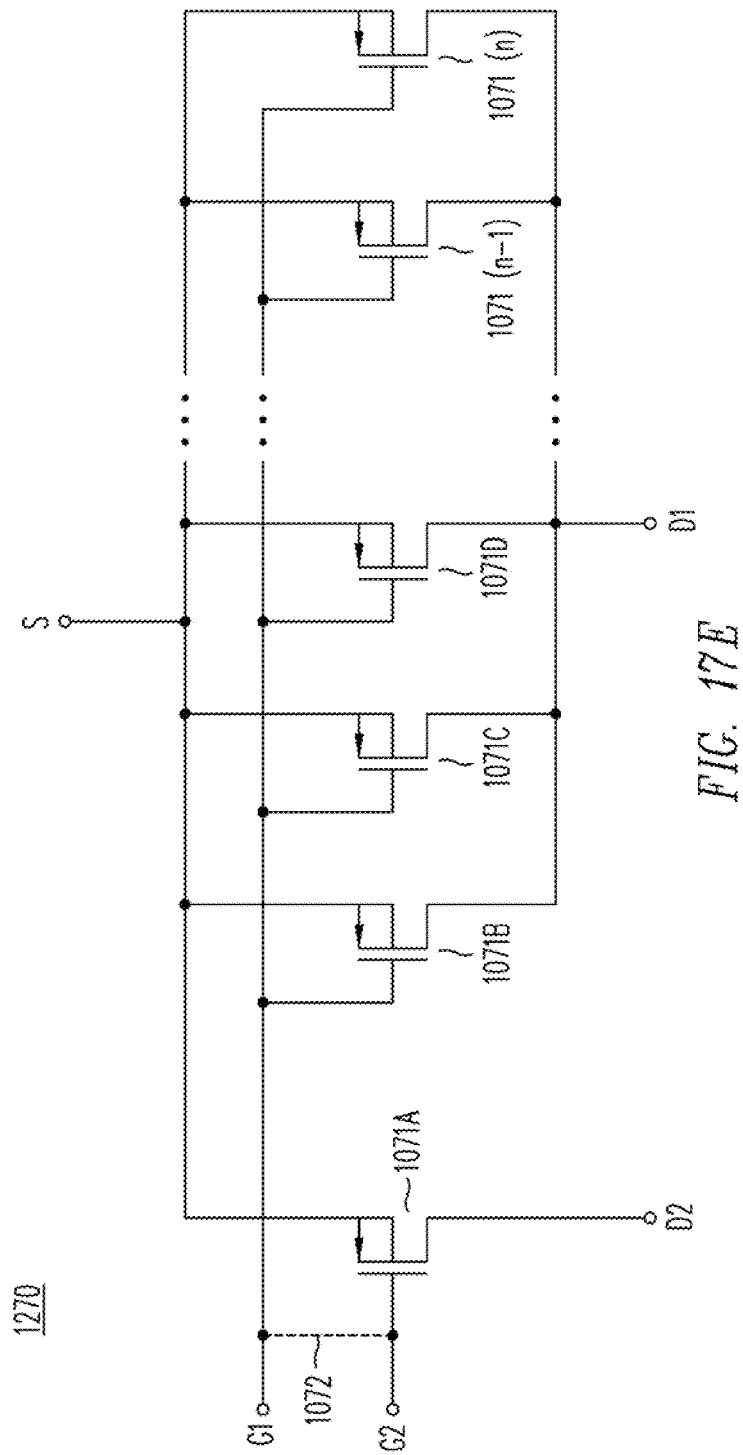
FIG. 17E is a circuit diagram of an equivalent PCS-type circuit.

As shown in FIG. 17E, the same geometries apply equally to P-channel MOSFET arrays such as a mirror pair 1270 comprising a P-channel sense MOSFET 1071A with drain D2, and low-resistance P-channel main MOSFETs 1071A, 1071B, 1071C ... 1071(n−1), and 1071(n) connected to drain D1. All MOSFETs share a common source. In a preferred embodiment, separate gates G1 and G2 are shorted together by interconnect 1072.

Third metal layer M3 has a geometry primarily related to the packaging considerations for connecting the cascode current sensing IC to the high power device. Top layer metal comprises two different geometries—the parallel strip pattern 1200 shown in FIG. 18A and the concentric rectangle pattern 1250 of FIG. 18B.

In the parallel geometry of pattern 1200, source bond wires 1207 attach to a source metal 1203 on a silicon die 1201 through a pad opening 1205. Similarly, D1 drain bond wires 1208A attach to a drain metal 1204A through a second bond pad opening 1206A parallel to the source bond pad 1205. A low-resistance main MOSFET is formed in the regions 1202A in between the bond pads and underneath metal 1203 and 1204A using one of the aforementioned strip or cellular geometries for polysilicon and first layer metal (not shown). A second layer metal (not shown) interconnects this first layer metal to D1 and S third layer metal regions 1204A and 1203.

A small portion of silicon die 1201 includes sense MOSFET 1202B forming drain D2 with metal 1204B, bond pad 1206B and bond wire 1208B sense MOSFET 1202B shares the same source metal 1205 with the main MOSFET. The gate connections are not shown in plan view 1200.

Figure 18A:
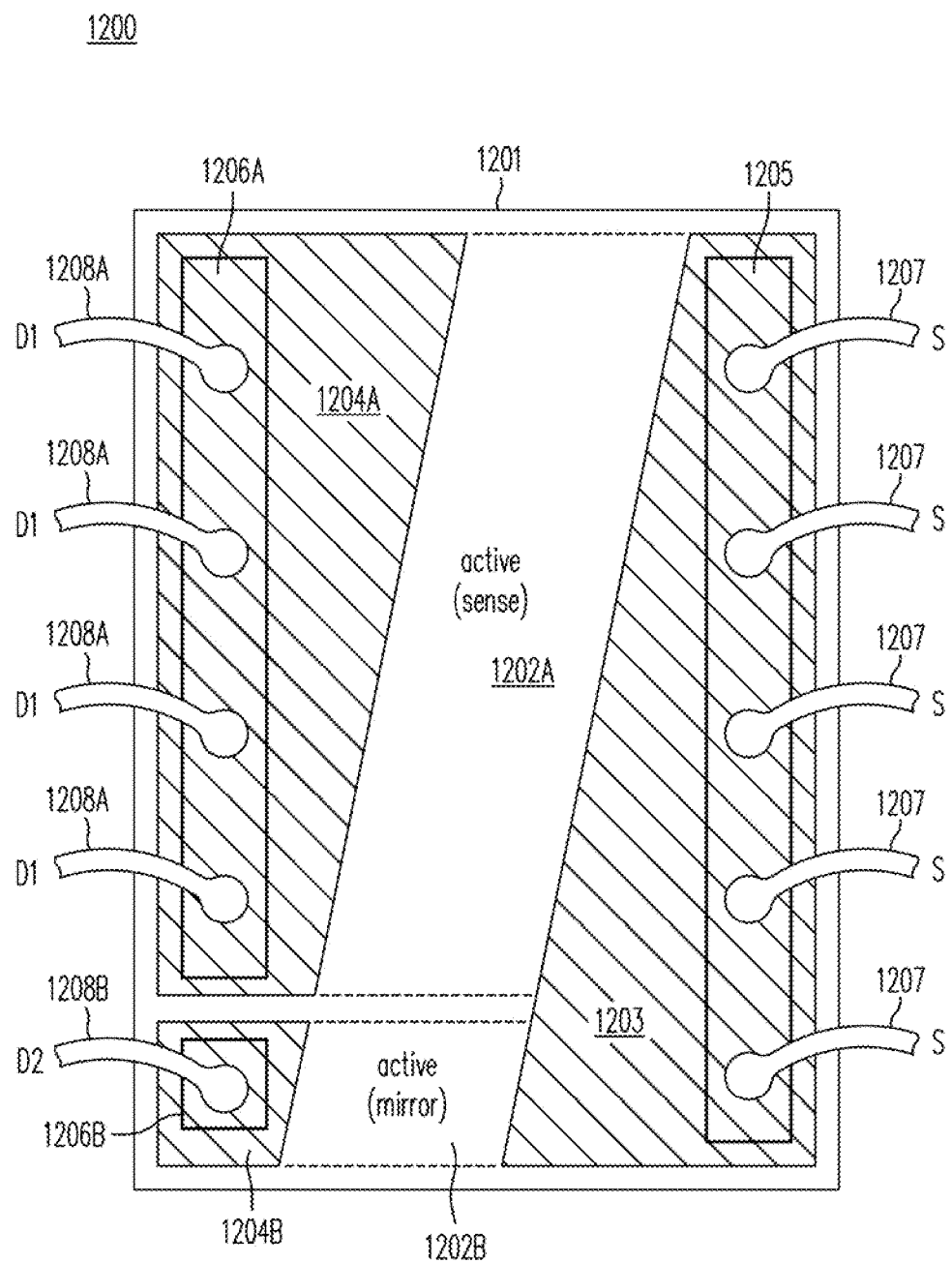
FIG. 18A is a plan view of a cascode current sensor die with parallel source and drain buses.
Figure 18B:
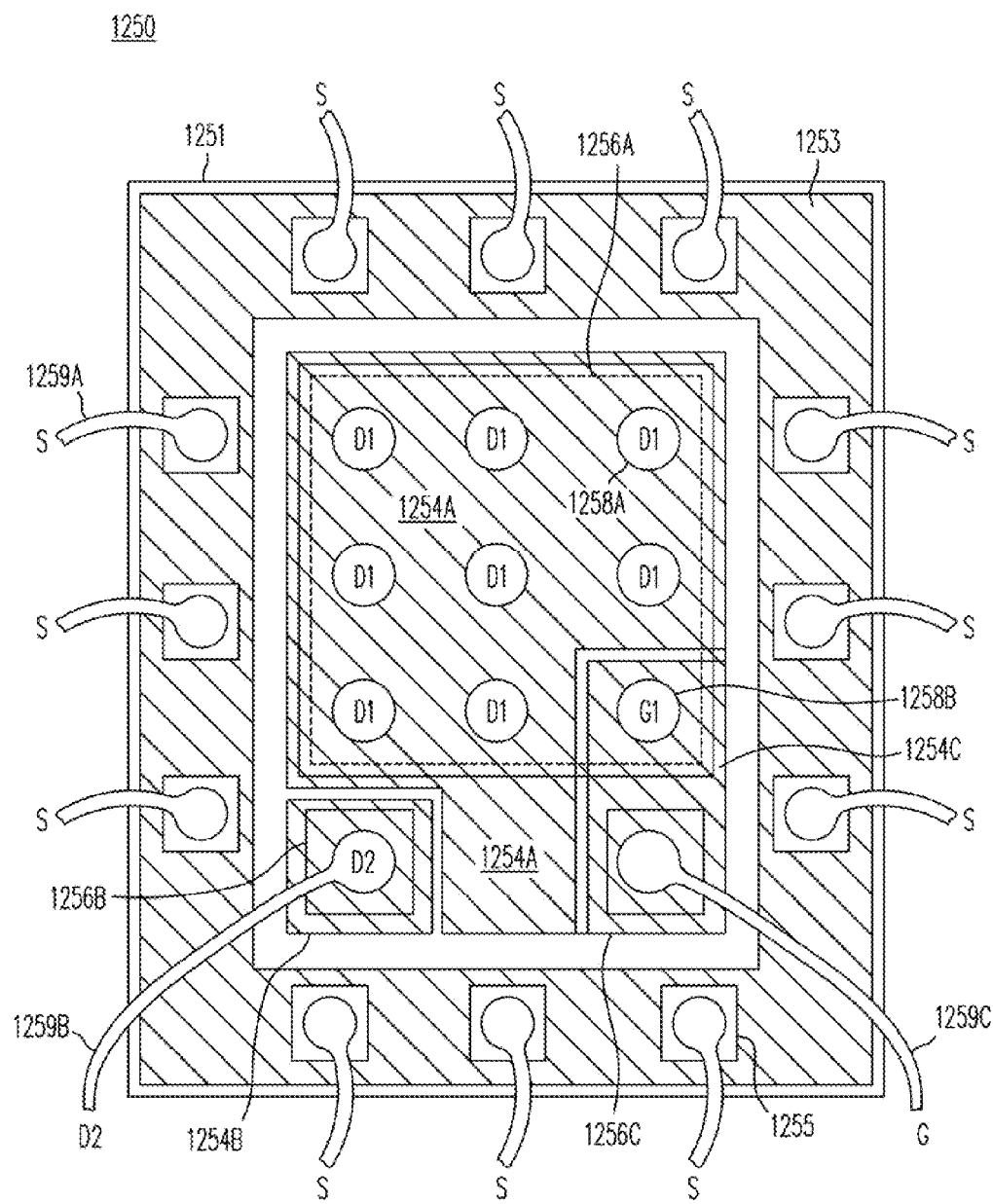
FIG. 18B is a plan view of a cascode current sensor die with a concentric drain and stacked dice.

In the concentric geometry 1250 of FIG. 18B, source bond wires 1259 attach to a source metal 1253 on the outer periphery of a silicon die 1251 through pad openings 1255. Drain D1 does not use bond wires but instead includes solder bumps or copper pillar bumps 1258A located across drain metal 1254A within second bond pad window 1256A. The low-resistance main MOSFET is formed in silicon beneath metal 1254A using one of the aforementioned stripe or cellular geometries for polysilicon and first layer metal (not shown). A second layer metal (not shown) interconnects this first layer metal to D1 and S third layer metal regions 1254A and 1253.

A small portion of silicon die 1251 comprises a sense MOSFET with a drain D2 metal 1254B, a pad opening 1256B, and a bond wire 1259B formed in the island region adjacent to main MOSFET metal 1254A and laterally surrounded by source metal 1253. Contact to the gates of both the main and sense MOSFETs occurs through a bond wire 1259C, a pad opening 1256C and metal 1254C. Connection to the high power vertical device occurs through solder or pillar bump 1258B formed within pad opening 1256A.

Concentric rectangular design 1250 is designed primarily for die stacking where a vertical power MOSFET sits atop drain metal 1254A and attaches electrically and mechanically either directly or by way of an intervening leadframe through solder bumps 1258A. The area of the vertical power device is ideally similar to but no bigger than the pad opening 1256A and cannot overlap source pad regions 1255, sense MOSFET drain pad opening 1256B, or gate pad region 1256C to prevent interfering with the bonding wires.

Figure 10A:
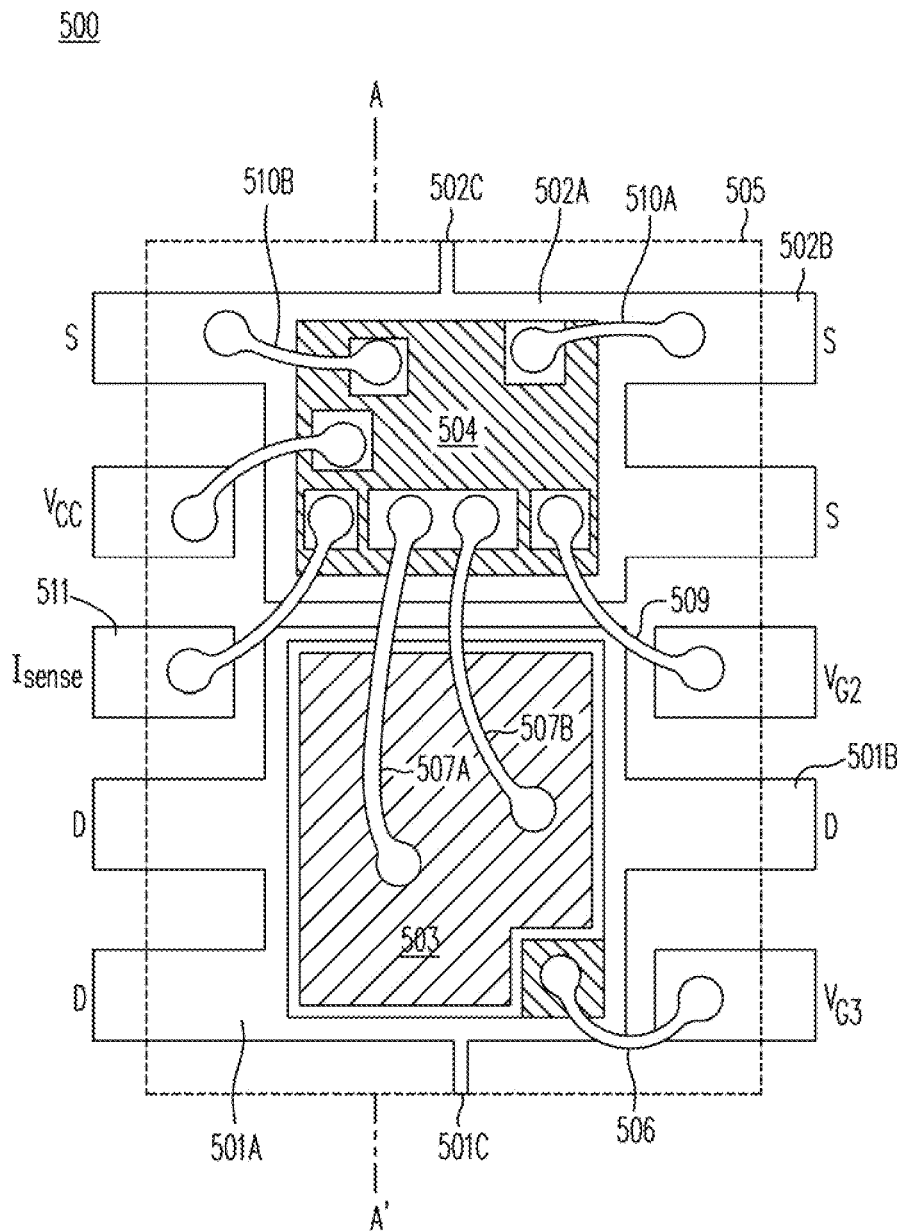
FIG. 10A is a top view of a package containing a cascode current mirror current sensor.
Figure 10B:
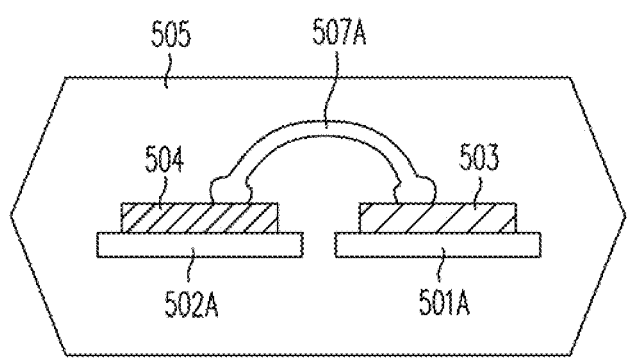
FIG. 10B is a cross-sectional view of the current sensor of FIG. 10A.

With these packaging considerations, parallel layout 1200 of FIG. 18A is suitable for side by side die placement with wire bonding interconnects between the two dice and the package as shown in the example of FIG. 10A. It may also be useful for use in bump chip scale packages, in bump-on-leadframe packaging techniques and in some cases, for die stacking.

Figure 19A:
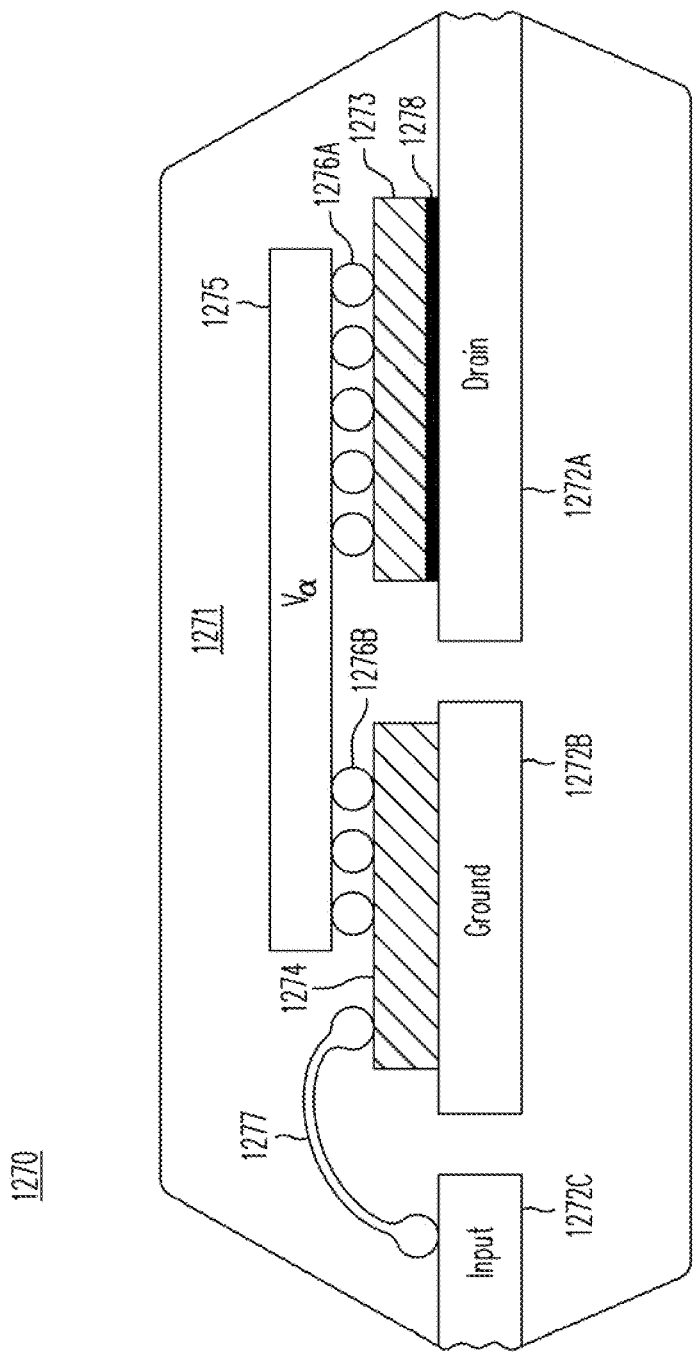
FIG. 19A is a cross-sectional view of a cascode current sensor with a vertical discrete power device and a strapped $V_\alpha$ interconnect.

Such side-by-side packaging is shown after assembly in cross section 1270 of FIG. 19A where a cascode-current-sensor die 1274 is mounted on the grounded die pad of a split lead frame package, and where a vertical power MOSFET die 1273 with backside drain metal 1278 is attached to second die pad 1272A connected to the package's drain pins. Current sensor die 1274 includes input and output signals connected via bonding wires 1277 to package pins not attached to either of die pads 1272A and 12728. Multiple bond wires (not shown) also connect the low resistance grounded source metal on the surface of die 1274 to die pad 1272B using a "down bond". The low resistance ground connection is carried to the printed circuit board to which device 1270 is attached through package pins (not shown) connected to die pad 1272B. The entire assembly is molded in plastic 1271.

Both vertical MOSFET die 1273 and current sensor die 1274 include solder bumps or copper pillar bumps 1276A and 1276B attached to the top-side metal. These solder bumps are shorted by plated copper bar 1275 placed atop bumps 1276 prior to solder flow. The resistance of copper bar 1275 is substantially lower than the resistance of the chip-to-chip wire bonds used in cross section 500 of FIG. 10A. Moreover the use of copper bar 1275 provides greater manufacturability than chip-to-chip wire bonding, since soldering copper bar 1275 to both the current sensor die 1274 and the vertical MOSFET die 1273 using a solder flow produces much lower stress and impact than conventional methods.

Unlike the all wire-bond version of FIG. 10A which has three series bond wire connections contributing to parasitic resistance, the device of FIG. 19A has only one bond wire connection, considering that power MOSFET die 1273 is attached directly to lead frame 1272A and copper bar 1275 connects the two dice 1273 and 1274 together bond-wirelessly. Connecting the drain of the sense MOSFET within die 1274 to the source of the vertical power MOSFET within die 1273, the low-resistance copper bar 1275 with a potential $V_\alpha$ remains insulated from the high-voltage drain on the backside of the vertical power MOSFET die 1273 by surrounding plastic 1271. With only source bond wires in the high current path, extra wires can be included to minimize source wire resistance.

Figure 19B:
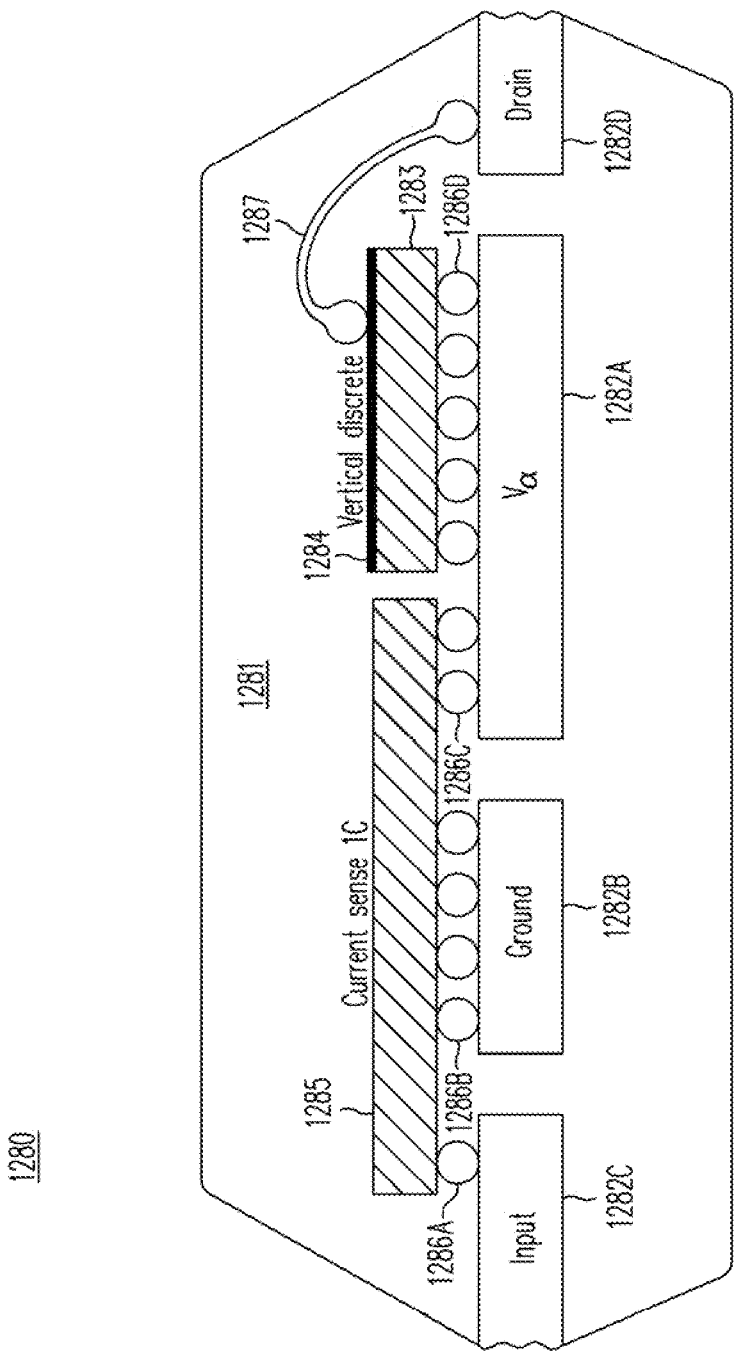
FIG. 19B is a cross-sectional view of a cascode current sensor with a vertical discrete power device and a bump-on-leadframe with bonded drain.

Cross section 1280 in FIG. 19B illustrates another approach to minimizing the on-resistance and cost of a cascode-current-sense vertical power MOSFET. In FIG. 19B, both a current sensor IC die 1285 and vertical power MOSFET die 1283 are assembled with a flip-chip solder-bump or pillar-bump process straddling a split leadframe comprising a grounded die pad 1282B, a die pad 1282A containing an intermediate voltage $V_\alpha$, and a die pad 1282C containing various control and input signals. The backside 1284 of the vertical discrete MOSFET die 1284 is wire bonded to independent pins 1282D.

As in the previous cross section 1270, the bump-on-leadframe assembly in cross section 1280 has only one wire bond 1287 in the high-current series path. Including additional wire bonds in parallel with wire bond 1287 will reduce the drain resistance contribution of the wire bonded connections. Because vertical MOSFET die 1283 has a gate connection as well as multiple source connections on its bumped surface, one bump must be connected to a dedicated gate pin on leadframe 1282.

Figure 19C:
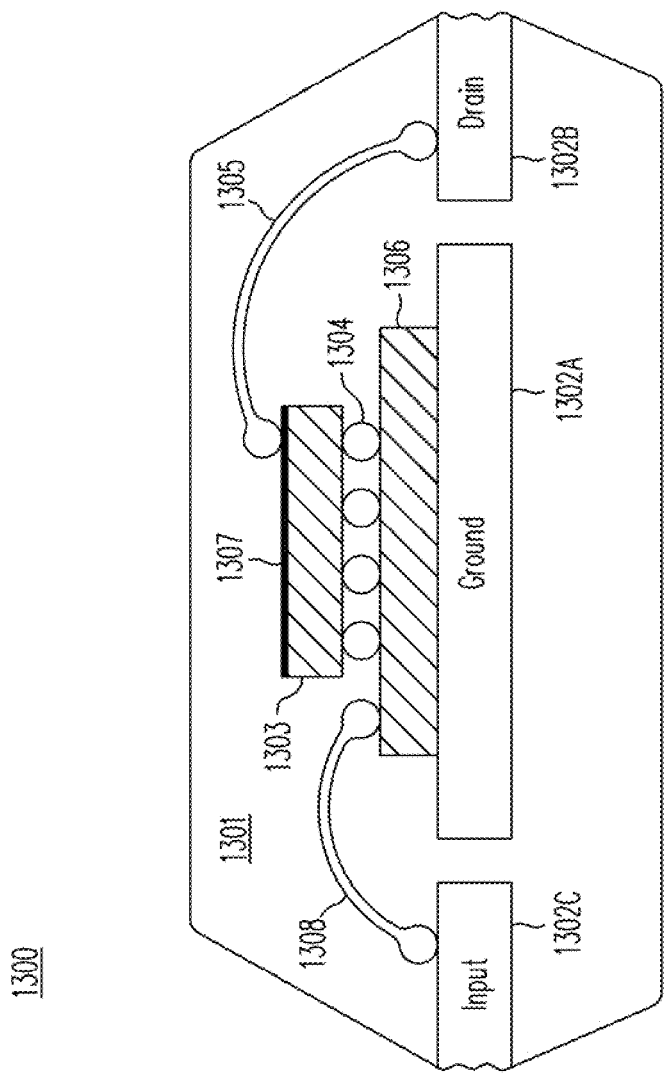
FIG. 19C is a cross-sectional view of a cascode current sensor with a vertical discrete power device and a stacked die assembly with bonded drain

A stacked die assembly using the concentric layout 1250 of FIG. 18B is illustrated in cross section 1300 in FIG. 19C, including a vertical power device in a die 1303 connected to and sitting atop a die 1306 containing a IC cascode current sense circuit. Connections from the drain of the current sense circuit within die 1306 to the source of the vertical power device within die 1303 are made by solder bumps or pillar bumps 1304 which also provide mechanical support and a low-thermal-resistance path to remove heat through any package leads connected directly to die pad 1302A.

A drain terminal on the backside of vertical power device die 1303 is bonded to a metal layer 1307, and wire bonds 1305 connect the drain terminal to drain pins 1302B. Control signals are provided using bond wires 1308 that are attached to input pins 1302C, not connected to ground.

As in cross section 1270, the bump-on-leadframe assembly shown in cross section 1300 has only one wire bond 1305 in the high-current series path, which may actually comprise multiple wires in parallel.

Figure 19D:
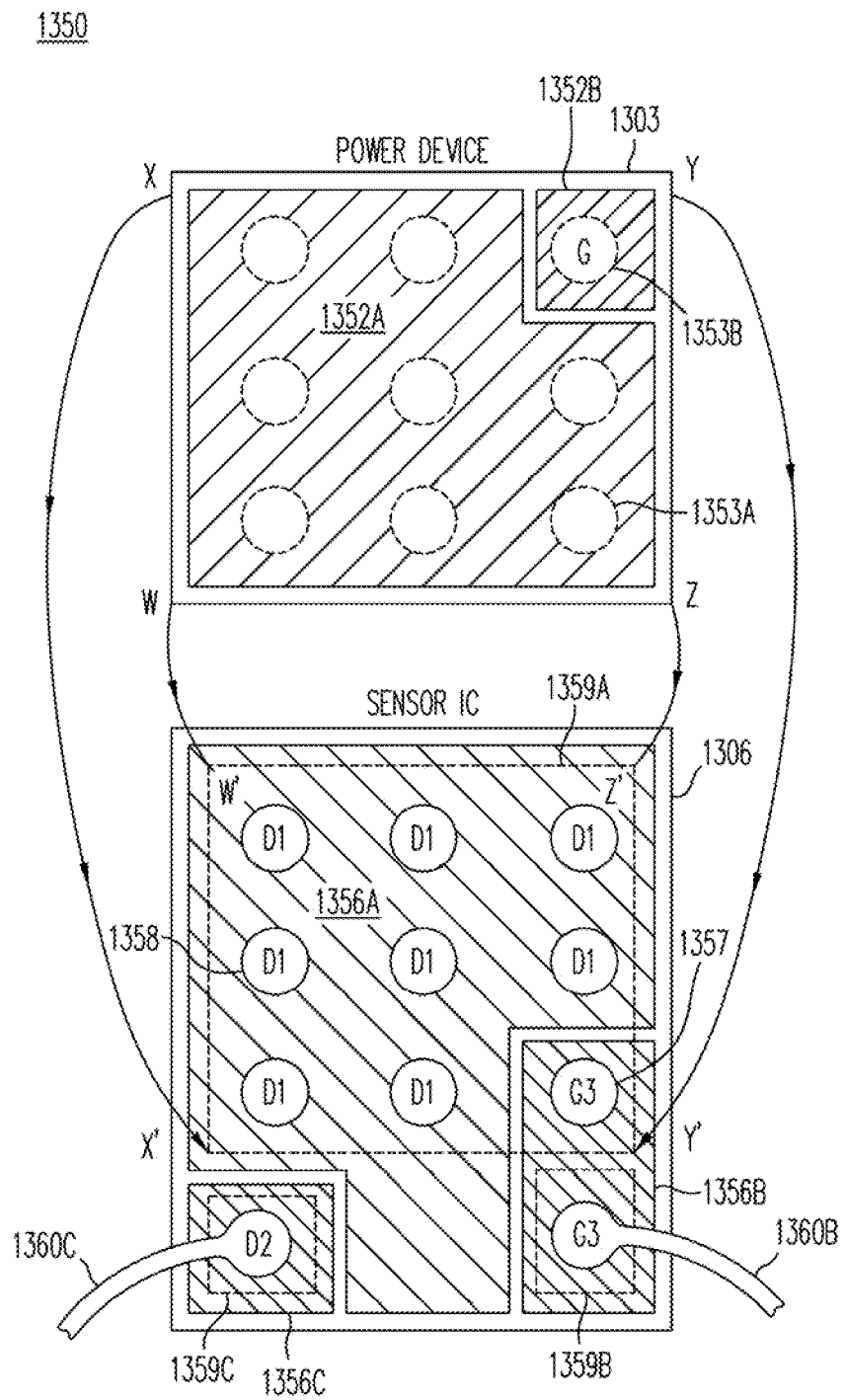
FIG. 19D is a plan view of the die stacking arrangement of the cascode current sensor shown in FIG. 19C.

Stacking die 1303 on top of die 1306 requires however special consideration for facilitating gate contact to the vertical discrete device within die 1303. A possible alignment of the two dice, as illustrated in top view 1350 of FIG. 19D involves flipping die 1303 with a gate metal 1352B and a source metal 1352A onto current sensor die 1306 such that drain solder bumps 1358 on die 1306 are aligned with discrete source metal locations 1353A on die 1303, and such that a gate bump 1357 on die 1306 is aligned with a gate 1353B on die 1303 containing the vertical power device. Rectangle WXYZ fits into an opening 1359A in a passivation layer covering die 1306 and is aligned with points W'X'Y'Z'. A gate wire 13606, connecting to metal 1356B and a drain D2 bond wire 1360C connecting to drain D2 metal 1356C should not be overlapped by die 1351.

Figure 19E:
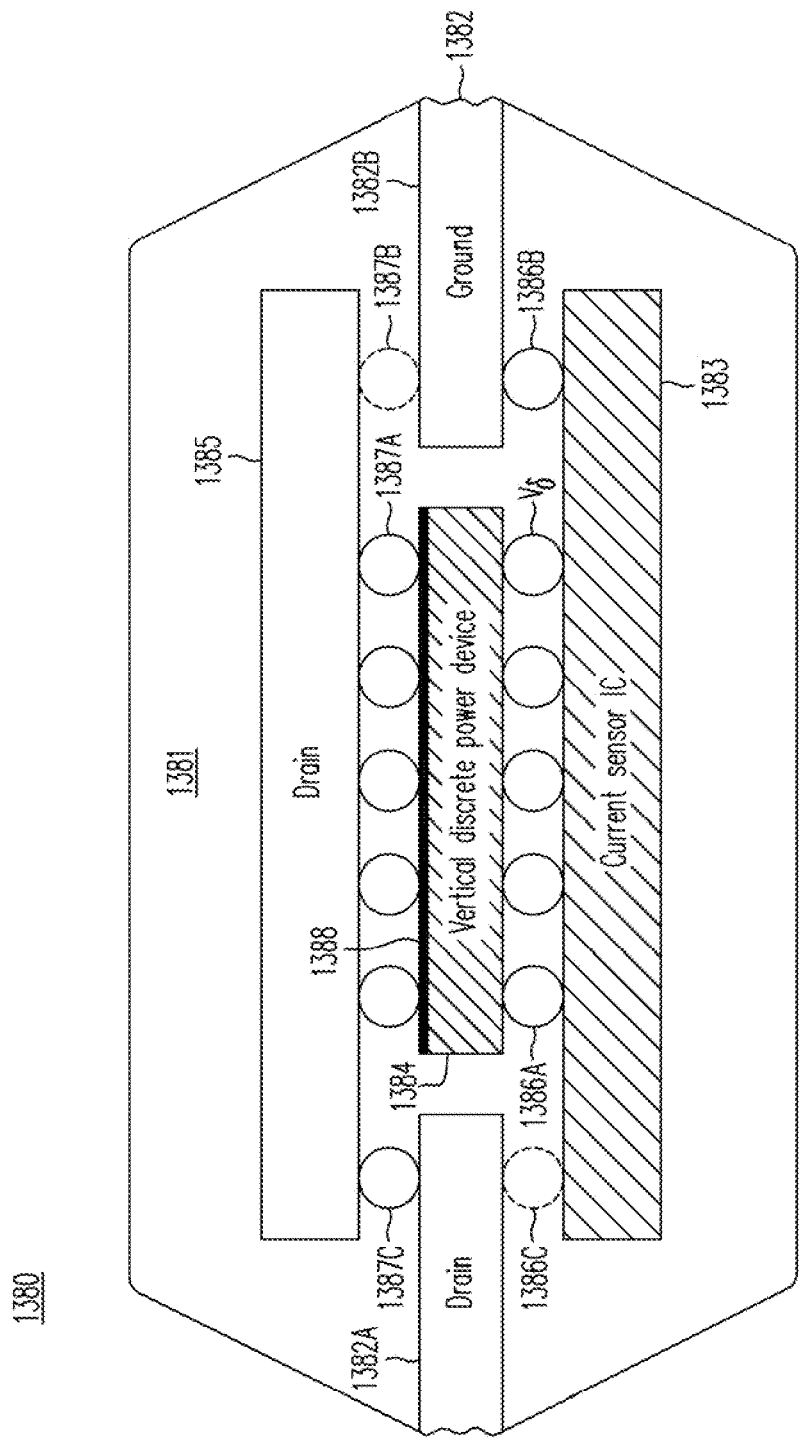
FIG. 19E is a cross-sectional view of a cascode current sensor with a vertical discrete power device in a tri-level stacking arrangement.

Another stacked-dice embodiment, shown in cross section 1380 in FIG. 19E, includes a current sensor die 1383, with solder bumps or pillar bumps 1386A, 1386B, and 1386C, mounted onto a leadframe 1382, comprising a drain lead 1382A and a ground lead 1382B. As shown, bump 1386C is not connected to drain lead 1382A but to another lead not in the cross sectional plane shown. The ground connection of current sense die 1383 is, however, connected to ground lead 1382B through multiple solder bumps 1386B. A vertical power device die 1384 has its top-side source and gate (on the bottom side in FIG. 19E) connected to current sense die 1383 through solder bumps 1386A.

The backside of vertical power device die 1384, which contains, for example, a MOSFET, is connected via a metal layer 1388 to a conductive plated copper bar 1385 by means of solder bumps or pillar bumps 1387A, which is in turn attached to drain lead 1382A with solder bumps 1387C. Bump 13876 does not connect copper bar 1385 to ground lead 1382B but instead is located outside of the plane of this drawing's cross section. The assembly of a vertical power device with a cascode current sensor shown in FIG. 19E therefore contributes no bond wire resistance to degrade device performance.

Trimming for Current Sensing Accuracy: The cascode current sense method described herein depends on device matching to scale the current through the large gate-width main MOSFET down to the current through a relatively small sense MOSFET by a factor of "n". Even with careful layout, a mismatch in device characteristics and therefore current measurements can occur. As derived earlier, the mismatch arises from channel length variations, from threshold variations, and from offsets in the amplifier used to force $V_\beta = V_\alpha$. We can collectively account for all these mismatches as an offset voltage or current as given by $$I_{sense} = I_{D2} = (I_{D1}/n) \pm I_{offset}$$

The simplest way to eliminate the impact of this offset is to trim the value of the ratio "n" at the die sort stage or after assembly is complete, using active trimming. During active trimming, the transistor ratio n is adjusted by turning some fractional cells in the sense MOSFET permanently-on or permanently-off using a fuse link or preferably with a one-time-programmable (OPT) memory. The above equation then becomes $$I_{sense} = (I_{D1}/(n \pm \Delta n)) \pm I_{offset}$$

where $\Delta n$ is adjusted to make the ratio n compensate for any offset. For example, a positive current offset $+I_{offset}$ results in an error where $I_{sense}$ overstates the current $I_{D1}$ flowing in the load. By trimming the width of the sense MOSFET to act "smaller" by shutting off some portion of the device, the mirror ratio increases from "n" to a larger value (n+$\Delta n$) and the term ($I_{D1}$/n) becomes a smaller current ($I_{D1}/(n \pm \Delta n)$) thereby lowering the value of $I_{sense}$ to its correct value and canceling the error caused by the positive $I_{offset}$ current.

Figure 20A:
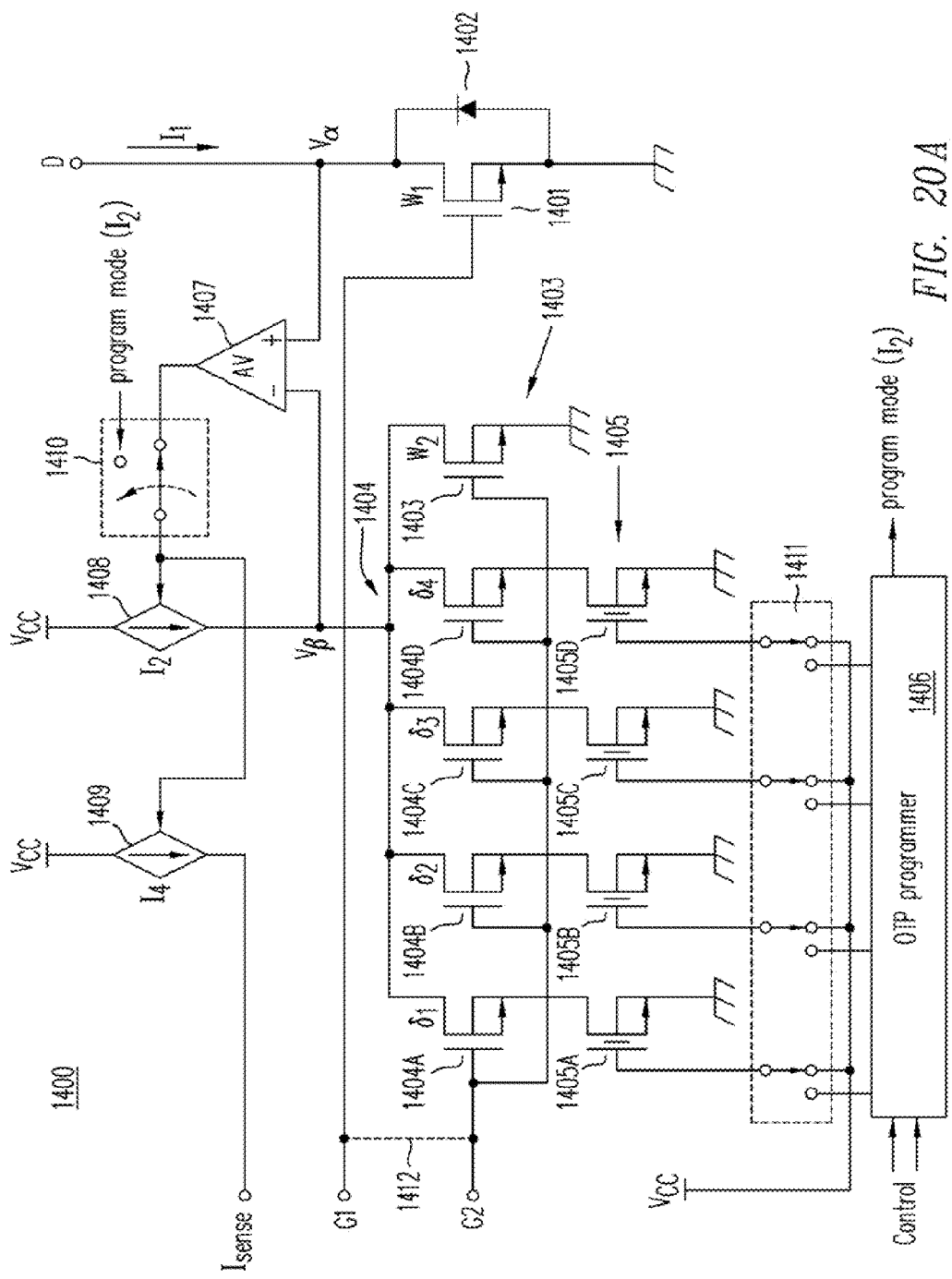
FIG. 20A is a circuit diagram of a series-connected down-trim circuit using a one-time programmable (OTP) memory.

In FIG. 20A, for example, a cascode current sense circuit 1400 comprises a main MOSFET 1401 with gate width $W_1$, a sense MOSFET 1403 with gate width $W_2 = (W_1/n)$, an operational amplifier 1407, and dependent current sources 1408 and 1409. It also includes a provision for negative active trim using a trim MOSFET array 1404 and an OTP memory1405. The MOSFET trim array 1404 comprises MOSFETs 1404A, 1404B, 1404C and 1404D with respective gate widths $\delta_1$, $\delta_2$, $\delta_3$ and $\delta_4$, which represent a small fraction of the gate width $W_2$ of sense MOSFET 1403. Preferably, the gate G1 of main MOSFET 1401 and the gate G2 of the sense MOSFET 1403 and the MOSFETs in trim MOSFET array 1404 are shorted to a common input terminal 1412 and biased to $V_{cc}$.

Series-connected one-time-programmable or OTP memory elements 1405A through 1405D act like digital bits allowing or suppressing drain current in corresponding trim transistors 1404A through 1404D. During fabrication, un-programmed OTP memory elements 1405A through 1405D exhibit normal threshold voltages. During normal operation, i.e. not during programming, multiplexer 1411 biases the gates of N-channel OTP transistors to the supply voltage $V_{cc}$, turning them "on" and allowing them to conduct currents with negligible voltage drops.

Assuming negligible resistance in un-programmed OTP memory elements 1405A through 1405D, the MOSFETs in trim MOSFET array 1404 are electrically in parallel with sense MOSFET 1403, and operating as a single MOSFET with a gate width of $$W_{mirror} = W_2 + \delta_1 + \delta_2 + \delta_3 + \delta_4$$

Assuming for the sake of simplicity, $I_2 = I_4 = I_{sense}$, then the ratio of $I_{sense}$ to is given by $$\frac{I_{sense}}{I_{D1}} \approx \frac{W_2 + \delta_1 + \delta_2 + \delta_3 + \delta_4}{W_1} = \frac{W_2 + \delta_1 + \delta_2 + \delta_3 + \delta_4}{n \cdot W_2}$$

In circuit 1400, the trimming is achieved only by turning "off" selected trim MOSFETs 1404A through 1404D by raising the threshold of the corresponding OTP memory element. For example, programming OTP memory element 1405B turns off MOSFET 1404B and decreases $W_{mirror}$ by an amount $\delta_2$ so that the effective gate width of the sense MOSFET $W_{mirror}$ is reduced to $W_2 + \delta_1 + \delta_3 + \delta_4$, and under the feedback control of operational amplifier 1407, the current sense output current $I_{sense}$ also decreases. In trim circuit 1400, the un-programmed OTP memory elements result in the highest $I_{sense}$ current. Each "bit" that is programmed decreases the sense current as a percentage of the gate width $W_2$. The minimum sense current occurs if all the "bits" are programmed, whereby $I_{sense}/I_{D1} = 1/n$. Circuit 1400 implements a "down-only" trim algorithm. The gates of the trim MOSFETs 1404A through 1404D may be equal in width, binary weighted, or have varying widths depending on the trimming algorithm desired.

Figure 21:
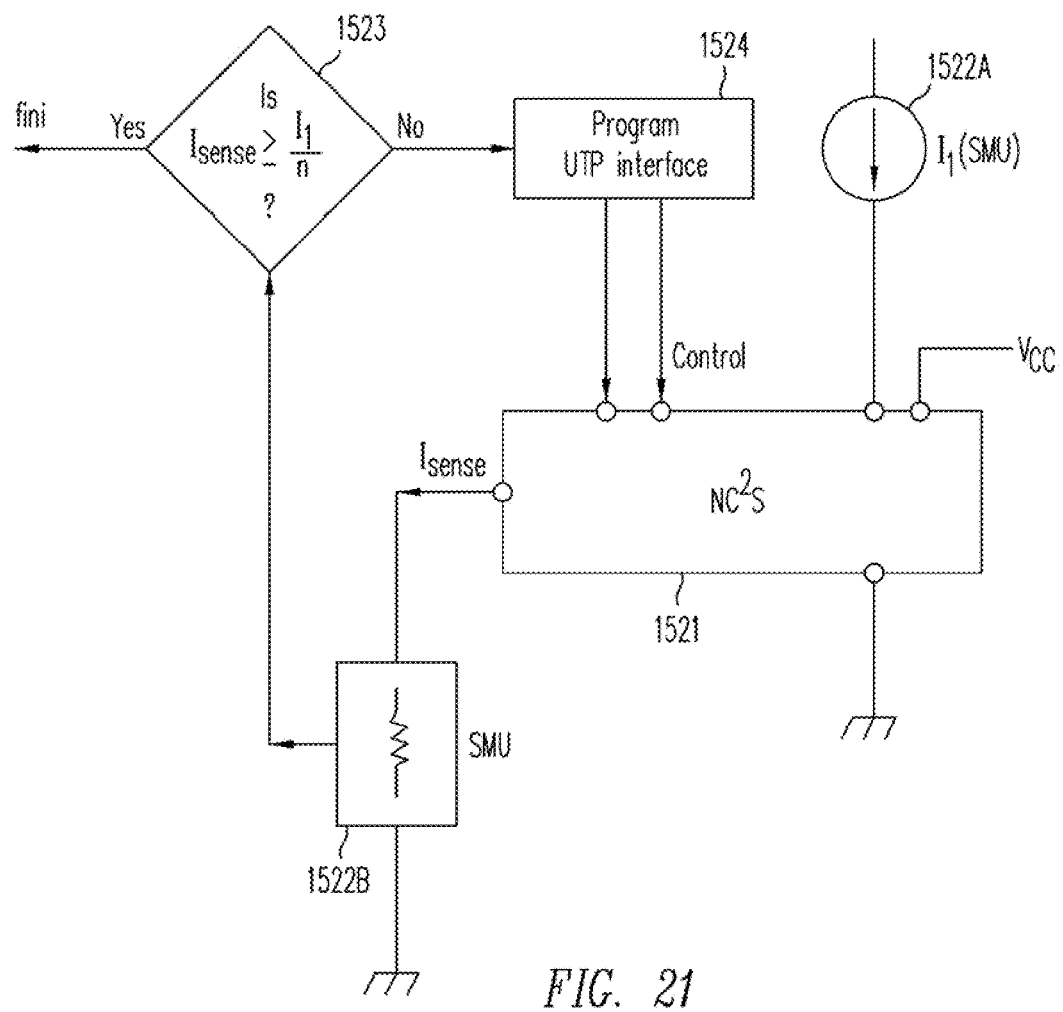
FIG. 21 is a block diagram of an active trim programming arrangement.

Active trimming occurs when multiplexer circuit 1411 connects the gate of OTP memory elements 1405A through 1405D to OTP programming circuit 1406. Simultaneously, multiplexer 1410 also redirects control of current source 1408 to OTP programmer 1406. As shown in FIG. 21, programming occurs by forcing a known current $I_1$ from the source-monitor unit (SMU) of tester 1522A into the cascode-current-sense circuit 1521 under test, and then measuring the sense output current $I_{sense}$ with another SMU 1522B. Trimming software then compares the measured sense current $I_{sense}$ to the known target $I_1$/n and through interface 1524 communicates with OTP programmer 1406 to program a calculated number of bits from on to off and reduce the sense current output to its proper value.

Programming occurs by controlling the gate voltages of the OTP memory elements 1405A through 1405D and raising the drain voltage to drive the MOSFETs 1404A through 1404D into saturation, creating hot carriers, and charging the MOSFETs' gates. The programming can be executed one bit at a time with alternating measurements or by measuring the current $I_{sense}$ only once then calculating which bits correspond to the MOSFETs which must be shut off. As stated previously, trim circuit 1400 can only decrease the value of $I_{sense}$ if it is too high; it cannot increase the value of $I_{sense}$.

One possible disadvantage of using trim circuit 1400 is that the OTP memory elements 1405A through 1405D are in series with the trim array MOSFETs 1404A through 1404D, and this may create a mismatch between trim array MOSFETs 1404A through 1404D and the large MOSFETs 1403 and 1401.

Figure 20B:
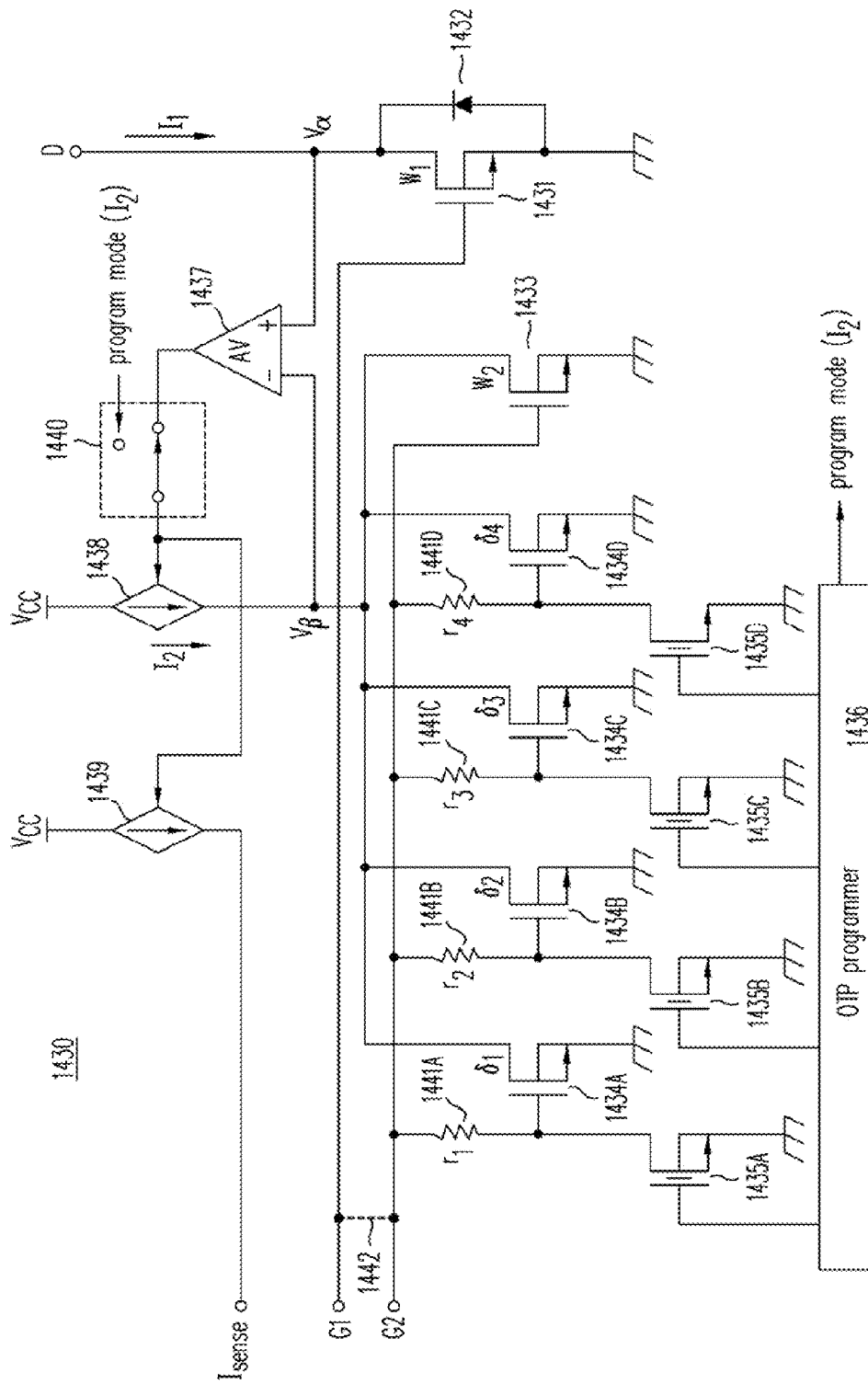
FIG. 20B is a circuit diagram of a shunt-connected down-trim circuit using an OTP memory.

This problem is addressed in an alternative trim circuit 1430, shown in FIG. 20B where the trim array MOSFETs 1434A through 1434D are truly in parallel with sense MOSFET 1433. Each of trim array MOSFETs 1434A through 1434D is biased by a voltage divider comprising a resistor and an OTP MOSFET. For example, trim array MOSFET 1434B is biased by a voltage divider consisting of a resistor 1441B and a corresponding OTP MOSFET 1435B. Un-programmed, OTP MOSFET 1435B has a lower resistance than resistor 1441B, so that the gate of the trim array MOSFETs 1434B is grounded, and as a result do not conduct current.

Programming OTP transistor 1435B requires increasing its gate voltage, turning it off. As a result, resistor 1441B pulls the gate of trim array MOSFET 1434B high, turning it on.

$W_{mirror}$ then increases from $W_2$ to a wider ($W_2+\delta_2$), causing $I_{sense}$ to increase. Circuit 1430 therefore implements an "up-only" trim. It can only increase the value of $I_{sense}$ if it is too low; it cannot decrease the value of $I_{sense}$.

Figure 20C:
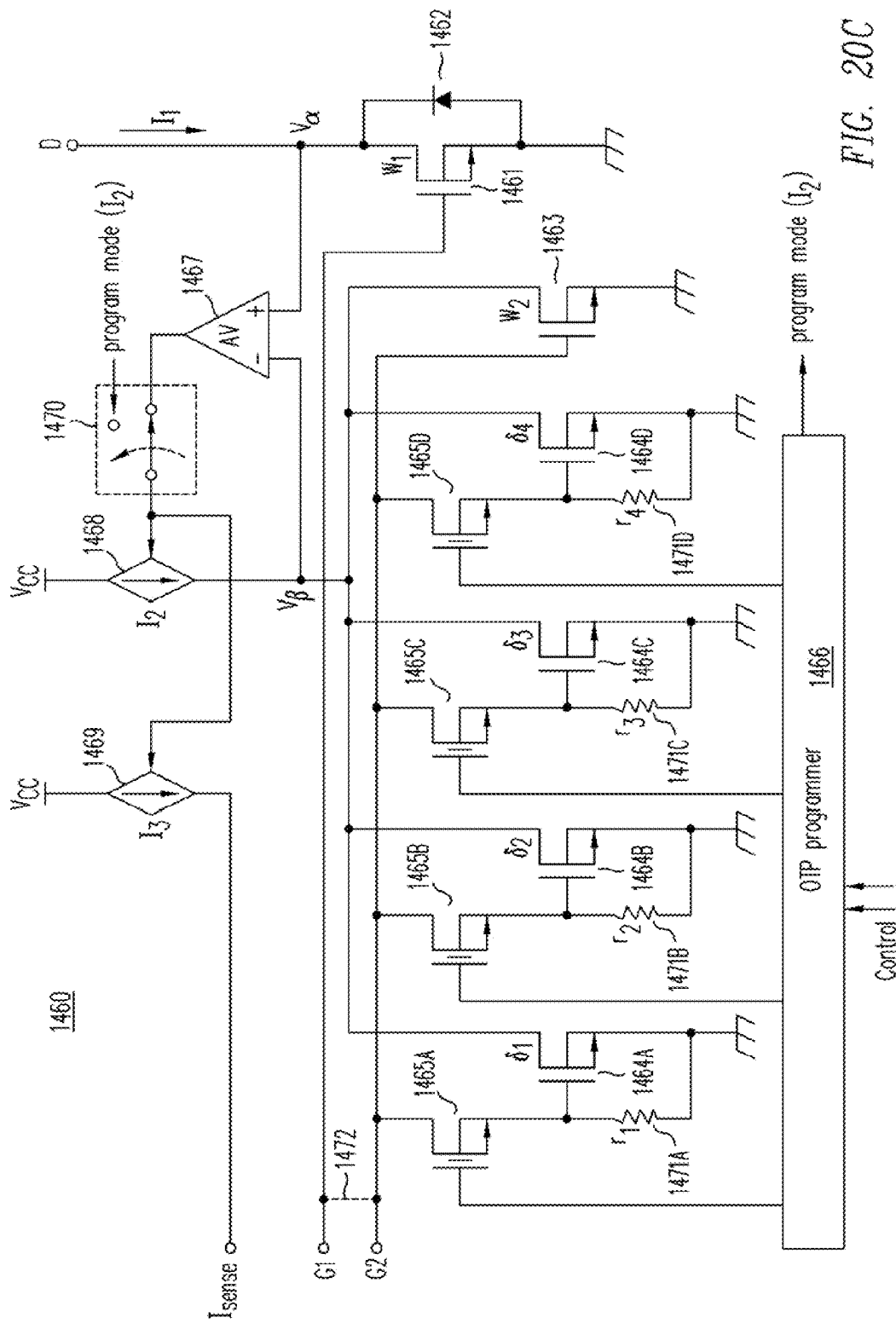
FIG. 20C is a circuit diagram of a shunt-connected up-trim circuit using an OTP memory.

FIG. 20C illustrates a trim circuit 1460, which is similar to trim circuit 1430, except that in trim circuit 1460 the resistor and OTP dividers biasing the gates of the trim array MOSFETs 1464A through 1464D are inverted, with grounded resistors 1471A-1471D and $V_{cc}$-connected OTP memory elements 1465A-1465D.

For example, trim MOSFET 1464B is biased by resistor 1471B and corresponding OTP memory element 1465B. Unprogrammed, the OTP memory element 1465B has a lower resistance than the resistor 1471B Assuming that the terminal G2 is connected to $V_{cc}$, the gate of trim array MOSFET 1464B is likewise connected to $V_{cc}$ and as a result MOSFET 1464B is on and conducts current.

By programming the OTP memory element 14656, its gate voltage increases, turning it off, whereby resistor 1471B pulls the gate of trim MOSFET 1464B to ground, turning MOSFET 1464B off. $W_{mirror}$ then decreases from ($W_2+\delta_1+\delta_2+\delta_3+\delta_4$) to a narrower ($W_2+\delta_1+\delta_3+\delta_4$), causing $I_{sense}$ to decrease. Circuit 1460 therefore implements a "down-only" trim. It can only decrease the value of $I_{sense}$ if it is too high, it cannot increase the value of $I_{sense}$.

Figure 20D:
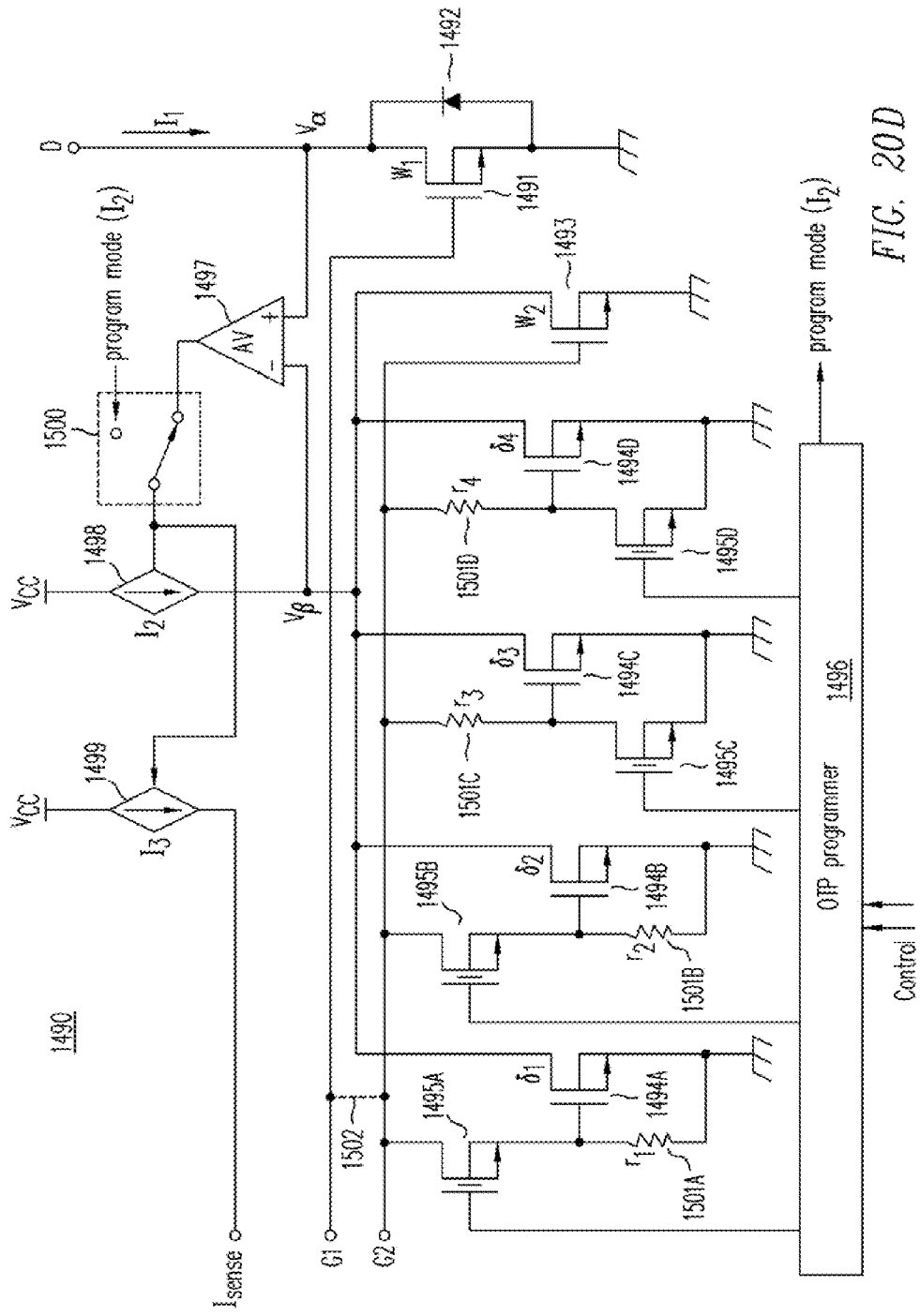
FIG. 20D is a circuit diagram of a shunt-connected up-down-trim circuit using an OTP memory.

Circuit 1490 in FIG. 20D combines both up-trim MOSFETs 1494C and 1494D with down-trim MOSFETs 1494A and 1494B, to produce a trim circuit that increase or decrease the polarity of the offset-induced mismatch.

While specific embodiments of this invention have been described, many alternative embodiments may be fabricated or performed in accordance with the broad principles of this invention. The scope of this invention is not limited to embodiments described herein but is limited only as provided in the claims.

I claim:

1. A method of sensing the magnitude of a current through semiconductor power device comprising:
    connecting a drain terminal of a main MOSFET to the power device;
    connecting a source terminal of the main MOSFET to a source terminal of a sense MOSFET, a gate width of the main MOSFET being larger than a gate width of the sense MOSFET;
    connecting a gate terminal of the main MOSFET to a gate terminal of the sense MOSFET;
    causing a voltage at the drain terminal of the main MOSFET to be equal to a voltage at a drain terminal of the sense MOSFET;
    causing a current to flow through the power device and the main MOSFET; and
    measuring the magnitude of a current in the sense MOSFET.

2. The method of claim 1 wherein causing the current to flow through the power device and the main MOSFET includes multiplying the magnitude of the current in the sense MOSFET by a factor n equal to a ratio between gate widths of the main and sense MOSFETs, respectively.

3. The method of claim 1 wherein causing a voltage at the drain terminal of the main MOSFET to be equal to a voltage at a drain terminal of the sense MOSFET includes introducing a current through the sense MOSFET and varying the current through the sense MOSFET until the voltage at the drain terminal of the main MOSFET is equal to the voltage at the drain terminal of the sense MOSFET.

4. The method of claim 3 wherein causing a voltage at the drain terminal of the main MOSFET to be equal to a voltage at a drain terminal of the sense MOSFET includes using negative feedback.

5. The method of claim 3 further comprising operating each of the main MOSFET and the sense MOSFET in its linear region.

6. The method of claim 3 wherein varying the current through the sense MOSFET until the voltage at the drain terminal of the main MOSFET is equal to the voltage at the drain terminal of the sense MOSFET includes detecting a difference between the voltage at the drain terminal of the main MOSFET and the voltage at the drain terminal of the sense MOSFET and using the voltage difference to control the current through the sense MOSFET.

7. The method of claim 6 wherein using the voltage difference to control the current through the sense MOSFET includes generating a voltage representative of the voltage difference.

8. The method of claim 7 wherein using the voltage difference to control the current through the sense MOSFET further includes delivering the voltage representative of the voltage difference to a first current source connected in series with the sense MOSFET.

9. The method of claim 8 further comprising generating a sense current that is identical to or proportional to the current through the sense MOSFET.

10. The method of claim 9 wherein generating the sense current includes delivering the voltage representative of the voltage difference to a second current source.

11. The method of claim 8 wherein using the voltage difference to control the current through the sense MOSFET further includes delivering the voltage representative of the voltage difference to a gate terminal and a drain terminal of a threshold connected MOSFET, a source terminal of the threshold connected MOSFET being connected to a terminal of the first current source.

12. The method of claim 6 wherein using the voltage difference to control the current through the sense MOSFET includes generating a first digital representation of the voltage at the drain terminal of the main MOSFET and a second digital representation of the voltage at the drain terminal of the sense MOSFET.

13. The method of claim 12 further comprising comparing the first and second digital representations and generating a digital representation of the voltage difference.

14. The method of claim 13 further comprising generating an analog representation of the digital representation of the voltage difference and using the analog representation to control the current through the sense MOSFET.

15. The method of claim 14 comprising delivering the analog representation to a first current source connected in series with the sense MOSFET.

16. The method of claim 15 further comprising generating a sense current that is identical to or proportional to the current through the sense MOSFET.

17. The method of claim 16 wherein generating the sense current includes delivering the voltage representative of the voltage difference to a second current source.

* * * * *

UNITED STATES PATENT AND TRADEMARK OFFICE
CERTIFICATE OF CORRECTION

PATENT NO. : 8,749,222 B2
APPLICATION NO. : 13/113791
DATED : June 10, 2014
INVENTOR(S) : Richard K. Williams It is certified that error appears in the above-identified patent and that said Letters Patent is hereby corrected as shown below:

In the Specification:

Column 28, Line 39, delete "Cascade" and insert --Cascode--.

Column 28, Line 45, delete "of" and insert --at--.

Column 29, Line 14, delete "boot" and insert --boost--.

Column 30, Line 12, delete "5878" and insert --587B--.

Column 32, Line 28, delete "7378" and insert --737B--.

Column 37, Line 40, delete "10726" and insert --1072B--.

Column 39, Line 29, delete "12728" and insert --1272B--.

Column 40, Line 46, delete "13606" and insert --1360B--.

Column 40, Line 66, delete "13876" and insert --1387B--.

Column 43, Line 18, delete "14656" and insert --1465B--.

Signed and Sealed this
Fourteenth Day of October, 2014

Michelle K. Lee
*Deputy Director of the United States Patent and Trademark Office*